US011488675B2

(12) United States Patent
Utsumi

(10) Patent No.: US 11,488,675 B2
(45) Date of Patent: Nov. 1, 2022

(54) SEMICONDUCTOR MEMORY DEVICE

(71) Applicant: Kioxia Corporation, Tokyo (JP)

(72) Inventor: Tetsuaki Utsumi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/304,789

(22) Filed: Jun. 25, 2021

(65) Prior Publication Data
US 2022/0157389 A1 May 19, 2022

(30) Foreign Application Priority Data
Nov. 13, 2020 (JP) .............................. JP2020-189844

(51) Int. Cl.
| | | |
|---|---|---|
| *G11C 16/30* | (2006.01) | |
| *H01L 27/11519* | (2017.01) | |
| *H01L 27/11524* | (2017.01) | |
| *H01L 27/11529* | (2017.01) | |
| *G11C 16/08* | (2006.01) | |
| *H01L 27/1157* | (2017.01) | |
| *H01L 27/11573* | (2017.01) | |

(Continued)

(52) U.S. Cl.
CPC ............... *G11C 16/30* (2013.01); *G11C 16/08* (2013.01); *G11C 16/24* (2013.01); *G11C 16/26* (2013.01); *H01L 27/1157* (2013.01); *H01L 27/11519* (2013.01); *H01L 27/11524* (2013.01); *H01L 27/11529* (2013.01); *H01L 27/11565* (2013.01); *H01L 27/11573* (2013.01)

(58) Field of Classification Search
CPC ......... G11C 16/30; G11C 16/08; G11C 16/24; G11C 16/26; G11C 11/15642; G11C 16/32; H01L 27/11519; H01L 27/11524; H01L 27/11529; H01L 27/11565; H01L 27/1157; H01L 27/11573
USPC ........................................................ 365/226
See application file for complete search history.

(56) References Cited

U.S. PATENT DOCUMENTS

| | | |
|---|---|---|
| 8,996,792 B2 | 3/2015 | Mun et al. |
| 9,910,594 B2 | 3/2018 | Rajwade et al. |

(Continued)

FOREIGN PATENT DOCUMENTS

| | | | | |
|---|---|---|---|---|
| CN | 102655026 A | * | 9/2012 | ......... G11C 16/0483 |
| JP | 2012-226822 A | | 11/2012 | |

(Continued)

*Primary Examiner* — Fernando Hidalgo
(74) *Attorney, Agent, or Firm* — Oblon, McClelland, Maier & Neustadt, L.L.P.

(57) ABSTRACT

A semiconductor memory device includes word lines, first and second select gate lines, first and second semiconductor columns, first and second bit lines, and first and second transistors. The word lines are arranged in a first direction. The first and second select gate lines extend in a second direction and overlap with the word lines viewed from the first direction. The first and second select gate lines are arranged in the second direction. The first semiconductor column is opposed to the word lines and the first select gate line. The second semiconductor column is opposed to the word lines and the second select gate line. The first and second bit lines extend in a third direction and overlap with the first and second semiconductor columns viewed from the first direction. The first and second transistors are electrically connected to the first and second select gate lines.

17 Claims, 49 Drawing Sheets

(51) Int. Cl.
  *G11C 16/26* (2006.01)
  *G11C 16/24* (2006.01)
  *H01L 27/11565* (2017.01)

(56) References Cited

U.S. PATENT DOCUMENTS

| | | |
|---|---|---|
| 10,121,536 B2 | 11/2018 | Wang et al. |
| 10,276,585 B2 | 4/2019 | Utsumi |
| 2010/0034020 A1* | 2/2010 | Tanaka .................. G11C 16/30 |
| | | 365/185.21 |
| 2019/0227719 A1 | 7/2019 | Park et al. |
| 2021/0074716 A1* | 3/2021 | Lim .................. H01L 27/11519 |
| 2021/0091196 A1 | 3/2021 | Utsumi |

FOREIGN PATENT DOCUMENTS

| | | |
|---|---|---|
| JP | 2017-224370 A | 12/2017 |
| JP | 2018-026518 A | 2/2018 |
| JP | 2018-514892 A | 6/2018 |
| JP | 2021-052084 A | 4/2021 |

\* cited by examiner

FIG. 32
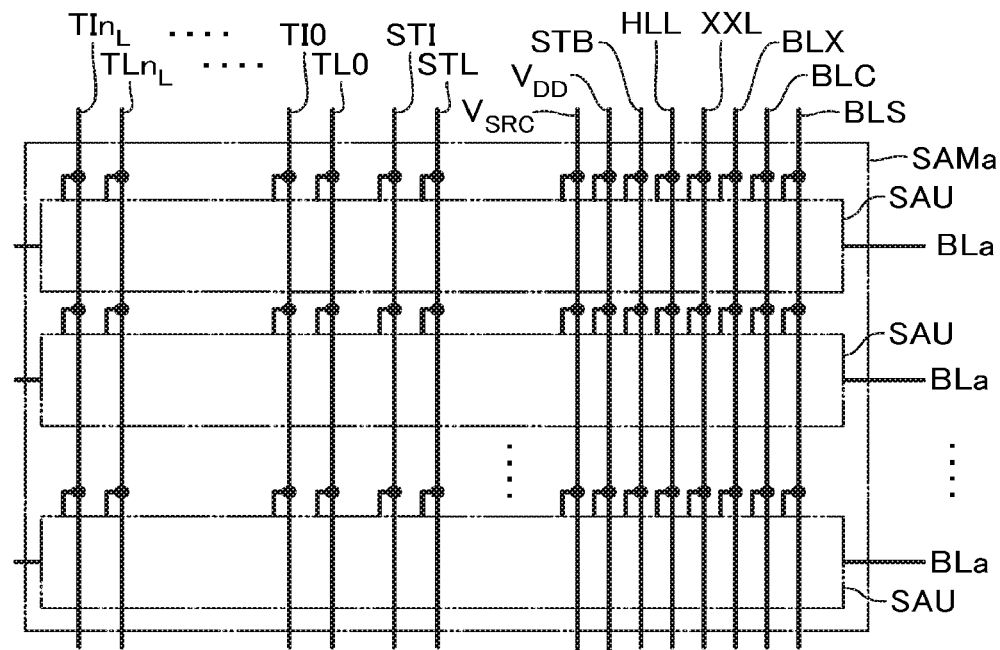
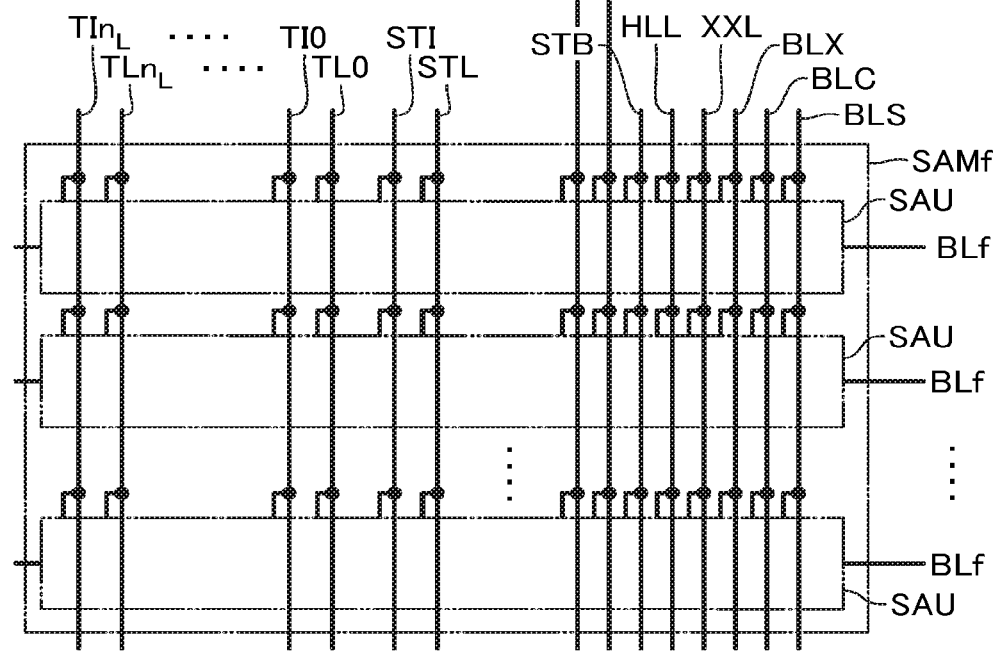

SEMICONDUCTOR MEMORY DEVICE

CROSS-REFERENCE TO RELATED APPLICATIONS

This application is based upon and claims the benefit of Japanese Patent Application No. 2020-189844, filed on Nov. 13, 2020, the entire contents of which are incorporated herein by reference.

BACKGROUND

Field

Embodiments described herein relate generally to a semiconductor memory device.

Description of the Related Art

There has been known a semiconductor memory device that includes: a substrate; a plurality of gate electrodes stacked in a direction intersecting with a surface of the substrate; a semiconductor column opposed to the plurality of gate electrodes; and a gate insulating layer disposed between the gate electrodes and the semiconductor column. The gate insulating layer includes a memory unit configured to store data. The memory unit is, for example, an insulative electric charge accumulating layer of silicon nitride ($Si_3N_4$) or the like or a conductive electric charge accumulating layer, such as a floating gate.

BRIEF DESCRIPTION OF THE DRAWINGS

FIG. 32 is a schematic circuit diagram illustrating a part of the configuration of the memory die MD4;

DETAILED DESCRIPTION

Figure 1:
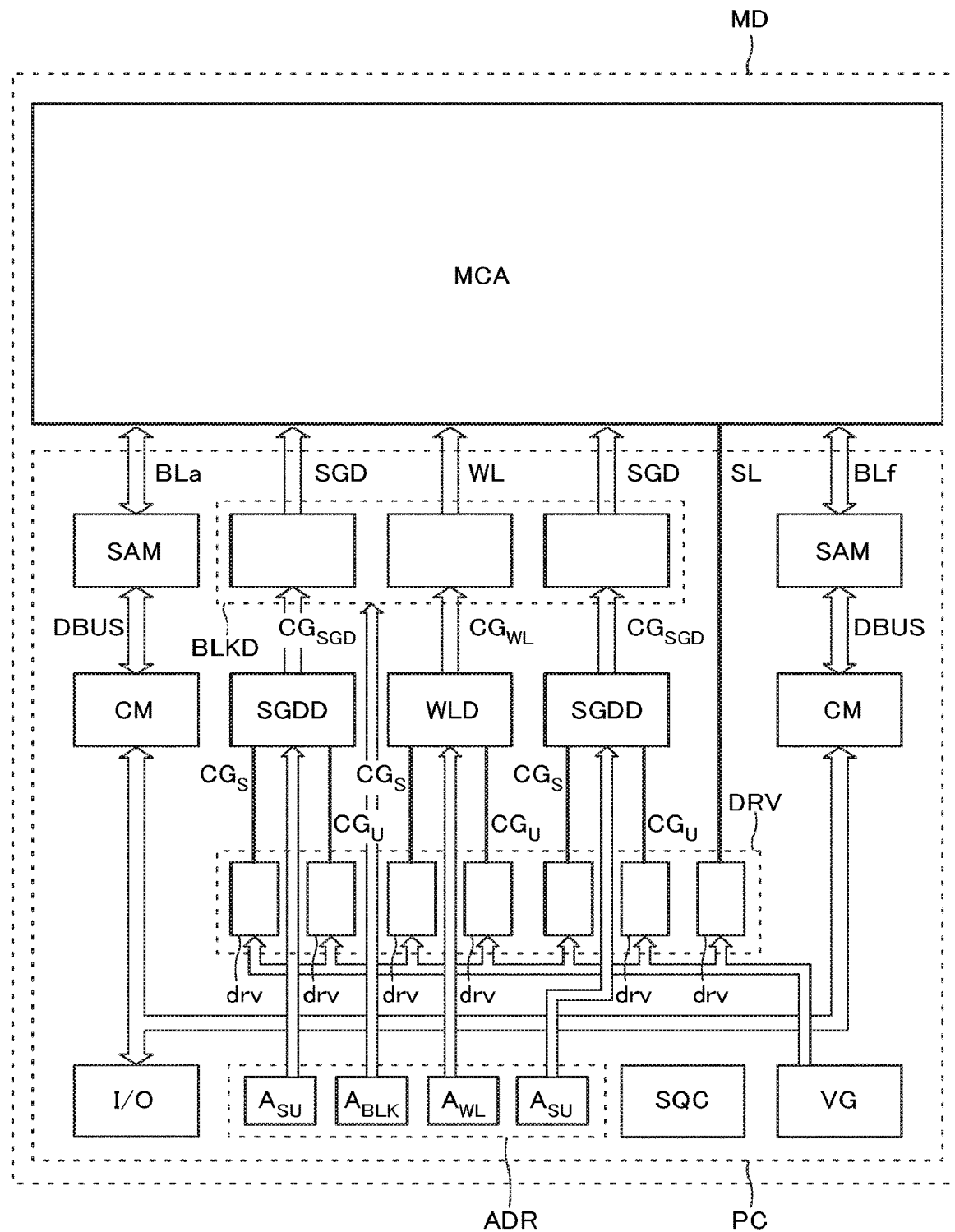
FIG. 1 is a schematic block diagram illustrating a configuration of a memory die MD according to a first embodiment.

A semiconductor memory device according to one embodiment comprises a substrate, a plurality of first word lines, a first select gate line, a second select gate line, a first semiconductor column, a second semiconductor column, a first bit line, a second bit line, a first transistor, and a second transistor. The plurality of first word lines are arranged in a first direction intersecting with a surface of the substrate. The first select gate line extends in a second direction intersecting with the first direction. The first select gate line is disposed at a position overlapping with the plurality of first word lines viewed from the first direction. The second select gate line extends in the second direction. The second select gate line is disposed at a position overlapping with the plurality of first word lines viewed from the first direction. The second select gate line is arranged with the first select gate line in the second direction. The first semiconductor column extends in the first direction. The first semiconductor column is opposed to the plurality of first word lines and the first select gate line. The second semiconductor column extends in the first direction. The second semiconductor column is opposed to the plurality of first word lines and the second select gate line. The first bit line extends in a third direction intersecting with the first direction and the second direction. The first bit line is disposed at a position overlapping with the first semiconductor column viewed from the first direction. The second bit line extends in the third direction. The second bit line is disposed at a position overlapping with the second semiconductor column viewed from the first direction. The first transistor is electrically connected to the first select gate line. The second transistor is electrically connected to the second select gate line.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a control die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Circuit Configuration]

FIG. 1 is a schematic block diagram illustrating a configuration of a memory die MD according to the first embodiment. FIG. 2 to FIG. 7 are schematic circuit diagrams illustrating a part of the configuration of the memory die MD.

As illustrated in FIG. 1, the memory die MD includes a memory cell array MCA that stores data and a peripheral circuit PC connected to the memory cell array MCA. The peripheral circuit PC includes a block decoder BLKD, a word line decoder WLD, a drain-side select gate line decoder SGDD, a driver circuit DRV, and a voltage generation circuit VG. The peripheral circuit PC includes sense amplifier modules SAM, cache memories CM, a sequencer SQC, an address register ADR, and an input/output control circuit I/O.

Note that FIG. 1 illustrates only one memory cell array MCA included in the memory die MD as an example. However, the memory die MD may include two or more memory cell arrays MCA. In such a case, for example, a part of the configuration in the peripheral circuit PC may be disposed in plural corresponding to the memory cell arrays MCA. For example, the configurations, such as the block decoder BLKD, the word line decoder WLD, the drain-side select gate line decoder SGDD, the sense amplifier modules SAM, and the cache memory CM, may be disposed in plural corresponding to the memory cell arrays MCA. A part of the configuration in the peripheral circuit PC may be common to the plurality of memory cell arrays MCA. For example, the configurations, such as the voltage generation circuit VG, the sequencer SQC, and the input/output circuit I/O, may be common to the plurality of memory cell arrays MCA.

[Circuit Configuration of Memory Cell Array MCA]

Figure 2:
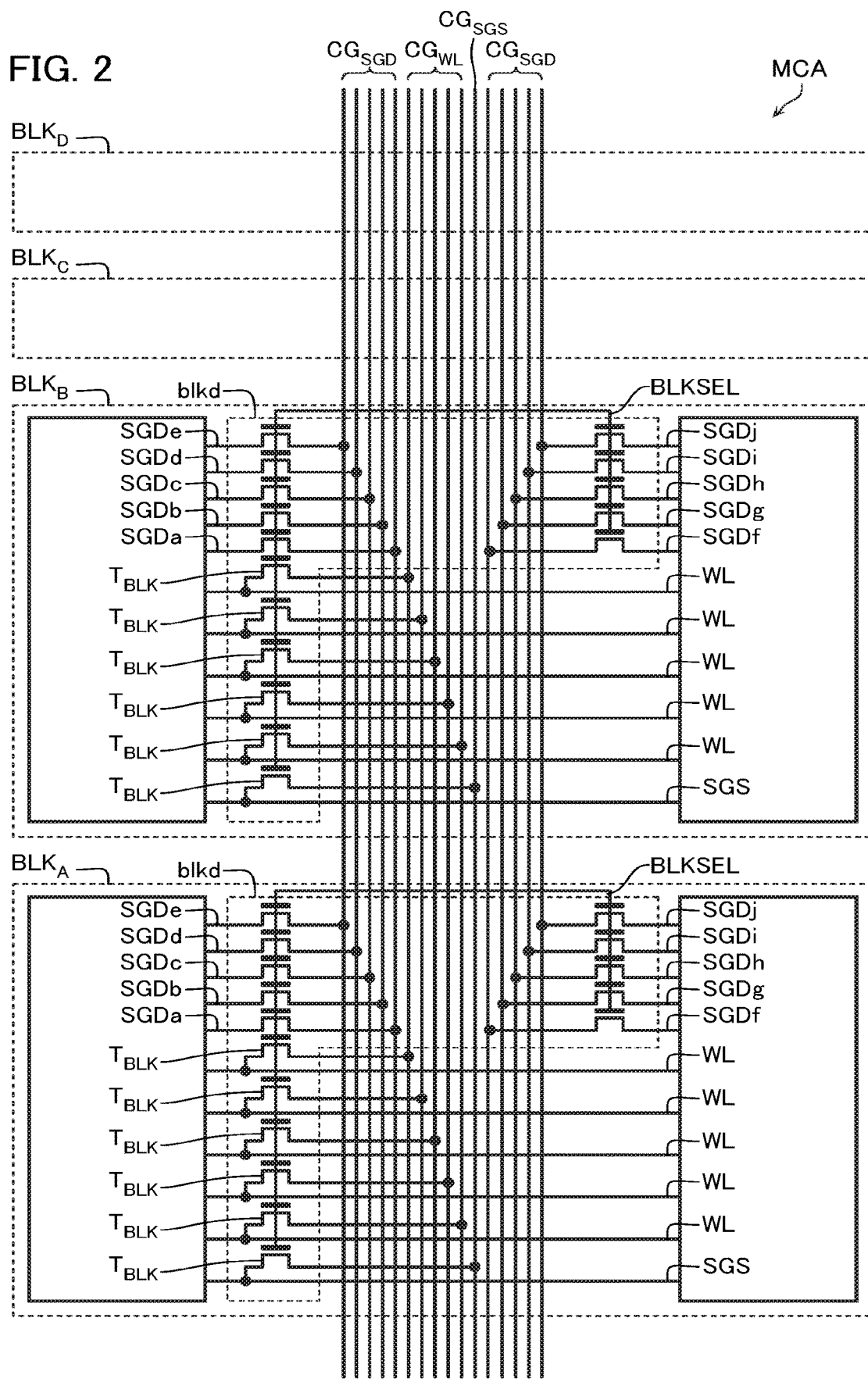
FIG. 2 is a schematic circuit diagram illustrating a part of the configuration of the memory die MD.
Figure 3:
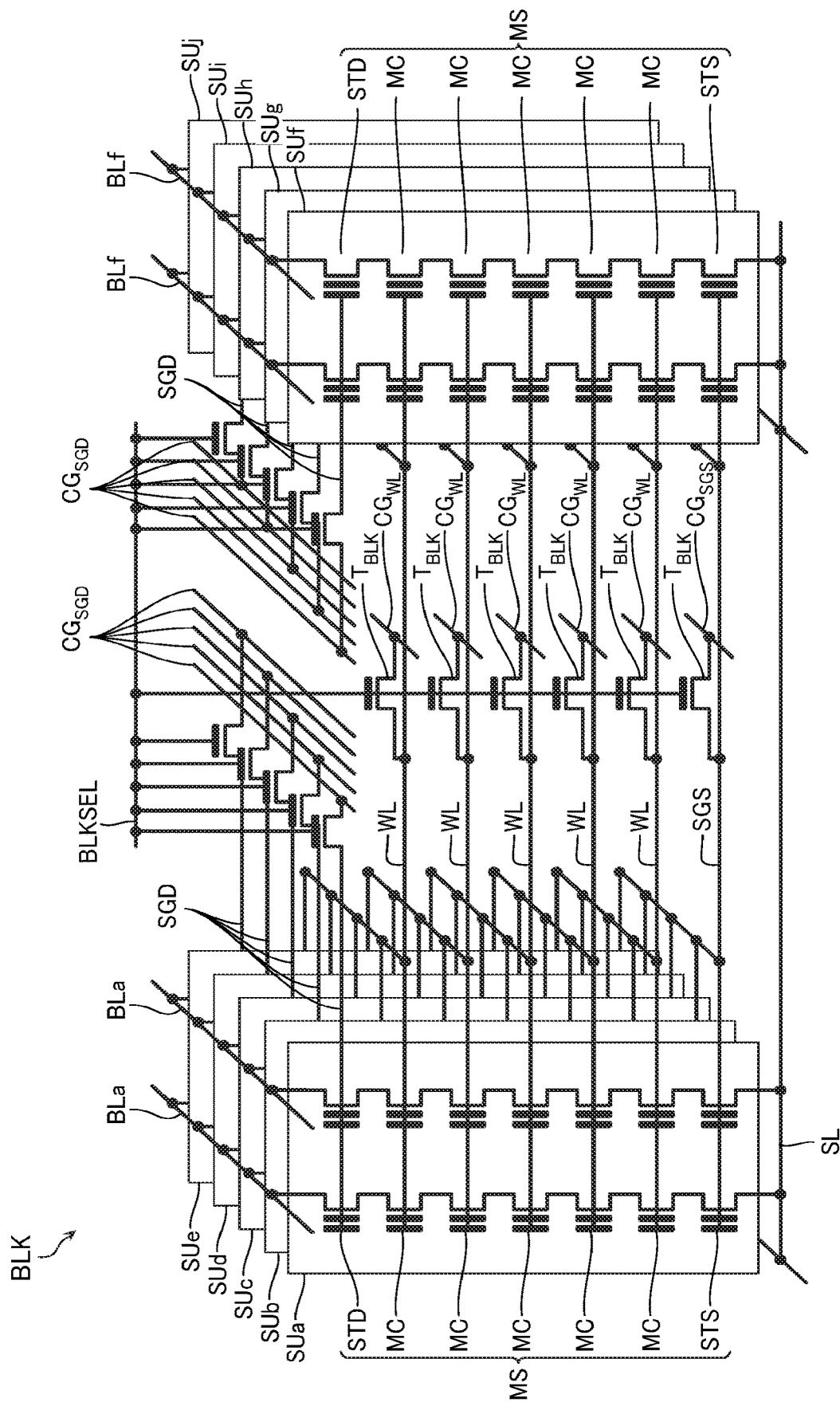
FIG. 3 is a schematic circuit diagram illustrating a part of the configuration of the memory die MD.

As illustrated in FIG. 2, the memory cell array MCA includes a plurality of memory blocks BLK (a memory block $BLK_A$ to a memory block $BLK_D$ in the illustrated example). As illustrated in FIG. 3, the memory block BLK includes a plurality of respective string units SU (a string unit SUa to a string unit SUj in the illustrated example). The plurality of string units SU each include a plurality of memory strings MS. One ends of the plurality of memory strings MS in the string unit SUa to the string unit SUe are each connected to the peripheral circuit PC via bit lines BLa. One ends of the plurality of memory strings MS in the string unit SUf to the string unit SUj are each connected to the peripheral circuit PC via bit lines BLf. The other ends of the plurality of memory strings MS in the string unit SUa to the string unit SUj are each connected to the peripheral circuit PC via a common source line SL.

The memory string MS includes a drain-side select transistor STD, a plurality of memory cells MC (memory transistors), and a source-side select transistor STS, which are connected in series between the bit line BLa or the bit line BLf and the source line SL. Hereinafter, the drain-side select transistor STD and the source-side select transistor STS are simply referred to as select transistors (STD, STS) in some cases.

The memory cell MC is a field-effect type transistor including a semiconductor layer that functions as a channel region, a gate insulating film including an electric charge accumulating film, and a gate electrode. The memory cell MC has a threshold voltage that changes according to an electric charge amount in the electric charge accumulating film. The memory cell MC stores data of one bit or a plurality of bits. Word lines WL are connected to respective gate electrodes of the plurality of memory cells MC corresponding to one memory string MS. These respective word lines WL are connected to all of the memory strings MS in one memory block BLK in common.

The select transistor (STD, STS) is a field-effect type transistor including a semiconductor layer that functions as a channel region, a gate insulating film, and a gate electrode. Select gate lines (SGD, SGS) are connected to the respective gate electrodes of the select transistors (STD, STS). The drain-side select gate line SGD is disposed corresponding to the string unit SU and connected to all of the memory strings MS in one string unit SU in common. The source-side select gate line SGS is connected to all of the memory strings MS in one memory block BLK in common. In the following description, the drain-side select gate line SGD corresponding to the string unit SUa is referred to as a drain-side select gate line SGDa in some cases. Similarly, the drain-side select gate lines SGD corresponding to the string unit SUb to the string unit SUj are referred to as a drain-side select gate line SGDb to a drain-side select gate line SGDj in some cases.

[Circuit Configuration of Block Decoder BLKD]

Figure 4:
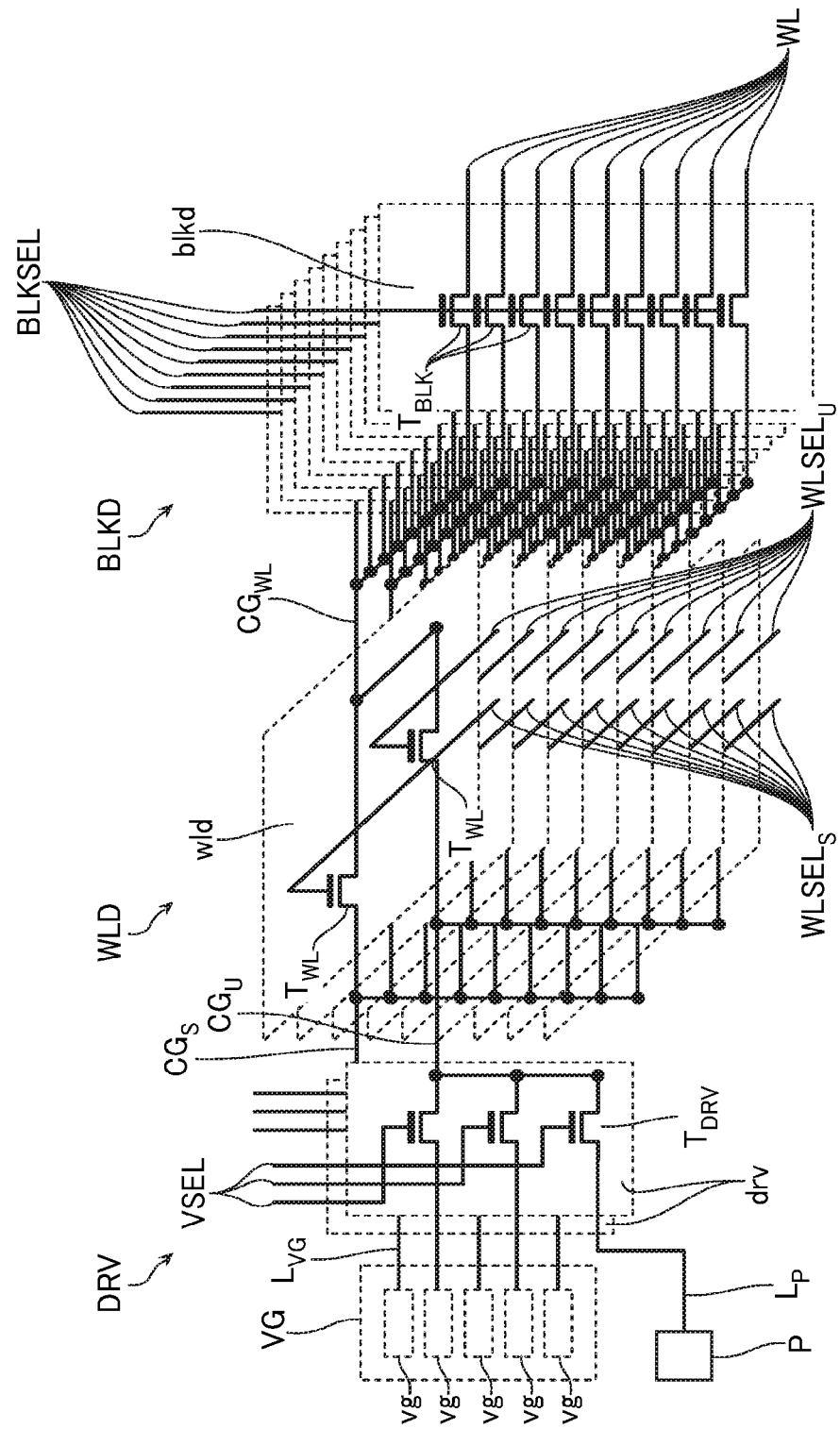
FIG. 4 is a schematic circuit diagram illustrating a part of the configuration of the memory die MD.
Figure 5:
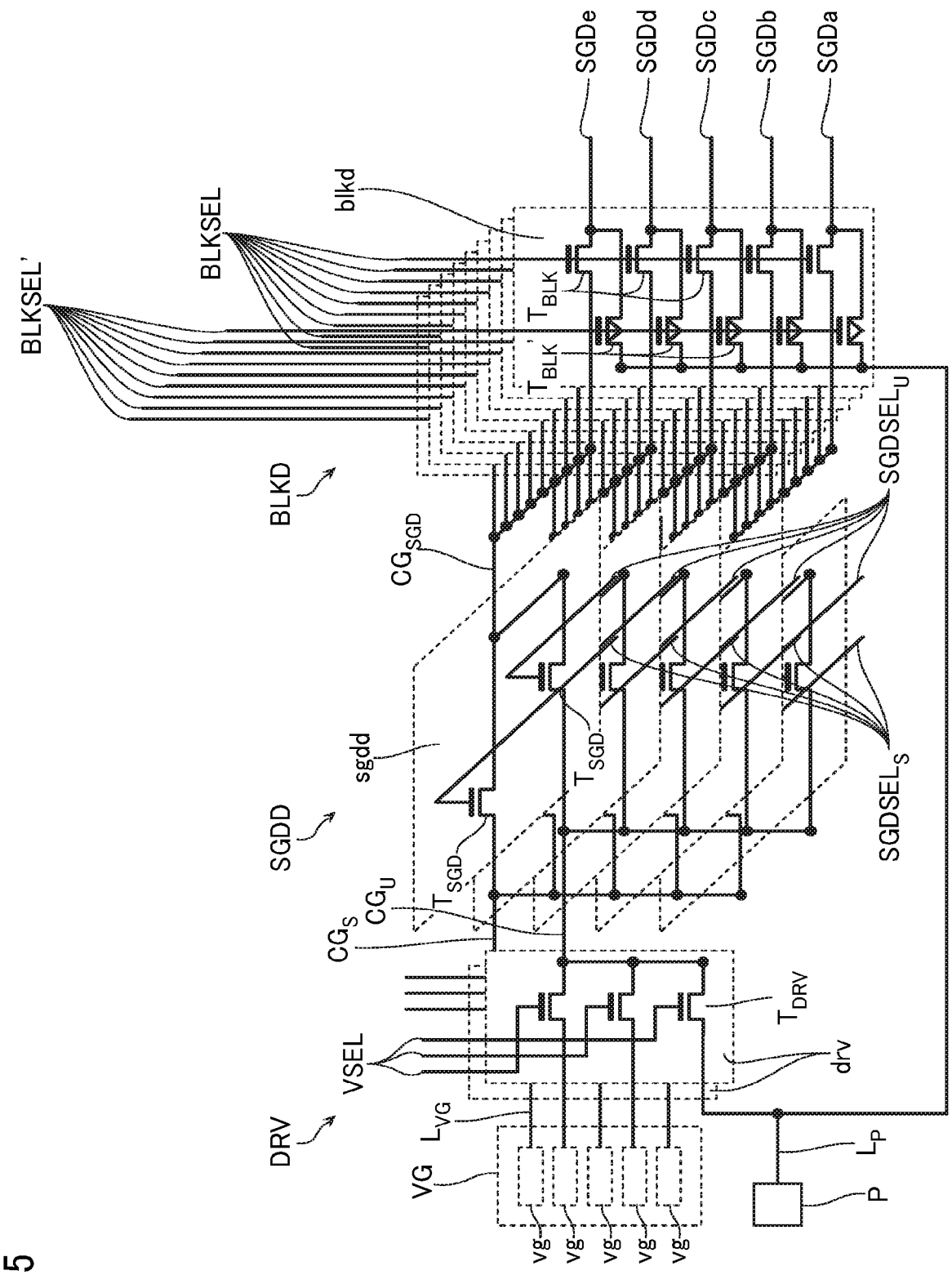
FIG. 5 is a schematic circuit diagram illustrating a part of the configuration of the memory die MD.

As illustrated in FIG. 4 and FIG. 5, the block decoder BLKD includes a plurality of block decode units blkd. As illustrated in FIG. 2, the plurality of block decode units blkd are disposed corresponding to the plurality of memory blocks BLK in the memory cell array MCA. As illustrated in FIG. 4 and FIG. 5, the block decode unit blkd includes a plurality of transistors $T_{BLK}$. Although a part of them is omitted in the drawing for convenience, the plurality of transistors $T_{BLK}$ are disposed corresponding to the plurality of word lines WL, the drain-side select gate line SGDa to the drain-side select gate line SGDj, and the source-side select gate line SGS in the memory block BLK. The transistor $T_{BLK}$ is, for example, a field-effect type NMOS transistor. As illustrated in FIG. 5, the block decode unit blkd includes a plurality of transistors $T_{BLK}'$. The plurality of transistors $T_{BLK}'$ are disposed corresponding to the plurality of select gate lines (SGD, SGS) in the memory block BLK. The transistor $T_{BLK}'$ is, for example, a field-effect type PMOS transistor.

As illustrated in FIG. 2, a drain electrode of the transistor $T_{BLK}$ is connected to the word line WL or the select gate line (SGD, SGS). A source electrode of the transistor $T_{BLK}$ is connected to a wiring CG. Note that FIG. 2 and the like denote the wiring CG electrically connected to the word line WL as a wiring $CG_{WL}$, the wiring CG electrically connected to the drain-side select gate line SGD as a wiring $CG_{SGD}$, and the wiring CG electrically connected to the source-side select gate line SGS as a wiring $CG_{SGS}$. The wirings CG are connected to all of the block decode units blkd in the block decoder BLKD. A gate electrode of the transistor $T_{BLK}$ is connected to a signal supply line BLKSEL. A plurality of the signal supply lines BLKSEL are disposed corresponding to all of the block decode units blkd. The signal supply line BLKSEL is connected to all of the transistors $T_{BLK}$ in the block decode unit blkd.

As illustrated in FIG. 5, a drain electrode of the transistor $T_{BLK}'$ is connected to the select gate line (SGD, SGS). A source electrode of the transistor $T_{BLK}'$ is connected to a bonding pad electrode P to which a ground voltage $V_{SS}$ is supplied. A gate electrode of the transistor $T_{BLK}'$ is connected to a signal supply line BLKSEL'. The signal supply line BLKSEL' is connected to all of the transistors $T_{BLK}'$ in the block decode unit blkd.

In a read operation, a write sequence, and the like, for example, one signal supply line BLKSEL (FIG. 2) corresponding to a block address $A_{BLK}$ in the address register ADR (FIG. 1) becomes an "H" state, and the other signal supply lines BLKSEL become an "L" state. For example, a predetermined driving voltage having a positive magnitude is supplied to the one signal supply line BLKSEL, and the ground voltage $V_{SS}$ or the like is supplied to the other signal supply lines BLKSEL. Accordingly, all of the word lines WL in one memory block BLK corresponding to this block address $A_{BLK}$ are electrically conducted to the wirings $CG_{WL}$. All of the word lines WL in the other memory blocks BLK become a floating state. Additionally, all of the select gate lines (SGD, SGS) in one memory block BLK corresponding to the block address $A_{BLK}$ electrically conducts with the wirings $CG_{SGD}$, $CG_{SGS}$. The ground voltage $V_{SS}$ is supplied to all of the select gate lines (SGD, SGS) in the other memory blocks BLK.

[Circuit Configuration of Word Line Decoder WLD]

As illustrated in FIG. 4, the word line decoder WLD includes a plurality of word line decode units wld disposed corresponding to the plurality of word lines WL in the memory block BLK. In the illustrated example, the word line decode unit wld includes two transistors $T_{WL}$. The transistor $T_{WL}$ is, for example, a field-effect type NMOS transistor. A drain electrode of the transistor $T_{WL}$ is connected to the wiring $CG_{WL}$. A source electrode of the transistor $T_{WL}$ is connected to a wiring $CG_S$ or a wiring $CG_U$. A gate electrode of the transistor $T_{WL}$ is connected to a signal supply line $WLSEL_S$ or a signal supply line $WLSEL_U$. A plurality of the signal supply lines $WLSEL_S$ are disposed corresponding to one transistors $T_{WL}$ included in all of the word line decode units wld. A plurality of the signal supply lines $WLSEL_U$ are disposed corresponding to the other transistors $T_{WL}$ included in all of the word line decode units wld.

In the read operation, the write sequence, and the like, for example, the signal supply line $WLSEL_S$ corresponding to one word line decode unit wld (FIG. 4) corresponding to a word line address $A_{WL}$ in the address register ADR (FIG. 1) becomes an "H" state. The signal supply line $WLSEL_U$ corresponding to this becomes an "L" state. The signal supply lines $WLSEL_S$ corresponding to the other word line decode units wld become an "L" state. The signal supply lines $WLSEL_U$ corresponding to these become an "H" state. A voltage corresponding to the selected word line WL is supplied to the wiring $CG_S$. A voltage corresponding to the unselected word lines WL is supplied to the wiring $CG_U$. Thus, the voltage corresponding to the selected word line WL is supplied to one word line WL corresponding to the word line address $A_{WL}$. The voltage corresponding to the unselected word lines WL is supplied to the other word lines WL.

Note that in the example of FIG. 4, each word line decode unit wld includes the two transistors $T_{WL}$. However, the configuration is only an example, and a specific configuration is appropriately adjustable. For example, in a case where the voltages of the word lines WL are controlled in three or more patterns, each word line decode unit wld may include the three or more transistors $T_{WL}$. Note that the case in which the voltages of the word lines WL are controlled in the three patterns includes, for example, a voltage greater than those of the other unselected word lines WL is supplied to the unselected word line WL adjacent to the selected word line WL and the like.

[Circuit Configuration of Drain-Side Select Gate Line Decoder SGDD]

As illustrated in FIG. 5, the drain-side select gate line decoder SGDD includes a plurality of drain-side select gate line decode units sgdd disposed corresponding to the plurality of drain-side select gate lines SGD in the memory block BLK. In the illustrated example, the drain-side select gate line decode unit sgdd includes two transistors $T_{SGD}$. The transistor $T_{SGD}$ is, for example, a field-effect type NMOS transistor. A drain electrode of the transistor $T_{SGD}$ is connected to the wiring $CG_{SGD}$. A source electrode of the transistor $T_{SGD}$ is connected to a wiring $CG_S$ or a wiring $CG_U$. A gate electrode of the transistor $T_{SGD}$ is connected to a signal supply line $SGDSEL_S$ or a signal supply line $SGDSEL_U$. A plurality of the signal supply lines $SGDSEL_S$ are disposed corresponding to one transistors $T_{SGD}$ included in all of the drain-side select gate line decode units sgdd. A plurality of the signal supply lines $SGDSEL_U$ are disposed corresponding to the other transistors $T_{SGD}$ included in all of the drain-side select gate line decode units sgdd.

In the read operation, the write sequence, and the like, for example, the signal supply line $SGDSEL_S$ corresponding to one drain-side select gate line decode unit sgdd (FIG. 5) corresponding to a string address $A_{SU}$ in the address register ADR (FIG. 1) becomes an "H" state. The signal supply line $SGDSEL_U$ corresponding to this becomes an "L" state. The signal supply lines $SGDSEL_S$ corresponding to the other drain-side select gate line decode units sgdd become an "L" state and the signal supply lines $SGDSEL_U$ corresponding to these become an "H" state. A voltage corresponding to the selected drain-side select gate line SGD is supplied to the wiring $CG_S$. A voltage corresponding to the unselected drain-side select gate lines SGD is supplied to the wiring $CG_U$. Thus, the voltage corresponding to the selected drain-side select gate line SGD is supplied to one drain-side select gate line SGD corresponding to the string address $A_{SU}$. The voltage corresponding to the unselected drain-side select gate lines SGD is supplied to the other drain-side select gate lines SGD.

As illustrated in FIG. 1, the memory die MD includes the two drain-side select gate line decoders SGDD. One drain-side select gate line decoder SGDD is electrically connected to the drain-side select gate line SGDa to the drain-side select gate line SGDe (FIG. 2). The other drain-side select gate line decoder SGDD is electrically connected to a drain-side select gate line SGDf to the drain-side select gate line SGDj (FIG. 2). Additionally, as illustrated in FIG. 1, the address register ADR is configured to simultaneously latch two string addresses $A_{SU}$. One of the two string address $A_{SU}$ corresponds to one of the string unit SUa to the string unit SUe. The other one among the two string addresses $A_{SU}$ corresponds to one of the string unit SUf to the string unit SUj. The memory die MD is configured to simultaneously select two drain-side select gate lines according to the two string addresses $A_{SU}$ in the read operation, the write sequence, and the like.

[Circuit Configuration of Driver Circuit DRV]

For example, as illustrated in FIG. 1, the driver circuit DRV includes a plurality of driver units drv. For example, the driver units drv are disposed corresponding to the wiring $CG_S$ and the wiring $CG_U$ in the word line decoder WLD, the wiring $CG_S$ and the wiring $CG_U$ in the drain-side select gate line decoder SGDD, the source line SL, and the like. For example, as illustrated in FIG. 4 and FIG. 5 as an example, the driver unit drv includes a plurality of transistors $T_{DRV}$. The transistor $T_{DRV}$ is, for example, a field-effect type NMOS transistor. Drain electrodes of the transistors $T_{DRV}$ are connected to the wiring $CG_S$, the wiring $CG_U$, and the like. A source electrode of the transistor $T_{DRV}$ is connected to a voltage supply line $L_{VG}$ or a voltage supply line $L_P$. The voltage supply line $L_{VG}$ is connected to one of a plurality of output terminals in the voltage generation circuit VG. The voltage supply line $L_P$ is connected to the bonding pad electrode P to which the ground voltage $V_{SS}$ is supplied. Gate electrodes of the transistors $T_{DRV}$ are each connected to a signal supply line VSEL.

In the read operation, the write sequence, and the like, for example, any of the plurality of signal supply lines VSEL in the driver unit drv becomes an "H" state and the other signal supply lines VSEL become an "L" state.

[Circuit Configuration of Voltage Generation Circuit VG]

For example, as illustrated in FIG. 4 and FIG. 5, the voltage generation circuit VG includes a plurality of voltage generation units vg. In the read operation, the write sequence, and the like, the voltage generation unit vg generates a voltage of a predetermined magnitude, and outputs it to the voltage supply line $L_{VG}$. For example, the voltage generation unit vg may be a step up circuit, such as a charge pump circuit, or may be a step down circuit, such as a regulator. For example, the voltage generation circuit VG generates a plurality of patterns of operating voltages in accordance with a control signal from the sequencer SQC. In the read operation, the write sequence, and the like, the plurality of patterns of operating voltages are applied to the bit line BLa, the bit line BLf, the source line SL, the word line WL, and the select gate line (SGD, SGS). The operating voltages output from the plurality of voltage generation units vg are appropriately adjusted in accordance with the control signals from the sequencer SQC.

[Circuit Configuration of Sense Amplifier Module SAM]

Figure 6:
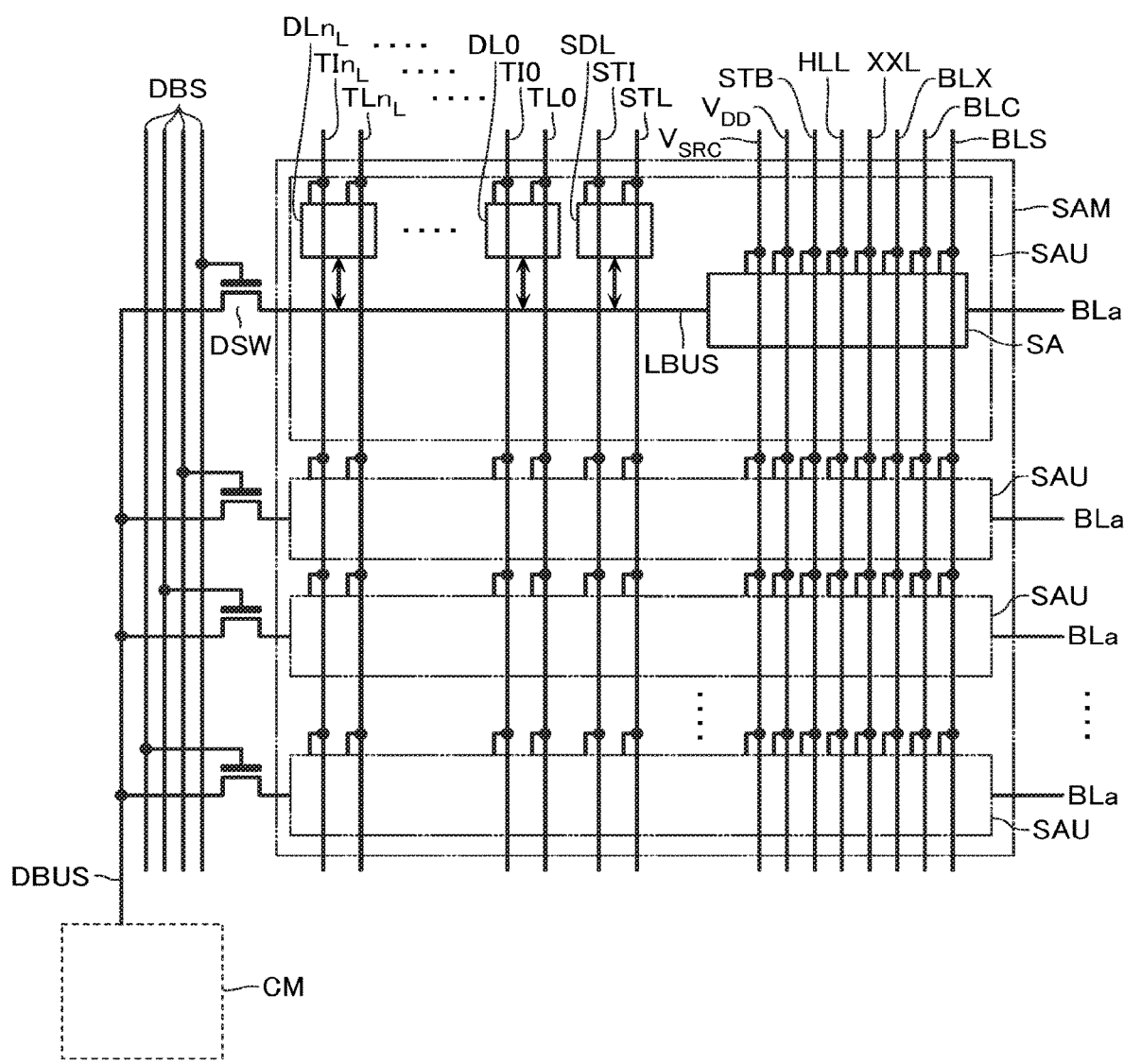
FIG. 6 is a schematic circuit diagram illustrating a part of the configuration of the memory die MD.

The sense amplifier module SAM will be described with reference to FIG. 6 and FIG. 7. Although FIG. 6 and FIG. 7 use the bit lines BLa as an example, the same applies to the bit lines BLf. For example, as illustrated in FIG. 6, the sense amplifier module SAM includes a plurality of sense amplifier units SAU corresponding to the plurality of bit lines BLa. The sense amplifier units SAU each include a sense amplifier SA connected to the bit line BLa, a wiring LBUS connected to the sense amplifier SA, latch circuits SDL, DL0 to $DLn_L$ ($n_L$ is a positive integer of 1 or more) connected to the wiring LBUS, and a charge transistor 55 (FIG. 7) for precharging connected to the wiring LBUS. The wiring LBUS in the sense amplifier unit SAU is connected to a wiring DBUS via a switch transistor DSW.

Figure 7:
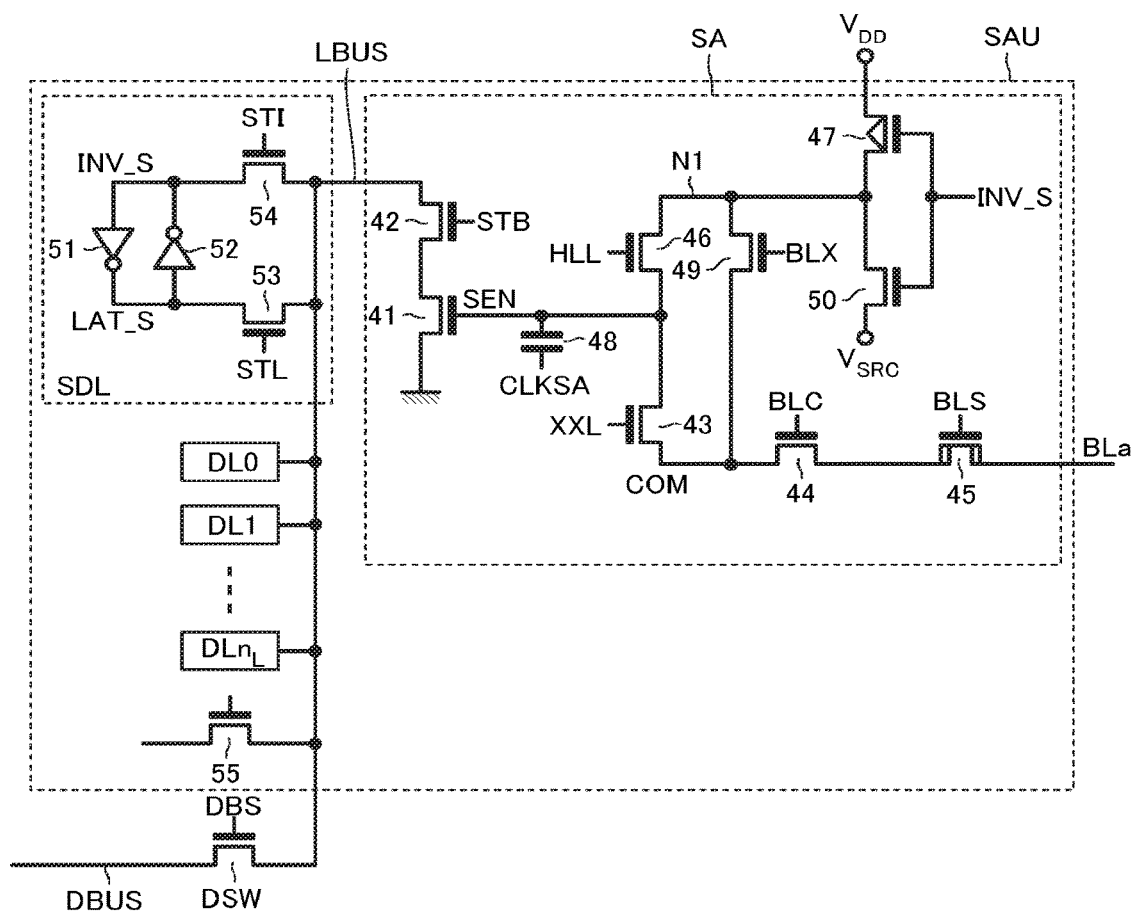
FIG. 7 is a schematic circuit diagram illustrating a part of the configuration of the memory die MD.

As illustrated in FIG. 7, the sense amplifier SA includes a sense transistor 41. The sense transistor 41 discharges electric charges of the wiring LBUS according to a current flowed in the bit line BLa. A source electrode of the sense transistor 41 is connected to the voltage supply line to which the ground voltage $V_{SS}$ is supplied. A drain electrode is connected to the wiring LBUS via a switch transistor 42. A gate electrode is connected to the bit line BLa via a sense node SEN, a discharge transistor 43, a node COM, a clamp transistor 44, and a high voltage transistor 45. Note that the sense node SEN is connected an internal control signal line CLKSA via a capacitor 48.

Additionally, the sense amplifier SA includes a voltage transfer circuit. The voltage transfer circuit selectively electrically conducts the node COM and the sense node SEN with the voltage supply line to which a voltage $V_{DD}$ is supplied or the voltage supply line to which a voltage $V_{SRC}$ is supplied according to data latched by a latch circuit SDL. The voltage transfer circuit includes a node N1, a charge transistor 46, a charge transistor 49, a charge transistor 47, and a discharge transistor 50. The charge transistor 46 is connected between the node N1 and the sense node SEN. The charge transistor 49 is connected between the node N1 and the node COM. The charge transistor 47 is connected between the node N1 and the voltage supply line to which the voltage $V_{DD}$ is supplied. The discharge transistor 50 is connected between the node N1 and the voltage supply line to which the voltage $V_{SRC}$ is supplied. Note that gate electrodes of the charge transistor 47 and the discharge transistor 50 are connected to a node INV_S of the latch circuit SDL in common.

Note that the sense transistor 41, the switch transistor 42, the discharge transistor 43, the clamp transistor 44, the charge transistor 46, the charge transistor 49, and the discharge transistor 50 are, for example, enhancement type NMOS transistors. The high voltage transistor 45 is, for example, a depletion type NMOS transistor. The charge transistor 47 is, for example, a PMOS transistor.

A gate electrode of the switch transistor 42 is connected to a signal line STB. A gate electrode of the discharge transistor 43 is connected to a signal line XXL. A gate electrode of the clamp transistor 44 is connected to a signal line BLC. A gate electrode of the high voltage transistor 45 is connected to a signal line BLS. A gate electrode of the charge transistor 46 is connected to a signal line HLL. A gate electrode of the charge transistor 49 is connected to a signal line BLX. These signal lines STB, XXL, BLC, BLS, HLL, and BLX are connected to the sequencer SQC.

The latch circuit SDL includes nodes LAT_S and INV_S, inverters 51, 52 connected between the nodes LAT_S, INV_S, and switch transistors 53, 54 connected to the nodes LAT_S, INV_S. The inverter 51 includes an output terminal connected to the node LAT_S and an input terminal connected to the node INV_S. The inverter 52 includes an input terminal connected to the node LAT_S and an output terminal connected to the node INV_S. The switch transistors 53, 54 are, for example, NMOS transistors. The switch transistor 53 is connected between the node LAT_S and the wiring LBUS. The switch transistor 54 is connected between the node INV_S and the wiring LBUS. A gate electrode of the switch transistor 53 is connected to the sequencer SQC via a signal line STL. A gate electrode of the switch transistor 54 is connected to the sequencer SQC via a signal line STI.

The latch circuits DL0 to $DLn_L$ are configured substantially similarly to the latch circuit SDL. However, as described above, the node INV_S in the latch circuit SDL electrically conducts with the gate electrodes of the charge transistor 47 and the discharge transistor 50 in the sense amplifier SA. The latch circuits DL0 to $DLn_L$ differ from the latch circuit SDL in this respect.

The switch transistor DSW is, for example, an NMOS transistor. The switch transistor DSW is connected between the wiring LBUS and the wiring DBUS. A gate electrode of the switch transistor DSW is connected to the sequencer SQC via a signal line DBS (FIG. 6).

As illustrated in FIG. 6 as an example, the above-described respective signal lines STB, HLL, XXL, BLX, BLC, BLS are connected in common among all of the sense amplifier units SAU included in the sense amplifier module SAM. The above-described respective voltage supply line to which the voltage $V_{DD}$ is supplied and voltage supply line to which the voltage $V_{SRC}$ is supplied are connected in common among all of the sense amplifier units SAU included in the sense amplifier module SAM. Additionally, the respective signal line STI and signal line STL in the latch circuit SDL are connected in common among all of the sense amplifier units SAU included in the sense amplifier module SAM. Similarly, respective signal lines TI0 to $TIn_L$ and TL0 to $TLn_L$ corresponding to the signal lines STI and the signal lines STL in the latch circuits DL0 to $DLn_L$ are connected in common among all of the sense amplifier units SAU included in the sense amplifier module SAM. On the other hand, the above-described respective signal lines DBS are disposed in plural corresponding to all of the sense amplifier units SAU included in the sense amplifier module SAM.

[Circuit Configuration of Cache Memory CM]

The cache memory CM (FIG. 1) includes a plurality of latch circuits connected to the latch circuits in the sense amplifier module SAM via the wiring DBUS. Data included in the plurality of latch circuits is sequentially transferred to the sense amplifier module SAM or the input/output control circuit I/O.

To the cache memory CM, a decode circuit and a switch circuit (not illustrated) are connected. The decode circuit decodes a column address latched in the address register ADR (FIG. 1). The switch circuit electrically conducts the latch circuit corresponding to the column address with the input/output control circuit I/O (FIG. 1) in response to an output signal from the decode circuit.

[Circuit Configuration of Sequencer SQC]

The sequencer SQC (FIG. 1) outputs an internal control signal to the driver circuit DRV, the sense amplifier module SAM, and the voltage generation circuit VG in response to command data latched in a command register (not illustrated). The sequencer SQC outputs status data indicating its own state to a status register (not illustrated) as necessary.

The sequencer SQC generates a ready/busy signal and outputs the ready/busy signal to a ready/busy terminal (not illustrated). In a period in which the ready/busy terminal is in an "L" state, an access from a controller die (not illustrated) to the memory die MD is basically inhibited. In a period in which the ready/busy terminal is in an "H" state, the access from the controller die (not illustrated) to the memory die MD is permitted.

[Circuit Configuration of Input/Output Control Circuit I/O]

For example, the input/output control circuit I/O includes data signal input/output terminals (not illustrated), an input circuit, such as a comparator, and an output circuit, such as an Off Chip Driver (OCD) circuit connected to the data signal input/output terminals. The input/output control circuit I/O includes a shift register connected to the input circuit and the output circuit and a buffer circuit.

[Structure of Memory Die MD]

Figure 8:
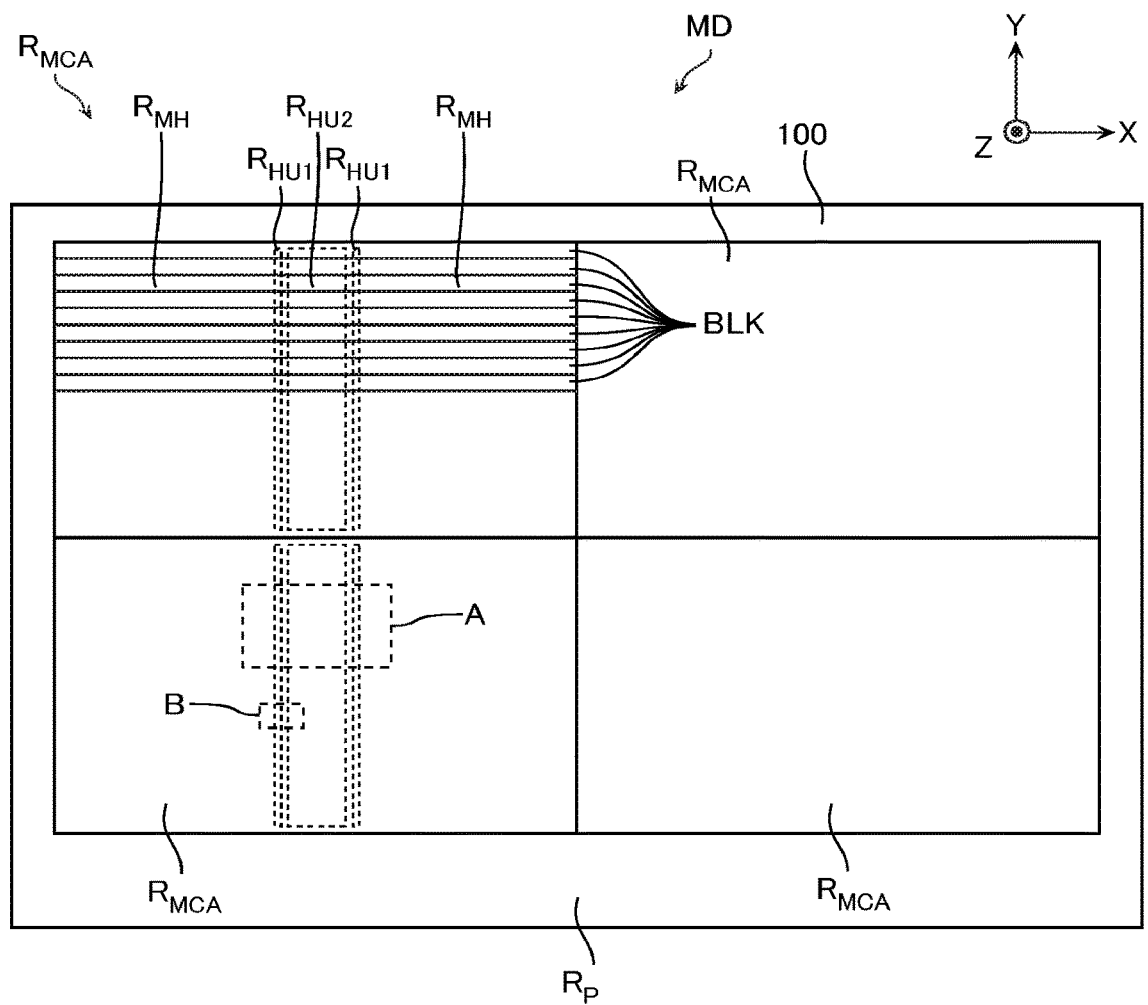
FIG. 8 is a schematic plan view of the memory die MD.
Figure 9:
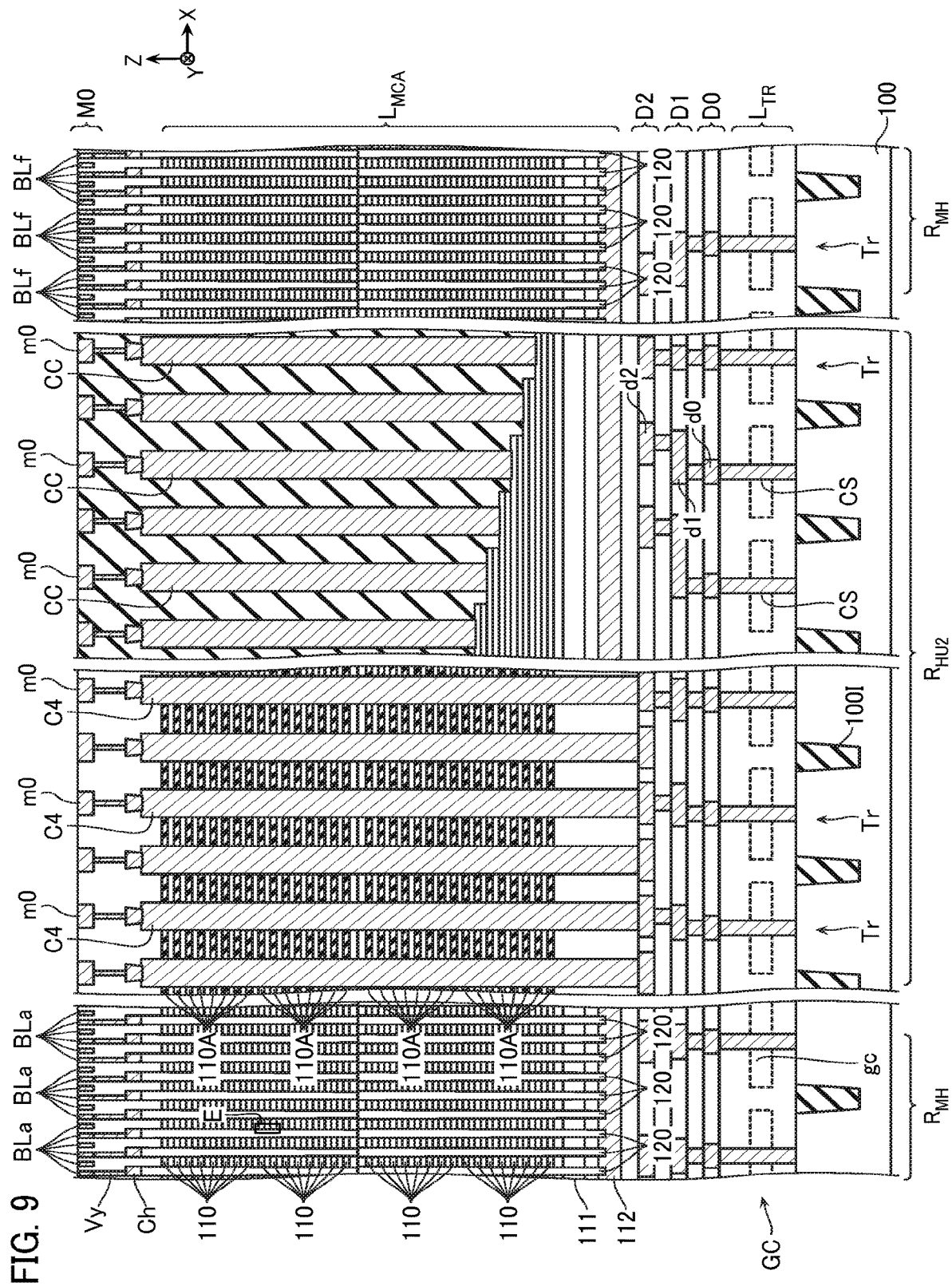
FIG. 9 is a schematic cross-sectional view of the memory die MD.
Figure 10:
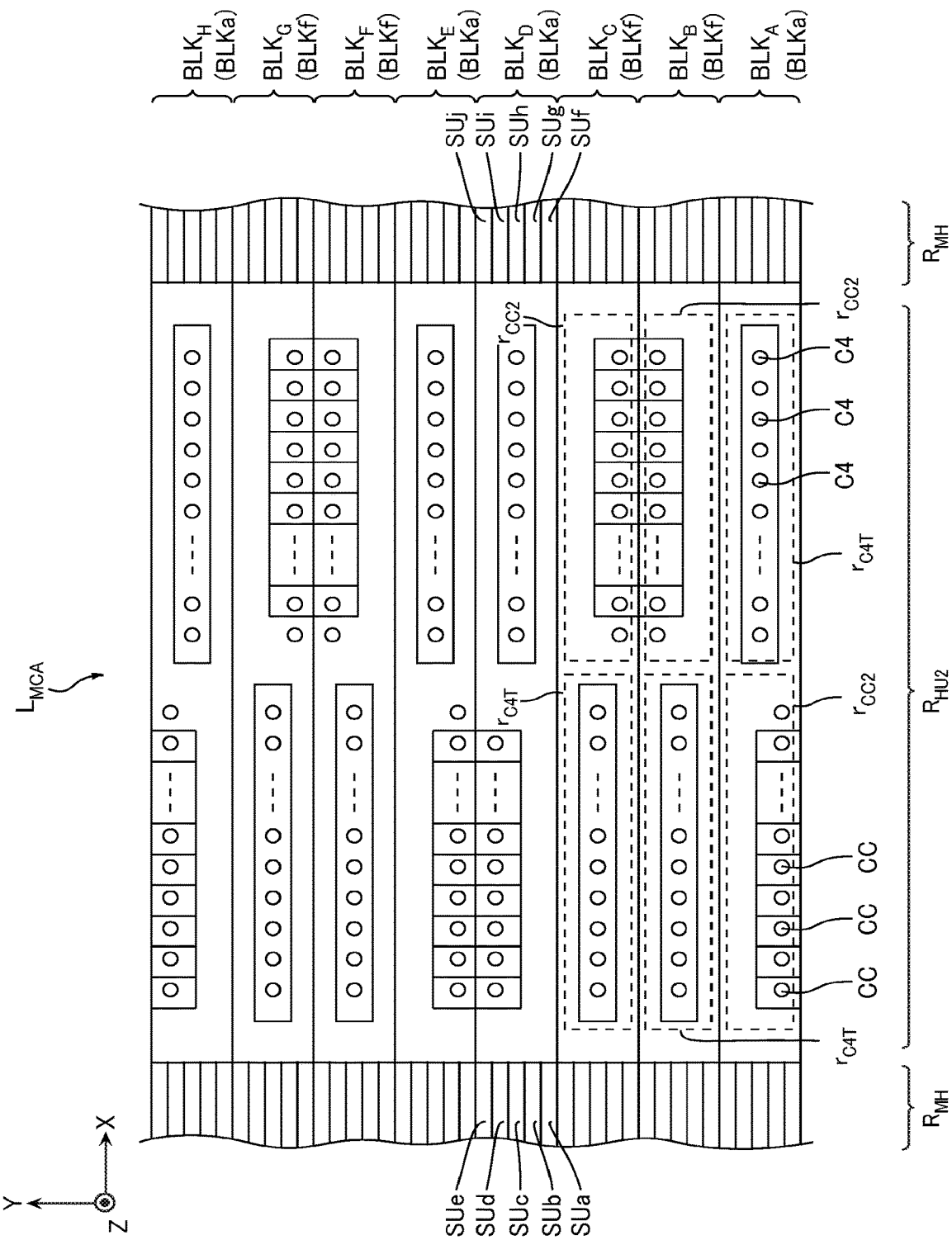
FIG. 10 is a schematic enlarged view of a part indicated by A in FIG. 8.
Figure 11:
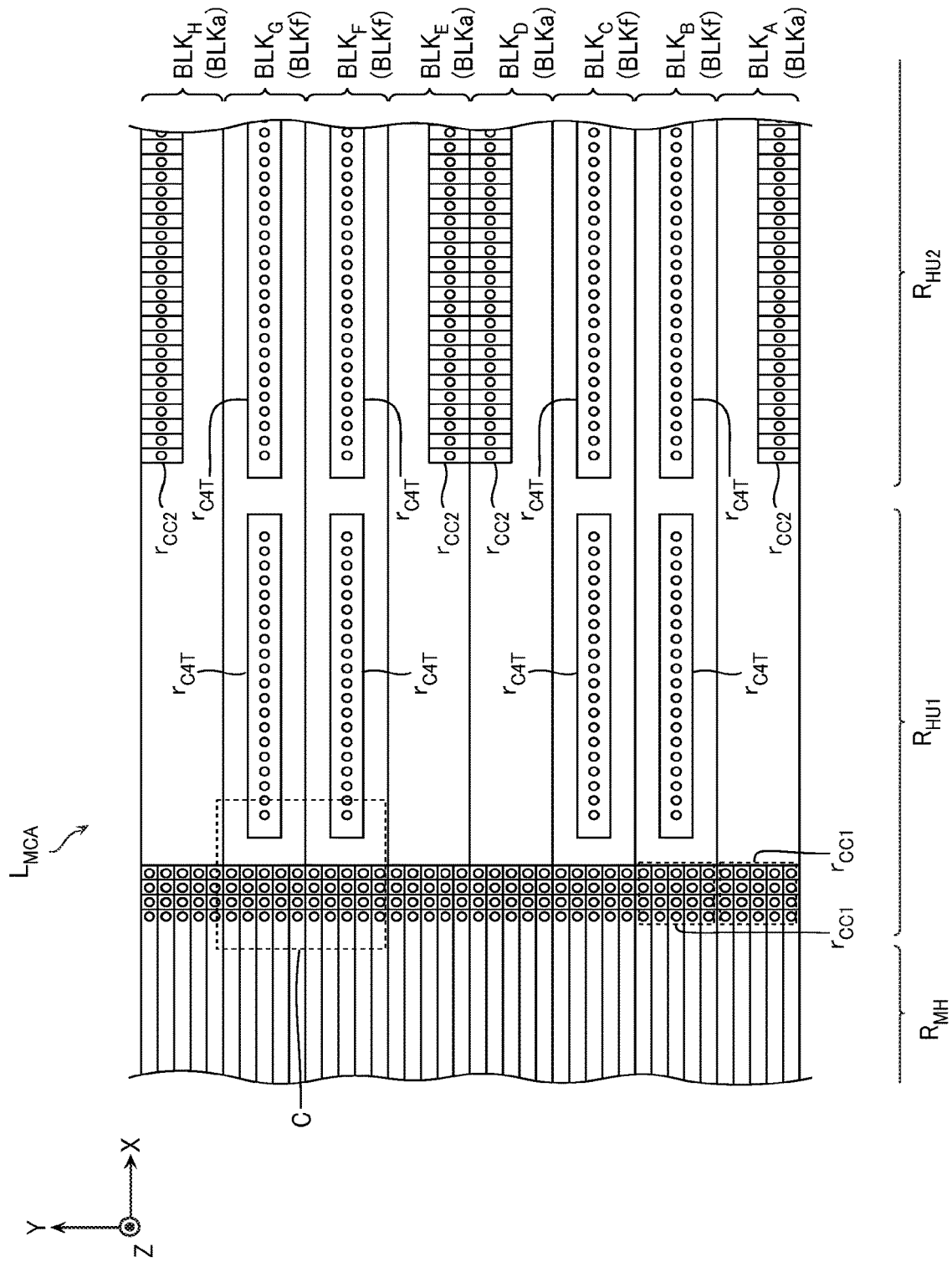
FIG. 11 is a schematic enlarged view of a part indicated by B in FIG. 8.
Figure 12:
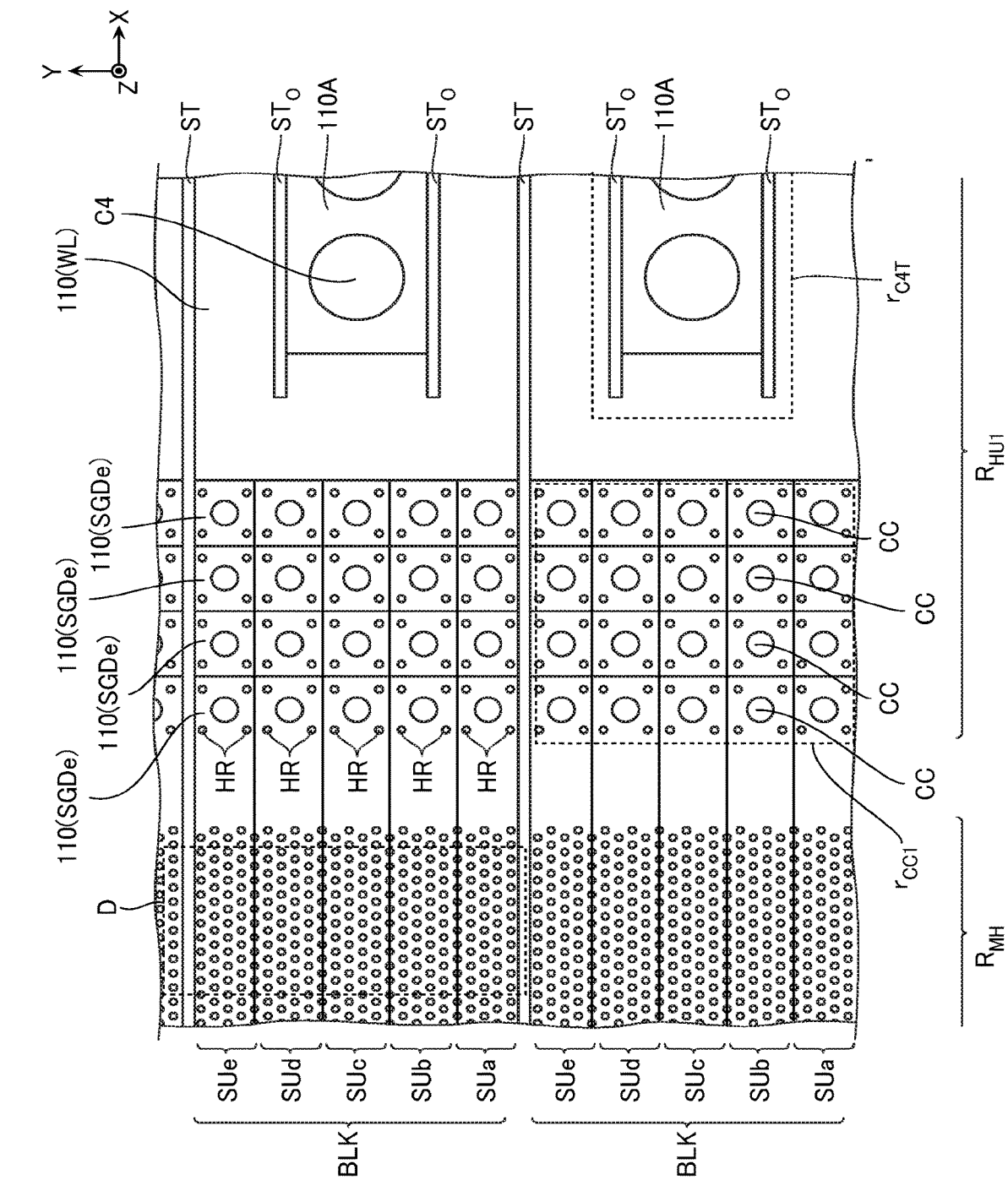
FIG. 12 is a schematic enlarged view of a part indicated by C in FIG. 11.
Figure 13:
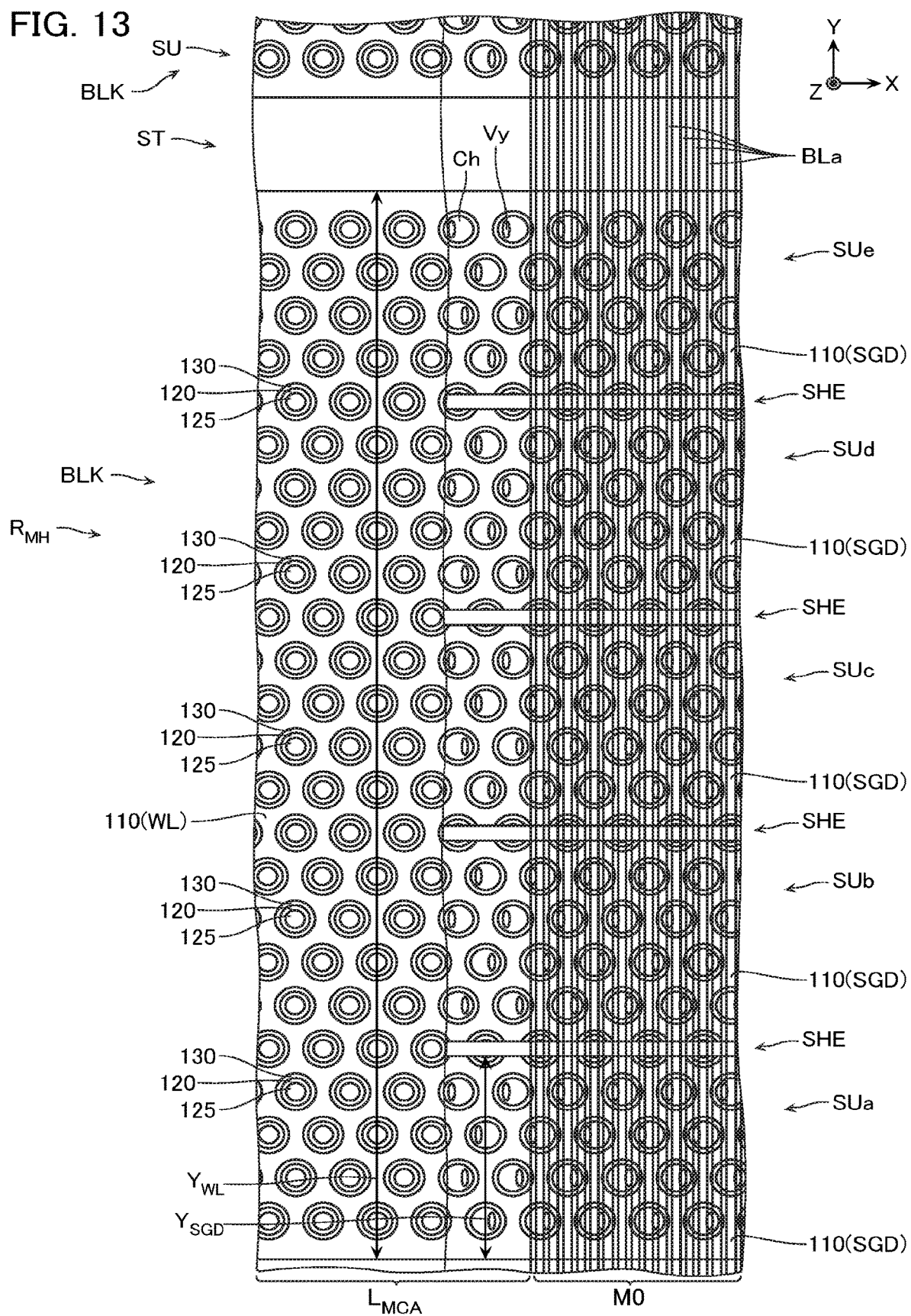
FIG. 13 is a schematic enlarged view of a part indicated by D in FIG. 12.
Figure 14:
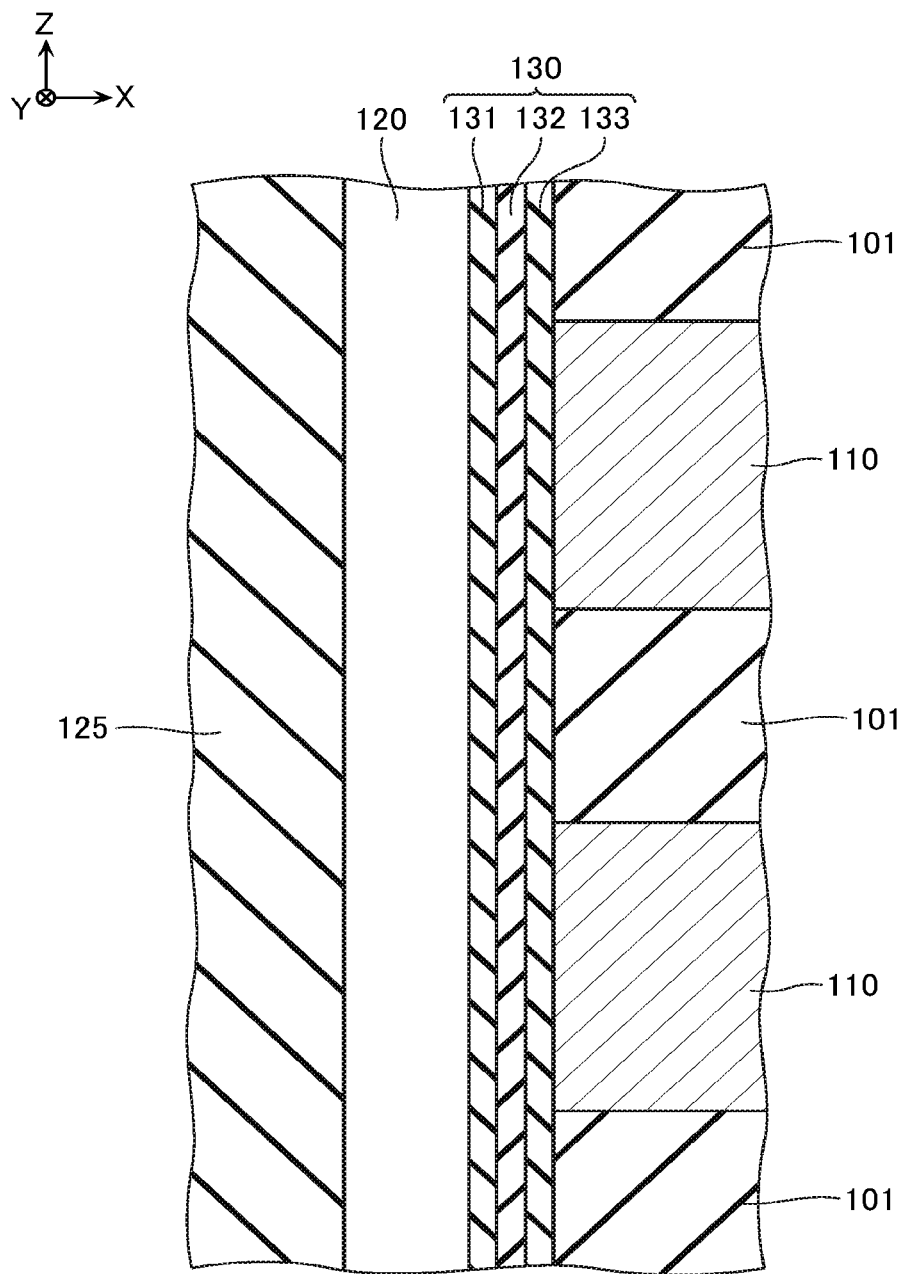
FIG. 14 is a schematic enlarged view of a part indicated by E in FIG. 9.
Figure 15:
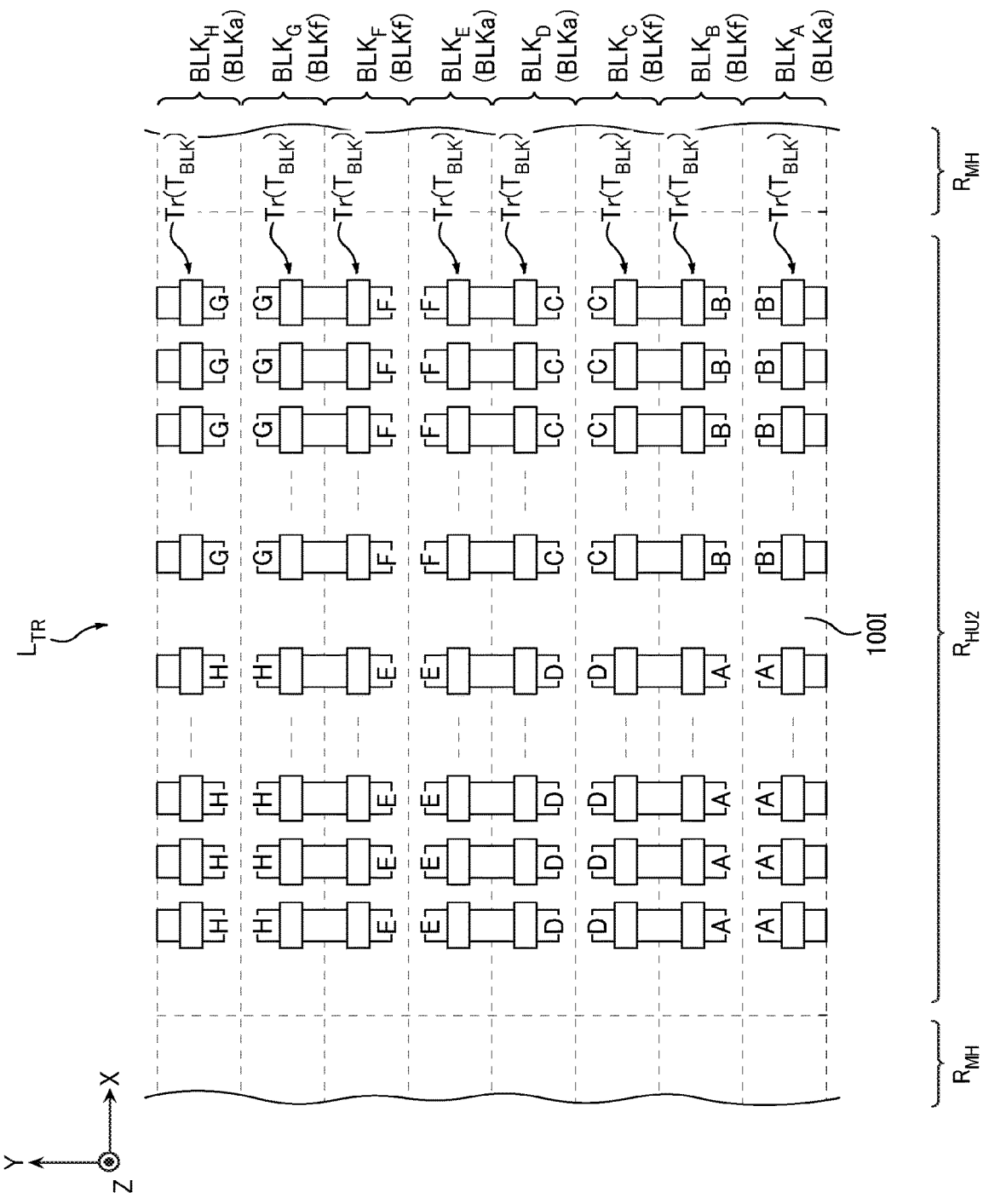
FIG. 15 is a schematic plan view illustrating a configuration disposed at a position overlapping with the configuration in FIG. 10 viewed from a Z-direction.

FIG. 8 is a schematic plan view of the memory die MD. FIG. 9 is a schematic cross-sectional view of the memory die MD. FIG. 10 is a schematic enlarged view of a part indicated by A in FIG. 8. FIG. 11 is a schematic enlarged view of a part indicated by B in FIG. 8. FIG. 12 is a schematic enlarged view of a part indicated by C in FIG. 11. FIG. 13 is a schematic enlarged view of a part indicated by D in FIG. 12. FIG. 14 is a schematic enlarged view of a part indicated by E in FIG. 9. FIG. 15 is a schematic plan view illustrating a configuration disposed at a position overlapping with the configuration in FIG. 10 viewed from the Z-direction. Note that FIG. 10 and FIG. 15 omit a part of a region (a first hook-up region $R_{HU1}$ described later).

For example, as illustrated in FIG. 8, the memory die MD includes a semiconductor substrate 100. In the illustrated example, the semiconductor substrate 100 includes four memory cell array regions $R_{MCA}$ arranged in the X-direction and the Y-direction. The memory cell array region $R_{MCA}$ includes two memory hole regions $R_{MH}$ arranged in the X-direction. The two first hook-up regions $R_{HU1}$ arranged in the X-direction and a second hook-up region $R_{HU2}$ disposed between the first hook-up regions $R_{HU1}$ are disposed between the two memory hole regions $R_{MH}$. Additionally, a peripheral region $R_P$ is disposed in an end portion in the Y-direction of the semiconductor substrate 100. The peripheral region $R_P$ extends in the X-direction along the end portion in the Y-direction of the semiconductor substrate 100.

For example, as illustrated in FIG. 9, the memory die MD includes a transistor layer $L_{TR}$ disposed above the semiconductor substrate 100, a wiring layer D0 disposed above the transistor layer $L_{TR}$, a wiring layer D1 disposed above the wiring layer D0, and a wiring layer D2 disposed above the wiring layer D1. Additionally, the memory die MD includes a memory cell array layer $L_{MCA}$ disposed above the wiring layer D2, and a wiring layer M0 disposed above the memory cell array layer $L_{MCA}$. Although FIG. 9 omits the illustration, a plurality of wiring layers are further disposed above the wiring layer M0.

[Structure of Semiconductor Substrate 100]

For example, the semiconductor substrate 100 is a semiconductor substrate made of P-type silicon (Si) containing P-type impurities, such as boron (B). On a surface of the semiconductor substrate 100, an N-type well region containing N-type impurities, such as phosphorus (P), a P-type well region containing P-type impurities, such as boron (B), a semiconductor substrate region in which the N-type well region and the P-type well region are not disposed, and an insulating region 100I of silicon oxide ($SiO_2$) or the like are disposed.

[Structure of Transistor Layer $L_{TR}$]

For example, as illustrated in FIG. 9, a wiring layer GC is disposed on an upper surface of the semiconductor substrate 100 via an insulating layer (not illustrated). The wiring layer GC includes a plurality of electrodes gc opposed to the surface of the semiconductor substrate 100. The respective regions of the semiconductor substrate 100 and the plurality of electrodes gc included in the wiring layer GC are each connected to contacts CS.

The N-type well region, the P-type well region, and the semiconductor substrate region of the semiconductor substrate 100 each function as channel regions of the plurality of transistors Tr, one electrodes of a plurality of capacitors, and the like constituting the peripheral circuit PC.

The plurality of respective electrodes gc included in the wiring layer GC function as the gate electrodes of the plurality of transistors Tr, the other electrodes of the plurality of capacitors, and the like constituting the peripheral circuit PC.

The contact CS extends in the Z direction and is connected to the semiconductor substrate 100 or the upper surface of the electrode gc at a lower end. In a connection part between the contact CS and the semiconductor substrate 100, an impurity region containing N-type impurities or P-type impurities is disposed. For example, the contact CS may include a stacked film of a barrier conductive film, such as titanium nitride (TiN), and a metal film, such as tungsten (W), or the like.

[Structures of Wiring Layers D0, D1, D2]

For example, as illustrated in FIG. 9, the plurality of wirings included in the wiring layers D0, D1, D2 are electrically connected to at least one of the configuration in the memory cell array layer $L_{MCA}$, the configuration in the transistor layer $L_{TR}$, and the semiconductor substrate 100.

The respective wiring layers D0, D1, D2 include a plurality of wirings d0, d1, d2. For example, the plurality of wirings d0, d1, d2 may include a stacked film of a barrier conductive film, such as titanium nitride (TiN) or tantalum nitride (TaN), and a metal film, such as tungsten (W), copper (Cu), or aluminum (Al), or the like.

[Structure in Memory Hole Region $R_{MH}$ in Memory Cell Array Layer $L_{MCA}$]

For example, as illustrated in FIG. 10, the memory cell array layer $L_{MCA}$ includes a plurality of memory blocks BLK (the memory block $BLK_A$ to a memory block $BLK_H$ in the example of FIG. 10) arranged in the Y-direction.

In the following description, the first, the $4n_B$-th ($n_B$ is a positive integer of 1 or more), and the $4n_B+1$-th memory blocks BLK counted from one side in the Y-direction (for example, the Y-direction negative side in FIG. 10) are referred to as memory blocks BLKa in some cases. FIG. 10 illustrates memory blocks $BLK_A$, $BLK_D$, $BLK_E$, $BLK_H$ as the memory blocks BLKa as an example. In the following description, the second, the third, the $4n_B+2$-th, and the $4n_B+3$-th memory blocks BLK counted from one side in the Y-direction (for example, the Y-direction negative side in FIG. 10) are referred to as memory blocks BLKf in some cases. FIG. 10 illustrates memory blocks $BLK_B$, $BLK_C$, $BLK_F$, $BLK_G$ as the memory blocks BLKf as an example.

For example, as illustrated in FIG. 12, the memory block BLK includes the plurality of string units SU (the string unit SUa to the string unit SUe in the example of FIG. 12) arranged in the Y-direction. As illustrated in FIG. 12, the plurality of string units SUa to string units SUe are disposed at one side in the X-direction (for example, the X-direction negative side in FIG. 12). Although the illustration is omitted, the plurality of string units SUf to string units SUj (FIG. 3) are disposed at the other side in the X-direction (for example, the X-direction positive side in FIG. 12). Between the two memory blocks BLK adjacent in the Y-direction, an inter-block insulating layer ST, such as silicon oxide ($SiO_2$), is disposed. For example, as illustrated in FIG. 13, between the two string units SU adjacent in the Y-direction, an inter-string unit insulating layer SHE, such as silicon oxide ($SiO_2$), is disposed.

For example, as illustrated in FIG. 9, the memory block BLK includes a plurality of conductive layers 110 arranged in the Z-direction and a plurality of semiconductor columns 120 extending in the Z-direction. For example, as illustrated in FIG. 14, the memory block BLK includes a plurality of respective gate insulating films 130 disposed between the plurality of conductive layers 110 and the plurality of semiconductor columns 120.

The conductive layer 110 is a substantially plate-shaped conductive layer extending in the X-direction. The conductive layer 110 includes a plurality of through-holes disposed corresponding to the semiconductor columns 120. Respective inner peripheral surfaces of the plurality of through-holes are opposed to outer peripheral surfaces of the semiconductor columns 120 via the gate insulating films 130. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the plurality of conductive layers 110 arranged in the Z-direction, insulating layers 101, such as silicon oxide ($SiO_2$), are disposed.

As illustrated in FIG. 9, a conductive layer 111 is disposed below the conductive layers 110. For example, the conductive layer 111 may include polycrystalline silicon containing impurities, such as phosphorus (P) or boron (B), or the like. Between the conductive layer 111 and the conductive layers 110, an insulating layer, such as silicon oxide ($SiO_2$), is disposed.

A conductive layer 112 is disposed below the conductive layer 111. The conductive layer 112 may contain, for example, polycrystalline silicon containing impurities, such as phosphorus (P) or boron (B), or the like. The conductive layer 112 may include, for example, a metal, such as tungsten (W), a conductive layer, such as tungsten silicide, or another conductive layer. Between the conductive layer 112 and the conductive layer 111, an insulating layer, such as silicon oxide ($SiO_2$), is disposed.

The conductive layer 112 functions as the source line SL (FIG. 3). The source line SL is, for example, disposed in common among all of the memory blocks BLK included in the memory cell array region $R_{MCA}$ (FIG. 8).

The conductive layer 111 functions as the source-side select gate line SGS (FIG. 3) and the gate electrodes of the plurality of source-side select transistors STS connected thereto. The conductive layers 111 is electrically independent for each memory block BLK.

Among the plurality of conductive layers 110, one or a plurality of conductive layers 110 positioned at the lowermost layer function as the source-side select gate line SGS (FIG. 3) and the gate electrodes of the plurality of source-side select transistors STS connected thereto. The one or the plurality of conductive layers 110 are electrically independent for each memory block BLK.

Each of a plurality of conductive layers 110 positioned above these conductive layers 110 functions as the word line WL (FIG. 3) and the gate electrodes of the plurality of memory cells MC (FIG. 3) connected to this word line WL. The plurality of conductive layers 110 are each electrically independent for every memory block BLK.

One or a plurality of conductive layers 110 positioned above these conductive layers 110 function as the drain-side select gate line SGD and gate electrodes of the plurality of drain-side select transistors STD (FIG. 3) connected thereto. The plurality of conductive layers 110 have widths $Y_{SGD}$ in the Y-direction smaller than widths $Y_{WL}$ of other conductive layers 110 function as the word line WL as illustrated in FIG. 13. Between the two conductive layers 110 adjacent in the Y-direction, the inter-string unit insulating layer SHE is disposed. Additionally, the conductive layers 110 that function as the word lines WL and the like extend in the X-direction from one of the two memory hole regions $R_{MH}$ adjacent in the X-direction to the other via the two first hook-up regions $R_{HU1}$ and second hook-up region $R_{HU2}$. On the other hand, the conductive layer 110 that functions as the drain-side select gate line SGD extends in the X-direction from one memory hole region $R_{MH}$ to a contact connection sub-region $r_{CC1}$ in the first hook-up region $R_{HU1}$ corresponding to this. Therefore, a length in the X-direction of the conductive layer 110 functioning as the drain-side select gate line SGD is smaller than a half length in the X-direction of the conductive layer 110 functioning as the word line WL or the like. The plurality of conductive layers 110 functioning as the drain-side select gate lines SGD are each electrically independent for every string unit SU.

For example, as illustrated in FIG. 13, the semiconductor columns 120 are arranged in a predetermined pattern in the X-direction and the Y-direction. The semiconductor columns 120 function as channel regions of the plurality of memory cells MC and the select transistors (STD, STS) included in one memory string MS (FIG. 3). The semiconductor column 120 is, for example, a semiconductor layer, such as polycrystalline silicon (Si). The semiconductor column 120 has, for example, a substantially cylindrical shape and includes an insulating layer 125 (FIG. 14), such as silicon oxide, at its center part. Each of the outer peripheral surfaces of the semiconductor columns 120 is surrounded by the conductive layers 110 and is opposed to the conductive layers 110.

An impurity region containing N-type impurities, such as phosphorus (P), is disposed on the upper end portion of the semiconductor column 120. This impurity region is connected to the bit line BLa or the bit line BLf via a contact Ch and a contact Vy (FIG. 9).

An impurity region containing N-type impurities, such as phosphorus (P), is disposed on the lower end portion of the semiconductor column 120. This impurity region is connected to the conductive layer 112 (FIG. 9).

The gate insulating film 130 (FIG. 14) has a substantially cylindrical shape that covers the outer peripheral surface of the semiconductor column 120. The gate insulating film 130 includes, for example, as illustrated in FIG. 14, a tunnel insulating film 131, an electric charge accumulating film 132, and a block insulating film 133, which are stacked between the semiconductor column 120 and the conductive layers 110. The tunnel insulating film 131 and the block insulating film 133 are, for example, insulating films of silicon oxide ($SiO_2$) or the like. The electric charge accumulating film 132 is, for example, a film that can accumulate an electric charge. The electric charge accumulating film 132 is, for example, a film of silicon nitride ($Si_3N_4$) or the like. The tunnel insulating film 131, the electric charge accumulating film 132, and the block insulating film 133, which have substantially cylindrical shapes, extend in the Z-direction along the outer peripheral surface of the semiconductor column 120.

FIG. 14 illustrates an example in which the gate insulating film 130 includes the electric charge accumulating film 132 of silicon nitride or the like. However, the gate insulating film 130 may include, for example, a floating gate of polycrystalline silicon containing N-type or P-type impurities or the like.

[Structure of Memory Cell Array Layer $L_{MCA}$ in First Hook-Up Region $R_{HU1}$]

As illustrated in FIG. 11, in the first hook-up region $R_{HU1}$, contact connection sub-regions $r_{CC1}$ each corresponding to the memory block BLK is disposed. Contact connection sub-regions $r_{C4T}$ are disposed in regions corresponding to the memory blocks BLKf.

As illustrated in FIG. 12, in the contact connection sub-region $r_{CC1}$, the end portions in the X-direction of the plurality of conductive layers 110 functioning as the drain-side select gate lines SGD are disposed. Additionally, in the contact connection sub-region $r_{CC1}$, a plurality of contacts CC arranged in a matrix viewed from the Z-direction are disposed. The plurality of contacts CC extend in the Z-direction, and have lower ends connected to the conductive layers 110. The contacts CC may, for example, include a stacked film of a barrier conductive film, such as titanium nitride (TiN), and a metal film, such as tungsten (W), or the like.

Among the plurality of contacts CC arranged in the X-direction, the contact CC closest to the memory hole region $R_{MH}$ is connected to the first conductive layer 110 counted from above. Further, the contact CC second closest to the memory hole region $R_{MH}$ is connected to the second conductive layer 110 counted from above. Hereinafter, similarly, the contact CC a-th (a is a positive integer of 1 or more) closest to the memory hole region $R_{MH}$ is connected to the a-th conductive layer 110 counted from above. The plurality of contacts CC are connected to drain electrodes of the transistors Tr via wirings m0 in the wiring layer M0, the wirings d0, d1, d2 in the wiring layers D0, D1, D2, and the contacts CS.

For example, as illustrated in FIG. 12, supporting structures HR disposed near the contacts CC are disposed in the first hook-up region $R_{HU1}$. The supporting structure HR extends in the Z-direction and is connected to the conductive layer 112 at the lower end. The supporting structure HR includes, for example, an insulating layer, such as silicon oxide ($SiO_2$).

In the contact connection sub-region $r_{C4T}$, two insulating layers $ST_O$ arranged in the Y-direction are disposed. The two insulating layers $ST_O$ are disposed between the two inter-block insulating layers ST arranged in the Y-direction. For example, as illustrated in FIG. 9 and FIG. 12, between the two insulating layers $ST_O$, a plurality of insulating layers 110A arranged in the Z-direction and a plurality of contacts C4 extending in the Z-direction are disposed.

The insulating layers $ST_O$ (FIG. 12) extend in the X-direction and the Z-direction and have lower ends connected to the conductive layers 112. The insulating layer $ST_O$ contains, for example, silicon oxide ($SiO_2$).

The insulating layer 110A is a substantially plate-shaped insulating layer extending in the X-direction. The insulating layer 110A may include an insulating layer of silicon nitride ($Si_3N_4$) or the like. Between the plurality of insulating layers 110A arranged in the Z-direction, insulating layers of silicon oxide ($SiO_2$) or the like are disposed.

The plurality of contacts C4 are arranged in the X-direction. The contact C4 may include a stacked film of a barrier conductive film, such as titanium nitride (TiN), and a metal film, such as tungsten (W), or the like. For example, as illustrated in FIG. 9, outer peripheral surfaces of the contacts C4 are each surrounded by the insulating layers 110A and are connected to the insulating layers 110A. For example, as illustrated in FIG. 9, the contact C4 extends in the Z-direction, has an upper end connected to the wiring m0 in the wiring layer M0 and a lower end connected to the wiring d2 in the wiring layer D2.

As illustrated in FIG. 11, the two memory blocks BLKa, BLKf adjacent in the Y-direction each include the contact connection sub-region $r_{CC1}$. The plurality of respective contacts CC in the two contact connection sub-regions $r_{CC1}$ are connected to the plurality of contacts C4 in the contact connection sub-region $r_{C4T}$ (FIG. 11) corresponding to one memory block BLKf via the wirings m0 (FIG. 9).

[Structure of Memory Cell Array Layer $L_{MCA}$ in Second Hook-Up Region $R_{HU2}$]

As illustrated in FIG. 10, in a region at one side in the X-direction (for example, the X-direction negative side in FIG. 10) in the second hook-up region $R_{HU2}$, a plurality of contact connection sub-regions $r_{CC2}$ and a plurality of contact connection sub-regions $r_{C4T}$ are disposed. The plurality of contact connection sub-regions $r_{CC2}$ are disposed at positions corresponding to the memory block BLKa. The plurality of contact connection sub-regions $r_{C4T}$ are disposed at positions corresponding to the memory block BLKf.

As illustrated in FIG. 10, in a region at the other side in the X-direction (for example, the X-direction positive side in FIG. 10) in the second hook-up region $R_{HU2}$, the plurality of contact connection sub-region $r_{CC2}$ and the plurality of contact connection sub-regions $r_{C4T}$ are disposed as well. The plurality of contact connection sub-regions $r_{CC2}$ are disposed at positions corresponding to the memory block BLKf. The plurality of contact connection sub-regions $r_{C4T}$ are disposed at positions corresponding to the memory block BLKa.

As illustrated in FIG. 11, the contact connection sub-region $r_{CC2}$ includes a part of the plurality of conductive layers 110 functioning as the word lines WL or the source-side select gate lines SGS. The contact connection sub-region $r_{CC2}$ includes the plurality of contacts CC arranged in the X-direction. For example, as illustrated in FIG. 9, the plurality of contacts CC extend in the Z-direction and have lower ends connected to the conductive layers 110. The contacts CC may, for example, include a stacked film of a barrier conductive film, such as titanium nitride (TiN), and a metal film, such as tungsten (W), or the like.

Among the plurality of contacts CC arranged in the X-direction, the contact CC closest to the memory hole region $R_{MH}$ is connected to the first conductive layer 110 counted from the lower side. Further, the contact CC second closest to the memory hole region $R_{MH}$ is connected to the second conductive layer 110 counted from the lower side. Hereinafter, similarly, the contact CC b-th (b is a positive integer of 1 or more) closest to the memory hole region $R_{MH}$ is connected to the b-th conductive layer 110 counted from the lower side. The plurality of contacts CC are connected to the drain electrodes of the transistors Tr via the wirings m0 in the wiring layer M0, the wirings d0, d1, d2 in the wiring layers D0, D1, D2, and the contacts CS.

The contacts CC in the contact connection sub-region $r_{CC2}$ corresponding to the memory block BLKa (FIG. 10) are each connected to the contact C4 in the contact connection sub-region $r_{C4T}$ corresponding to the memory block BLKf adjacent to the memory block BLKa via the wiring m0 (FIG. 9) extending in the Y-direction. Moreover, the contacts CC in the contact connection sub-region $r_{CC2}$ corresponding to the memory block BLKf are each connected to the contact C4 in the contact connection sub-region $r_{C4T}$ corresponding to the memory block BLKa adjacent to the memory block BLKf via the wiring m0 (FIG. 9) extending in the Y-direction.

The configuration allows comparatively shortening a distance between the contact CC and the contact C4 connected to the contact CC. Accordingly, a complicated wiring pattern of the wirings m0 in the wiring layer M0 can be reduced. In the configuration illustrated in FIG. 10 as an example, the contact connection sub-regions $r_{CC2}$ are formed across the two adjacent memory blocks BLK in the Y-direction. Here, for example, in FIG. 10, it is considered that the contact connection sub-regions $r_{CC2}$ are disposed at a position corresponding to the $2n_B$-th memory block BLK counted from the Y-direction negative side in a region at the X-direction negative side of the second hook-up region $R_{HU2}$, and at a position corresponding to the $2n_B+1$-th memory block BLK counted from the Y-direction negative side in a region at the X-direction positive side of the second hook-up region $R_{HU2}$. The structure as illustrated in FIG. 10 as an example is easily manufacturable compared with such a structure.

As illustrated in FIG. 15, the plurality of transistors Tr are disposed in the transistor layer $L_{TR}$ described above. In the example of FIG. 15, a plurality of transistor rows arranged in the Y-direction are disposed corresponding to the plurality of memory blocks BLK arranged in the Y-direction. The transistor rows each include the plurality of transistors Tr arranged in the X-direction.

In the example of FIG. 15, the plurality of transistors Tr are disposed at positions corresponding to the contact connection sub-region $r_{CC2}$ (see FIG. 10) including the contacts CC connected to the memory block $BLK_A$. Additionally, the plurality of transistors Tr are disposed at positions corresponding to the contact connection sub-region $r_{C4T}$ (see FIG. 10) including the contacts C4 connected to the memory block $BLK_A$. The plurality of transistors Tr are each electrically connected to the word lines WL and the select gate lines (SGD, SGS) in the memory block $BLK_A$ and function as the plurality of transistors $T_{BLK}$ (FIG. 3).

Similarly, in the example of FIG. 15, the plurality of transistors Tr are disposed at the positions corresponding to the contact connection sub-region $r_{CC2}$ including the contacts CC connected to any of the memory blocks BLK. Additionally, the plurality of transistors Tr are disposed at the positions corresponding to the contact connection sub-region $r_{C4T}$ including the contacts C4 connected to this memory block BLK. The plurality of transistors Tr are each electrically connected to the word lines WL and the select gate lines (SGD, SGS) in this memory block BLK to function as the plurality of transistors $T_{BLK}$ (FIG. 3).

The configuration allows comparatively shortening a distance between the contact C4, which is illustrated in FIG. 10 as an example, and the transistor Tr, which is illustrated in FIG. 15 as an example. Accordingly, a complicated wiring pattern of the wirings d0, d1, d2 in the wiring layers D0, D1, D2 can be reduced. In the configuration illustrated in FIG. 15 as an example, drain regions of the plurality of transistors Tr corresponding to the same memory block BLK are adjacent via the insulating regions 100I in the X-direction and the Y-direction. The configuration allows reducing a voltage difference between the drain regions of the two adjacent transistors Tr in the X-direction or the Y-direction. Therefore, while a withstand voltage between the transistors Tr is ensured, an area of the insulating region 100I can be reduced.

[Structure of Wiring Layer M0]

As illustrated in FIG. 9, for example, a plurality of wirings included in the wiring layer M0 are electrically connected to at least one of the configuration in the memory cell array layer $L_{MCA}$ and the configuration in the transistor layer $L_{TR}$.

The wiring layer M0 includes the plurality of wirings m0. The plurality of wirings m0 may include, for example, a stacked film of a barrier conductive film, such as titanium nitride (TiN) or tantalum nitride (TaN) and a metal film, such as tungsten (W) or copper (Cu), or the like. Note that a part of the plurality of wirings m0 function as the bit lines BLa, BLf (FIG. 3). For example, as illustrated in FIG. 13, the bit lines BLa are arranged in the X-direction and extend in the Y-direction. Additionally, the plurality of bit lines BLa are each connected to one semiconductor column 120 included in each string unit SU. Although the illustration is omitted, similarly to the bit lines BLa, the bit lines BLf are arranged in the X-direction and extend in the Y-direction. Similarly to the bit lines BLa, the bit lines BLf are each connected to one semiconductor column 120 included in each string unit SU.

[Threshold Voltage of Memory Cell MC]

Next, with reference to FIG. 16A, FIG. 16B, and FIG. 16C, the threshold voltage of the memory cell MC will be described.

Figures 16A, 16B, 16C:
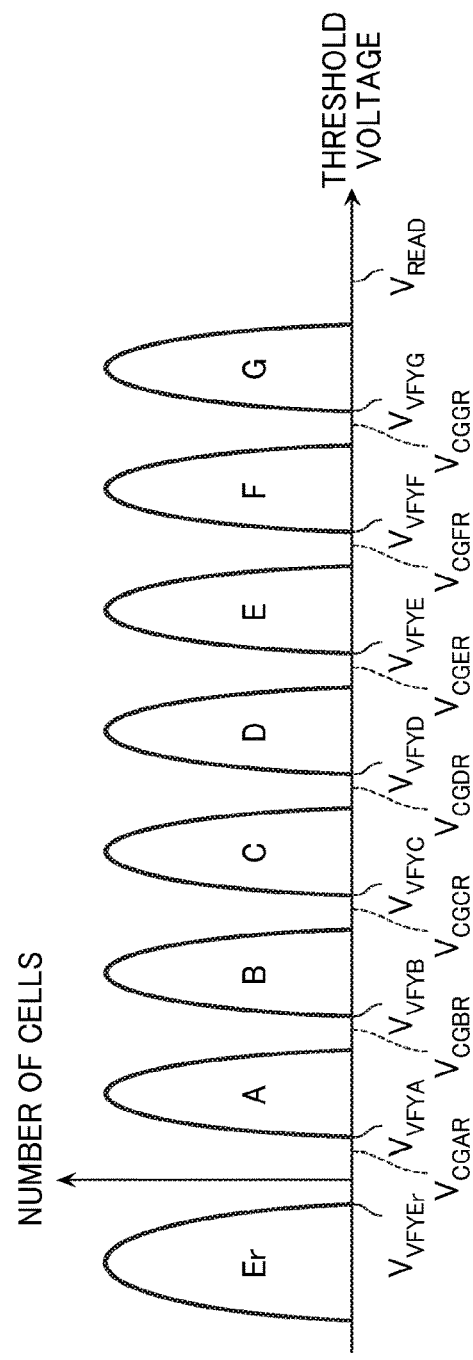
FIG. 16A is a schematic histogram for describing a threshold voltage of a memory cell MC that stores 3-bit data.
FIG. 16B is a table showing an example of a relation between the threshold voltage of the memory cell MC that stores the 3-bit data and the stored data.
FIG. 16C is a table showing another example of the relation between the threshold voltage of the memory cell MC that stores the 3-bit data and the stored data.

FIG. 16A is a schematic histogram for describing the threshold voltage of the memory cell MC in which 3-bit data is stored. The horizontal axis indicates the voltage of the word line WL, and the vertical axis indicates the number of memory cells MC. FIG. 16B is a table showing an example of a relation between the threshold voltage of the memory cell MC in which the 3-bit data is stored and the stored data. FIG. 16C is a table showing another example of the relation between the threshold voltage of the memory cell MC in which the 3-bit data is stored and the stored data.

In the example of FIG. 16A, the threshold voltages of the memory cells MC are controlled in states of eight patterns. The threshold voltage of the memory cell MC controlled in an Er state is smaller than an erase verify voltage $V_{VFYEr}$. For example, the threshold voltage of the memory cell MC controlled in an A state is larger than a verify voltage $V_{VFYA}$ and smaller than a verify voltage $V_{VFYB}$. Additionally, for example, the threshold voltage of the memory cell MC controlled in a B state is larger than the verify voltage $V_{VFYB}$ and smaller than a verify voltage $V_{VFYC}$. Hereinafter, similarly, the threshold voltages of the memory cells MC controlled in a C state to an F state are larger than the verify voltage $V_{VFYC}$ to a verify voltage $V_{VFYF}$ and smaller than a verify voltage $V_{VFYD}$ to a verify voltage $V_{VFYG}$, respectively. For example, the threshold voltage of the memory cell MC controlled in a G state is larger than the verify voltage $V_{VFYG}$ and smaller than a read pass voltage $V_{READ}$.

In the example of FIG. 16A, a read voltage $V_{CGAR}$ is set between a threshold distribution corresponding to the Er state and a threshold distribution corresponding to the A state. A read voltage $V_{CGBR}$ is set between a threshold distribution corresponding to the A state and a threshold distribution corresponding to the B state. Hereinafter, similarly, the read voltage $V_{CGCR}$ to a read voltage $V_{CGGR}$ are set between a threshold distribution corresponding to the B state and a threshold distribution corresponding to the C state, and between a threshold distribution corresponding to the F state and a threshold distribution corresponding to the G state, respectively.

For example, the Er state corresponds to the lowest threshold voltage (the threshold voltage of the memory cell MC in the erase state). For example, data "111" is assigned to the memory cell MC corresponding to the Er state.

The A state corresponds to the threshold voltage higher than the threshold voltage corresponding to the Er state. For example, data "101" is assigned to the memory cell MC corresponding to the A state.

The B state corresponds to the threshold voltage higher than the threshold voltage corresponding to the A state. For example, data "001" is assigned to the memory cell MC corresponding to the B state.

Hereinafter, similarly, the C state to the G state in the drawing correspond to threshold voltages higher than threshold voltages corresponding to the B state to the F state. For example, data "011", "010", "110", "100", and "000" are assigned to the memory cells MC corresponding to these distributions.

In the case of the assignment as exemplified in FIG. 16B, the data of a low-order bit is distinguishable with one read voltage $V_{CGDR}$. The data of a middle-order bit is distinguishable with three read voltages $V_{CGAR}$, $V_{CGCR}$, $V_{CGFR}$. The data of a high-order bit is distinguishable with three read voltages $V_{CGBR}$, $V_{CGER}$, $V_{CGGR}$. Such an assignment of the data is referred to as a 1-3-3 code in some cases.

The number of bits of the data stored in the memory cell MC, the number of states, the assignment of the data to each state, and the like are changeable as necessary.

For example, in the case of the assignment as exemplified in FIG. 16C, the data of the low-order bit is distinguishable with one read voltage $V_{CGDR}$. The data of the middle-order bit is distinguishable with the two read voltages $V_{CGBR}$, $V_{CGFR}$. The data of the high-order bit is distinguishable with the four read voltages $V_{CGAR}$, $V_{CGCR}$, $V_{CGER}$, $V_{CGGR}$. Such an assignment of the data is referred to as a 1-2-4 code in some cases.

For example, in a case where one-bit data is stored in the memory cell MC, the threshold voltage of the memory cell MC is controlled in two patterns. For example, in a case where two-bit data is stored in the memory cell MC, the threshold voltage of the memory cell MC is controlled in four patterns. Hereinafter, similarly, in a case where $n_T$ ($n_T$ is a positive integer of 4 or more) bit data is stored in the memory cell MC, the threshold voltage of the memory cell MC is controlled in $2^{n_T}$ patterns.

[Read Operation]

Next, the read operation of the semiconductor memory device according to this embodiment will be described. In the following description, an example in which data are assigned to the memory cells MC in the aspect as illustrated in FIG. 16B as an example will be described.

[Read Operation of Low-Order Bit]

Figure 17:
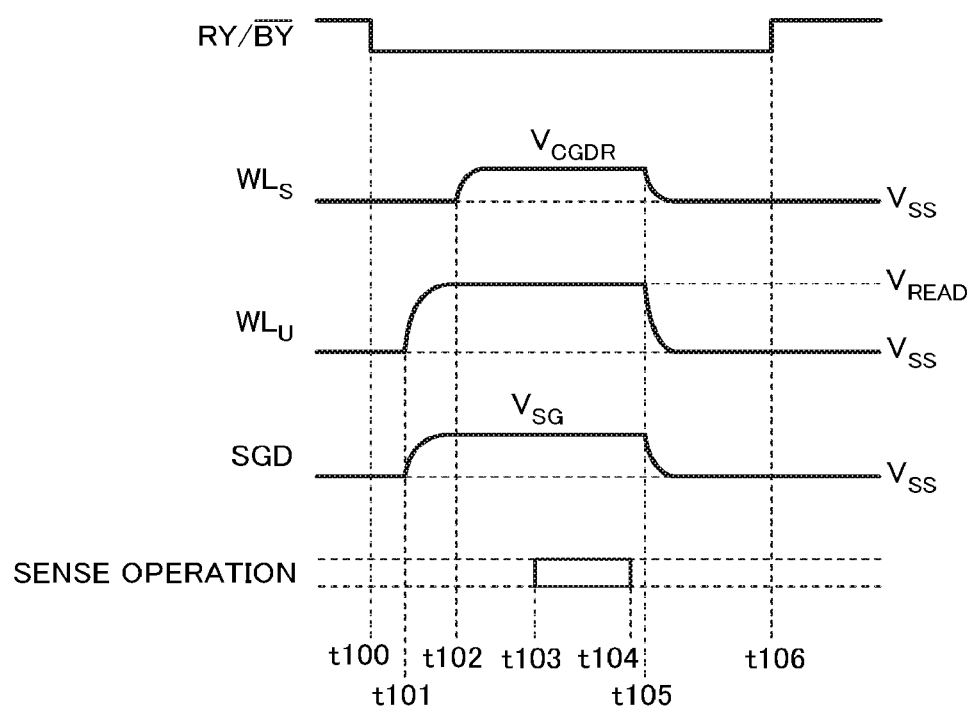
FIG. 17 is a schematic waveform diagram for describing a read operation of a low-order bit.
Figure 18:
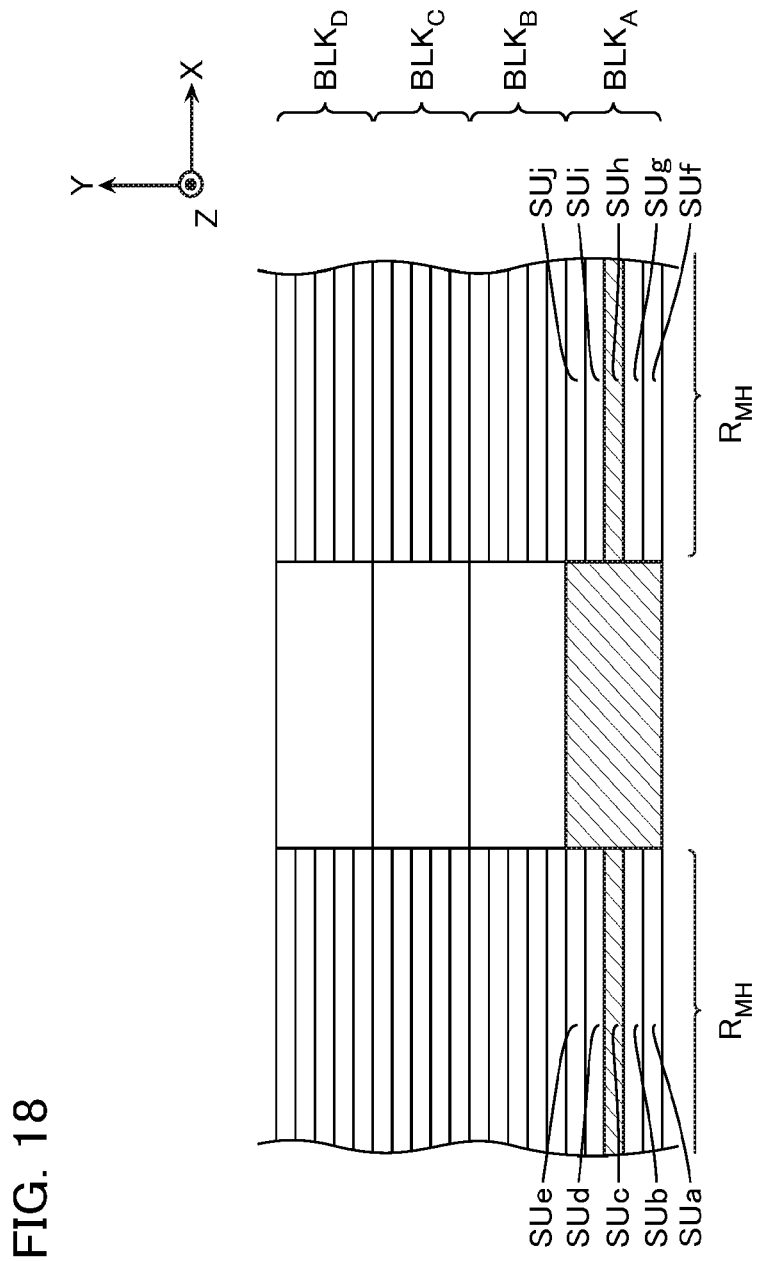
FIG. 18 is a schematic plan view for describing the read operation.
Figure 19:
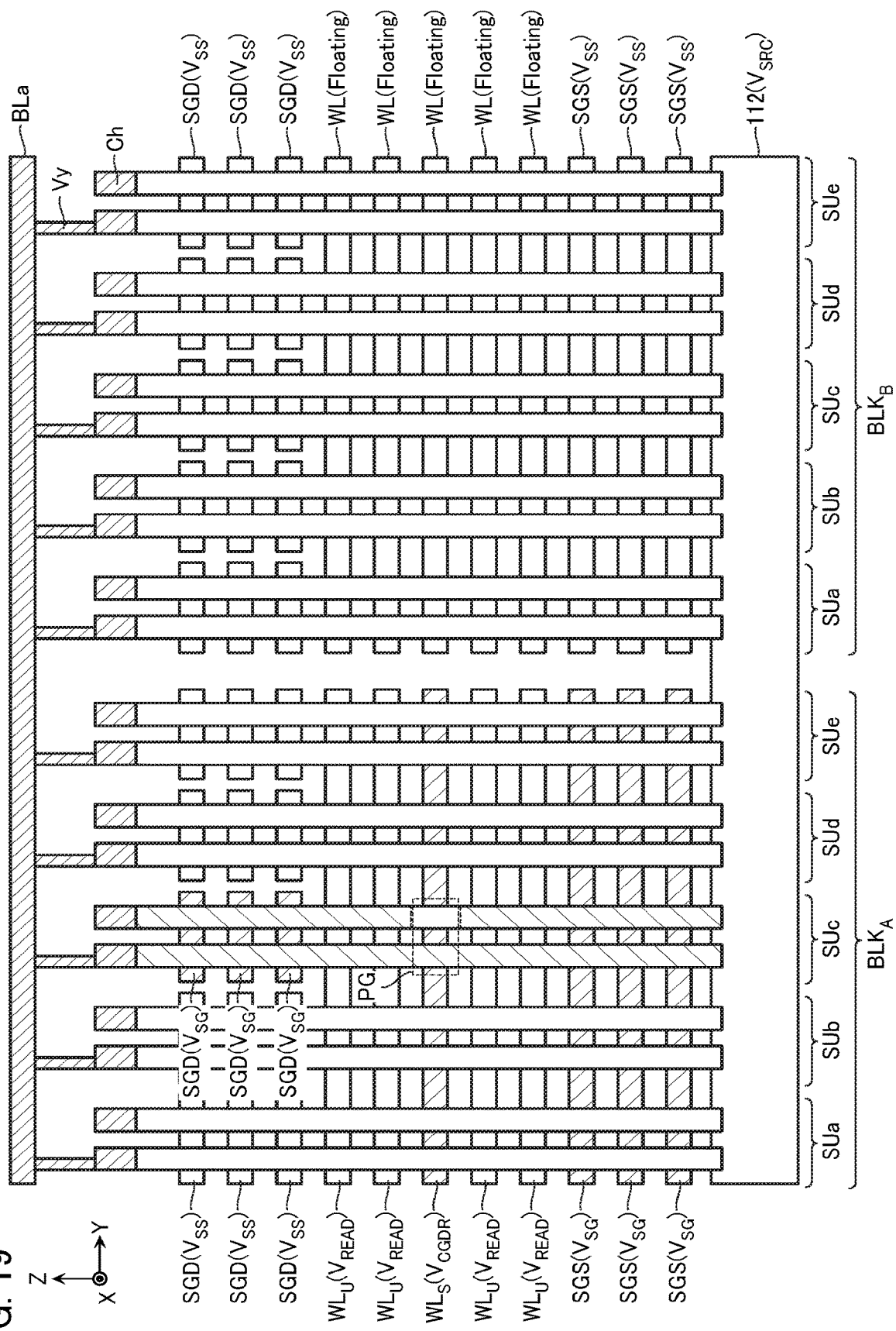
FIG. 19 is a schematic cross-sectional view for describing the read operation.
Figure 20:
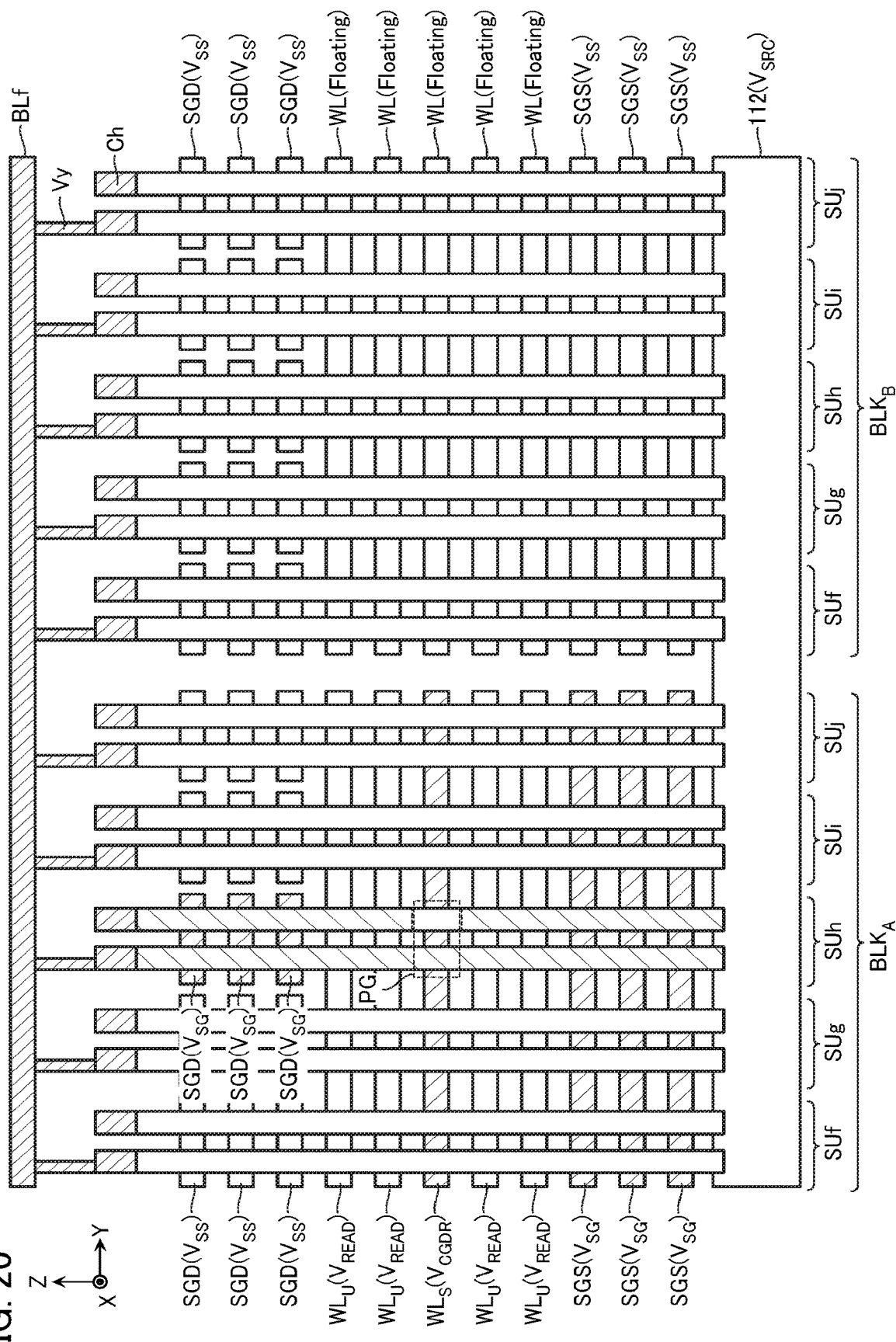
FIG. 20 is a schematic cross-sectional view for describing the read operation.

FIG. 17 is a schematic waveform diagram for describing the read operation of the low-order bit. FIG. 18 is a schematic plan view for describing the read operation. FIG. 19 and FIG. 20 are schematic cross-sectional views for describing the read operation. FIG. 19 illustrates the Y-Z cross-sectional surface along the bit line BLa, and FIG. 20 illustrates the Y-Z cross-sectional surface along the bit line BLf. FIG. 18 to FIG. 20 illustrate an example in which the read operation is simultaneously performed on the memory cell MC in a string unit SUc and the memory cell MC in a string unit SUh in the memory block $BLK_A$.

In the following description, the word line WL that is a target of the operation may be referred to as "selected word line $WL_S$" and the word line WL other than the target of the operation may be referred to as "unselected word line $WL_U$". In the following description, an example where the read operation is performed on the memory cells MC connected to the selected word line $WL_S$ (hereinafter sometimes referred to as "selected memory cell MC") among the plurality of memory cells MC included in the string unit SU target of the operation will be described. In the following description, the configuration including such a plurality of selected memory cells MC may be referred to as a selected page PG.

At timing t100 in the read operation, for example, as illustrated in FIG. 17, a signal of the ready/busy terminal RY/(/BY) switches from the "H" state to the "L" state.

At timing t101 in the read operation, the read pass voltage $V_{READ}$ is supplied to the unselected word lines $WL_U$ to set all of the unselected memory cells MC in an ON state. For example, as illustrated in FIG. 19 and FIG. 20, a voltage $V_{SG}$ is supplied to the select gate lines (SGD, SGS) corresponding to the selected page PG and the ground voltage $V_{SS}$ is supplied to the other select gate lines (SGD, SGS). The voltage $V_{SG}$ has a magnitude to the extent in which an electron channel is formed in the channel region of the select transistor (STD, STS) and this sets the select transistor (STD, STS) in the ON state.

For example, as illustrated in FIG. 17, the read voltage $V_{CGDR}$ is supplied to the selected word line $WL_S$ at timing t102 in the read operation. This sets the selected memory cells MC in the Er state to the C state in the ON state and sets the remaining selected memory cells MC in the OFF state.

At the timing t102, for example, the bit lines BLa, BLf, and the sense node SEN are charged, for example. For example, the latch circuit SDL in FIG. 7 is caused to latch "H" to set states of the signal lines STB, XXL, BLC, BLS, HLL, BLX to "L, L, H, H, H, H". Thus, the voltage $V_{DD}$ is supplied to the bit lines BLa, BLf and the sense node SEN, and charging of them starts. For example, the voltage $V_{SRC}$ is supplied to the source line SL (FIG. 3) to start charging them. The voltage $V_{SRC}$, for example, has a magnitude to the same extent of the ground voltage $V_{SS}$. The voltage $V_{SRC}$ is, for example, larger than the ground voltage $V_{SS}$ and smaller than the voltage $V_{DD}$.

For example, as illustrated in FIG. 17, at timing t103 to timing t104 in the read operation, a sense operation is performed. For example, the sense amplifier module SAM (FIG. 1) detects the ON state/OFF state of the selected memory cell MC and acquires data indicative of the state of this memory cell MC. For example, in a state where the voltage $V_{DD}$ is supplied to the bit lines BLa, BLf, the state of the signal line XXL is set to "H" for a certain period. Accordingly, the sense node SEN in the sense amplifier SA (FIG. 7) is electrically conducted with the bit lines BLa, BLf for the certain period. After performing the sense operation, the state of the signal line STB is temporarily set to "H". Accordingly, the sense transistor 41 is electrically conduced with the wiring LBUS (FIG. 7) and electric charges of the wiring LBUS are discharged or maintained. Additionally, any of the latch circuits in the sense amplifier unit SAU electrically conducts with the wiring LBUS, and this latch circuit latches the data of the wiring LBUS.

At timing t105 in the read operation, the ground voltage $V_{SS}$ is supplied to the selected word line $WL_S$, the unselected word lines $WL_U$, and the select gate lines (SGD, SGS).

At timing t106 in the read operation, for example, as illustrated in FIG. 17, the signal of the ready/busy terminal RY/(/BY) switches from the "L" state to the "H" state.

In the read operation of the low-order bit, the data indicative of the state of the selected memory cell MC is data stored in the memory cell MC. This data is transferred to the cache memory CM (FIG. 1) via the wiring LBUS (FIG. 7), the switch transistor DSW, and the wiring DBUS.

[Read Operation of Middle-Order Bit]

Figure 21:
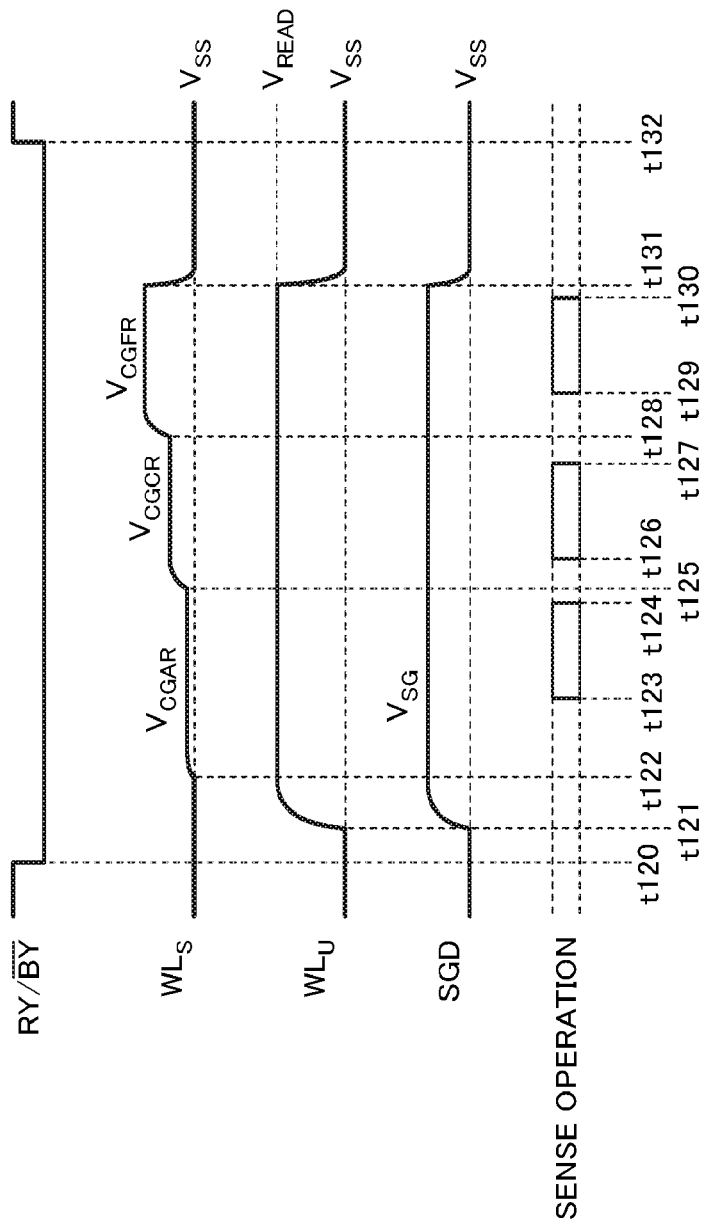
FIG. 21 is a schematic waveform diagram for describing a read operation of a middle-order bit.

FIG. 21 is a schematic waveform diagram for describing the read operation of the middle-order bit.

Operations at timing t120 to timing t124 in the read operation of the middle-order bit are performed similarly to the operations at the timing t100 to the timing t104 in the read operation of the low-order bit. However, at timing t122, the read voltage $V_{CGAR}$ is supplied to the selected word line $WL_S$. Thus, the selected memory cells MC in the Er state enter the ON state and the remaining selected memory cells MC enter the OFF state.

Operations at timing t125 to timing t127 in the read operation of the middle-order bit are performed similarly to the operations at the timing t102 to the timing t104 in the read operation of the low-order bit. However, at timing t125, the read voltage $V_{CGCR}$ is supplied to the selected word line $WL_S$. Thus, the selected memory cells MC in the Er state to the B state enter the ON state, and the remaining selected memory cells MC enter the OFF state.

Operations at timing t128 to timing t130 in the read operation of the middle-order bit are performed similarly to the operations at the timing t102 to the timing t104 in the read operation of the low-order bit. However, at timing t128, the read voltage $V_{CGFR}$ is supplied to the selected word line $WL_S$. Thus, the selected memory cells MC in the Er state to the E state enter the ON state and the remaining selected memory cells MC enter the OFF state.

Operations at timing t131 to timing t132 in the read operation of the middle-order bit are performed similarly to the operations at the timing t105 to the timing t106 in the read operation of the low-order bit.

In the read operation of the middle-order bit, an arithmetic operation, such as exclusive OR, is performed on three pieces of data indicative of the states of the selected memory cells MC, and thus the data stored in the selected memory cells MC are calculated. This data is transferred to the cache memory CM via the wiring LBUS (FIG. 7), the switch transistor DSW, and the wiring DBUS.

[Read Operation of High-Order Bit]

Figure 22:
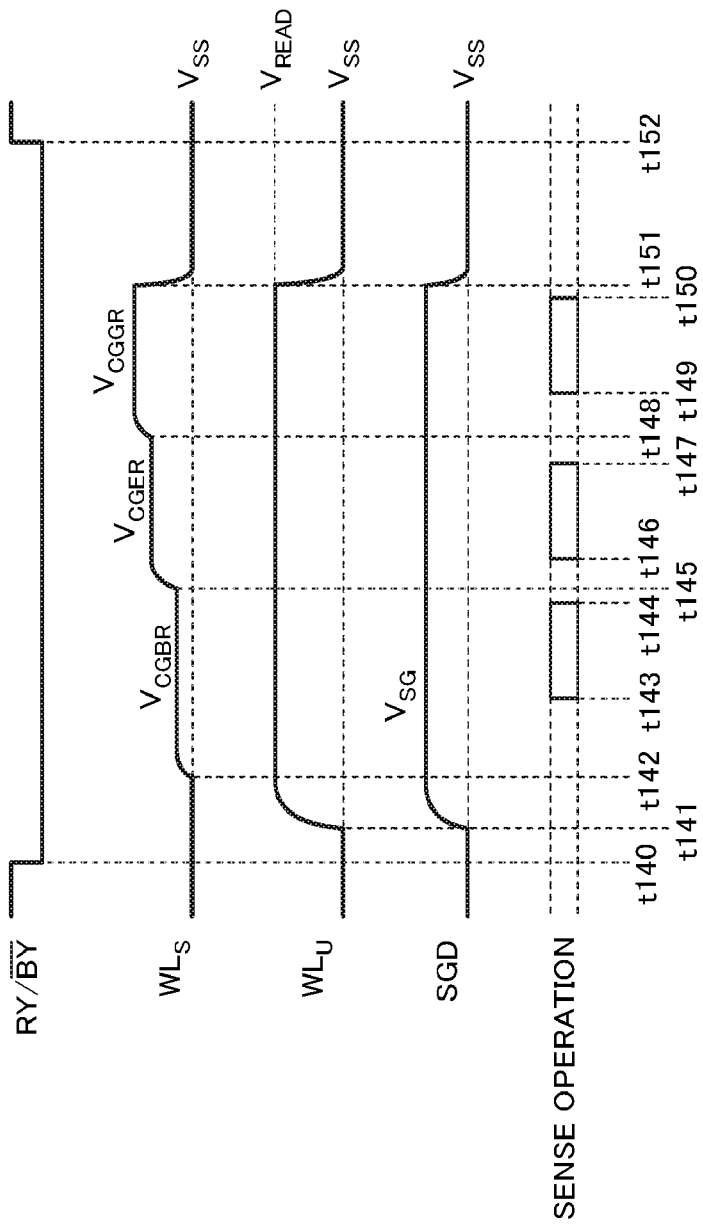
FIG. 22 is a schematic waveform diagram for describing a read operation of a high-order bit.

FIG. 22 is a schematic waveform diagram for describing the read operation of the high-order bit.

Operations at timing t140 to timing t144 in the read operation of the high-order bit are performed similarly to the operations at the timing t100 to the timing t104 in the read operation of the low-order bit. However, at timing t142, the read voltage $V_{CGBR}$ is supplied to the selected word line $WL_S$. Thus, the selected memory cells MC in the Er state and the A state enter the ON state, and the remaining selected memory cells MC enter the OFF state.

Operations at timing t145 to timing t147 in the read operation of the high-order bit are performed similarly to the operations at the timing t102 to the timing t104 in the read operation of the low-order bit. However, at timing t145, the read voltage $V_{CGER}$ is supplied to the selected word line $WL_S$. Thus, the selected memory cells MC in the Er state to the D state enter the ON state, and the remaining selected memory cells MC enter the OFF state.

Operations at timing t148 to timing t150 in the read operation of the high-order bit are performed similarly to the operations at the timing t102 to the timing t104 in the read operation of the low-order bit. However, at timing t148, the read voltage $V_{CGGR}$ is supplied to the selected word line $WL_S$. Thus, the selected memory cells MC in the Er state to the F state enter the ON state and the selected memory cells MC in the G state enter the OFF state.

Operations at timing t151 to timing t152 in the read operation of the high-order bit are performed similarly to the operations at the timing t105 to the timing t106 in the read operation of the low-order bit.

In the read operation of the high-order bit, an arithmetic operation, such as exclusive OR, is performed on three pieces of data indicative of the states of the selected memory cells MC, and thus the data stored in the selected memory cells MC are calculated. This data is transferred to the cache memory CM via the wiring LBUS (FIG. 7), the switch transistor DSW, and the wiring DBUS.

[Designation of Selected Page PG]

Figure 23:
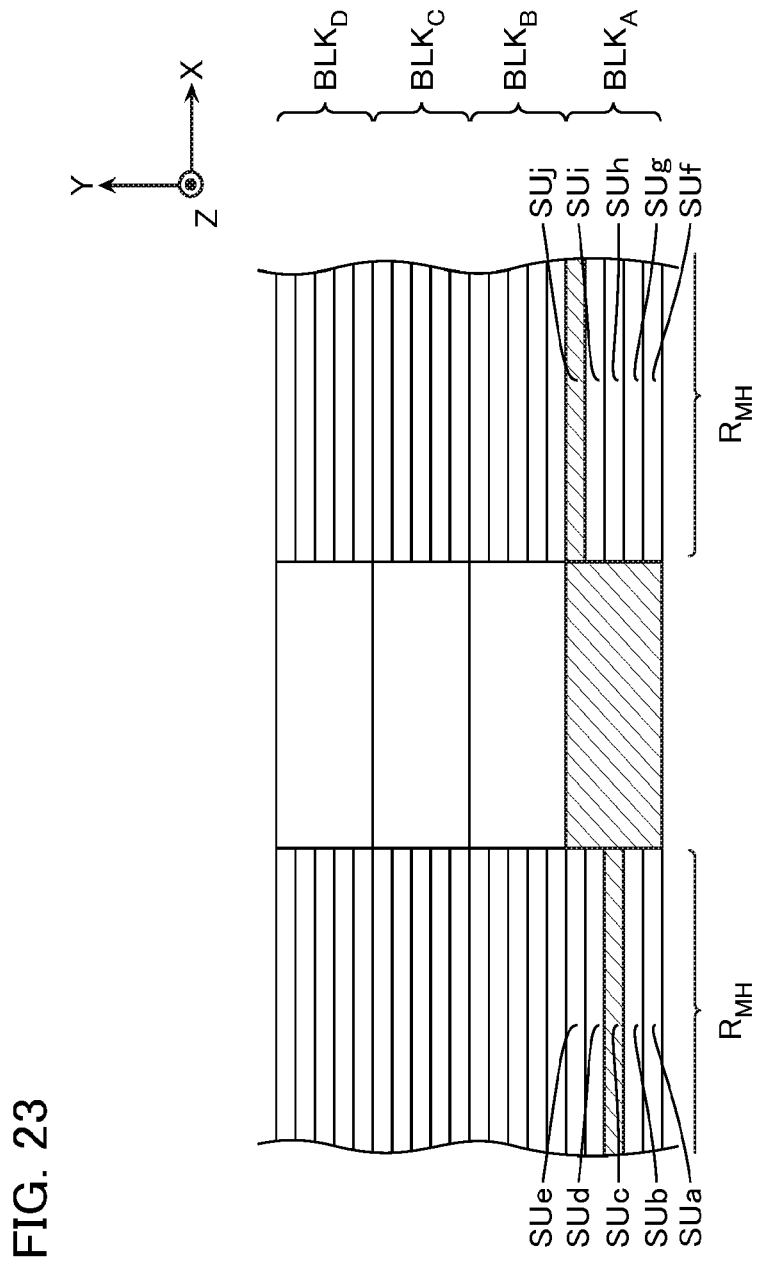
FIG. 23 is a schematic plan view for describing a read operation performable in the memory die MD.
Figure 24:
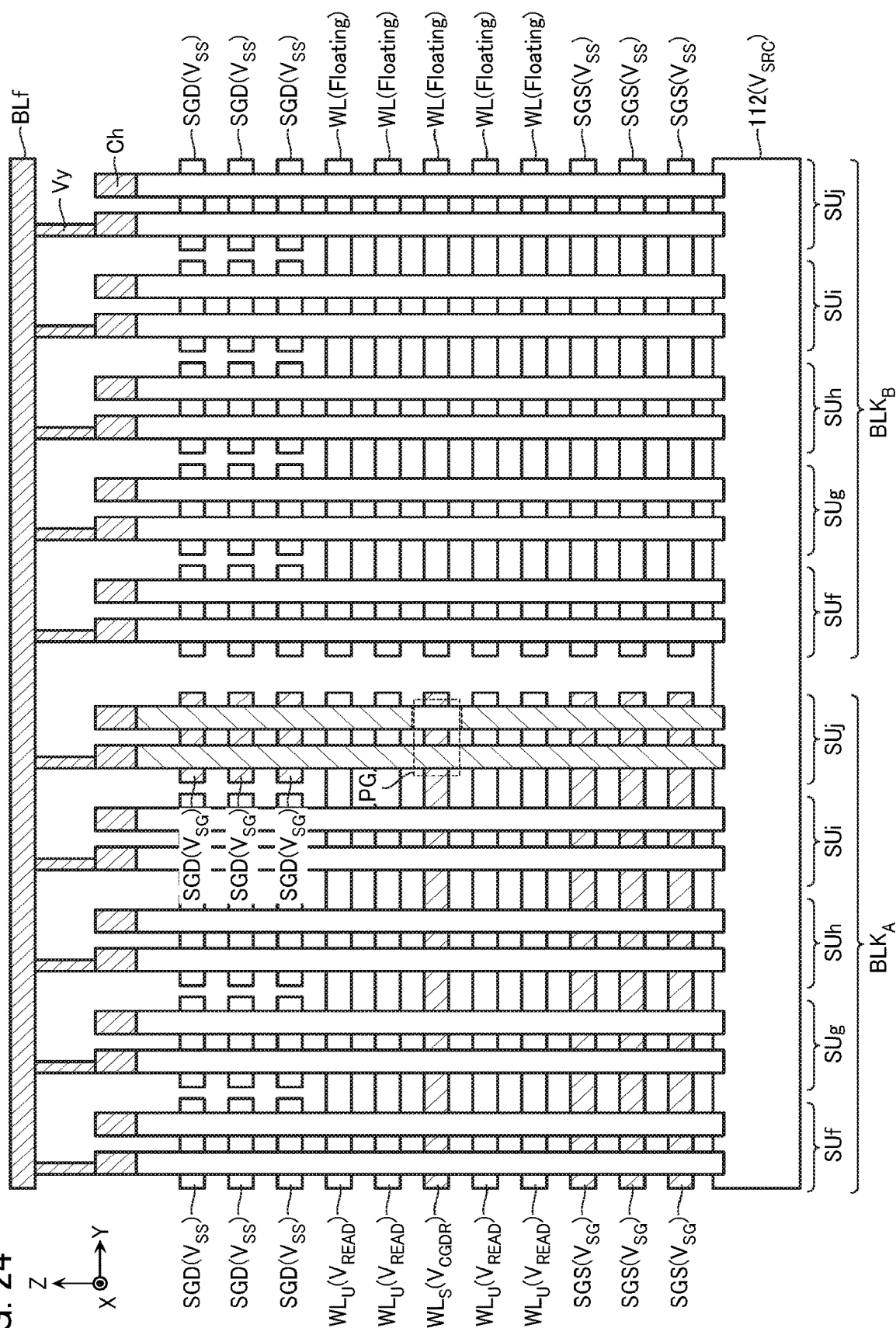
FIG. 24 is a schematic cross-sectional view for describing the read operation.

As described with reference to FIG. 1 and the like, the memory die MD according to this embodiment can simultaneously select the two drain-side select gate lines SGD according to the two string addresses $A_{SU}$ in the address register ADR. One of these two drain-side select gate line is one of the drain-side select gate line SGDa to the drain-side select gate line SGDe. The other one of these two drain-side select gate lines is one of the drain-side select gate line SGDf to the drain-side select gate line SGDj. Therefore, for example, as illustrated in FIG. 18 to FIG. 20 as an example, the read operation can be simultaneously performed on the memory cells MC in the string unit SUc and the memory cells MC in the string unit SUh in the memory block $BLK_A$. For example, as illustrated in FIG. 23, FIG. 19, and FIG. 24 as an example, the read operation can be simultaneously performed on the memory cells MC in the string unit SUc and the memory cells MC in the string unit SUj in the memory block $BLK_A$.

In performing the read operation, a command set including command data and address data is input from the controller die (not illustrated) to the memory die MD.

In performing the read operation, for example, one command set and another command set may be input to the memory die MD. In this case, one command set may include one string address $A_{SU}$ (FIG. 1). Another command set may include another string address $A_{SU}$ (FIG. 1). In this case, another command set may include data other than the string address $A_{SU}$ or need not include the data. Another command set may include data that designates the memory cell array region $R_{MCA}$ (FIG. 8), the block address $A_{BLK}$ (FIG. 1), the word line address $A_{WL}$ (FIG. 1), data that designates the low-order bit, the middle-order bit, or the high-order bit, and the like. In this case, the data may match the data included in the one command set.

In performing the read operation, for example, the command set including one string address $A_{SU}$ (FIG. 1) and another string address $A_{SU}$ (FIG. 1) may be input to the memory die MD.

[Effects of First Embodiment]

As described above, in this embodiment, a part of the plurality of conductive layers 110 function as the word lines WL and another part of the conductive layers 110 function as the drain-side select gate lines SGD. In this embodiment, the length in the X-direction of the conductive layer 110 functioning as the drain-side select gate line SGD is smaller than the half length in the X-direction of the conductive layer 110 functioning as the word line WL or the like. In this embodiment, the two respective conductive layers 110 arranged in the X-direction function as the drain-side select gate lines SGD corresponding to the different string units SU. These two respective conductive layers 110 are connected to the different transistors $T_{BLK}$.

Here, it is considered that the length in the X-direction of the conductive layer 110 functioning as the drain-side select gate line SGD is configured to be the same extent as the length in the X-direction of the conductive layer 110 functioning as the word line WL or the like. Hereinafter, the configuration example is referred to as a comparative example. Compared with the first embodiment, a data volume in the selected page PG increases in the comparative example. For example, in a case where the lengths in the X-direction of the conductive layers 110 functioning as the word lines WL are same extent, the data volume in the selected page PG in the comparative example is around double of the data volume in the selected page PG in the first embodiment.

Here, in the read operation, a data size of the read data is smaller than a data size possible to store in the selected page PG in some cases. In the read operation, the data stored in a plurality of pages need to be sequentially read in some cases.

In this case, in the comparative example, the data in one selected page PG is read by one-time read operation. Therefore, for example, to read eight pieces of data, the read operation needs to be performed eight times.

On the other hand, in the first embodiment, the data in the two selected pages PG can be read by one time read operation. Accordingly, for example, to sequentially read eight pieces of data, the count of performing the read operation can be reduced to seven times or less in some cases.

For example, at least two pieces of data among the eight pieces of data are stored in the same memory block BLK in some cases. One of the two pieces of data is stored in any of the string unit SUa to the string unit SUe in some cases. The other data among the two pieces of data is stored in any of the string unit SUf to the string unit SUj in some cases. In such a case, the count of performing the read operation can be reduced to seven times or less.

Therefore, according to the first embodiment, the semiconductor memory device that operates at high speed can be provided.

Second Embodiment

Figure 25:
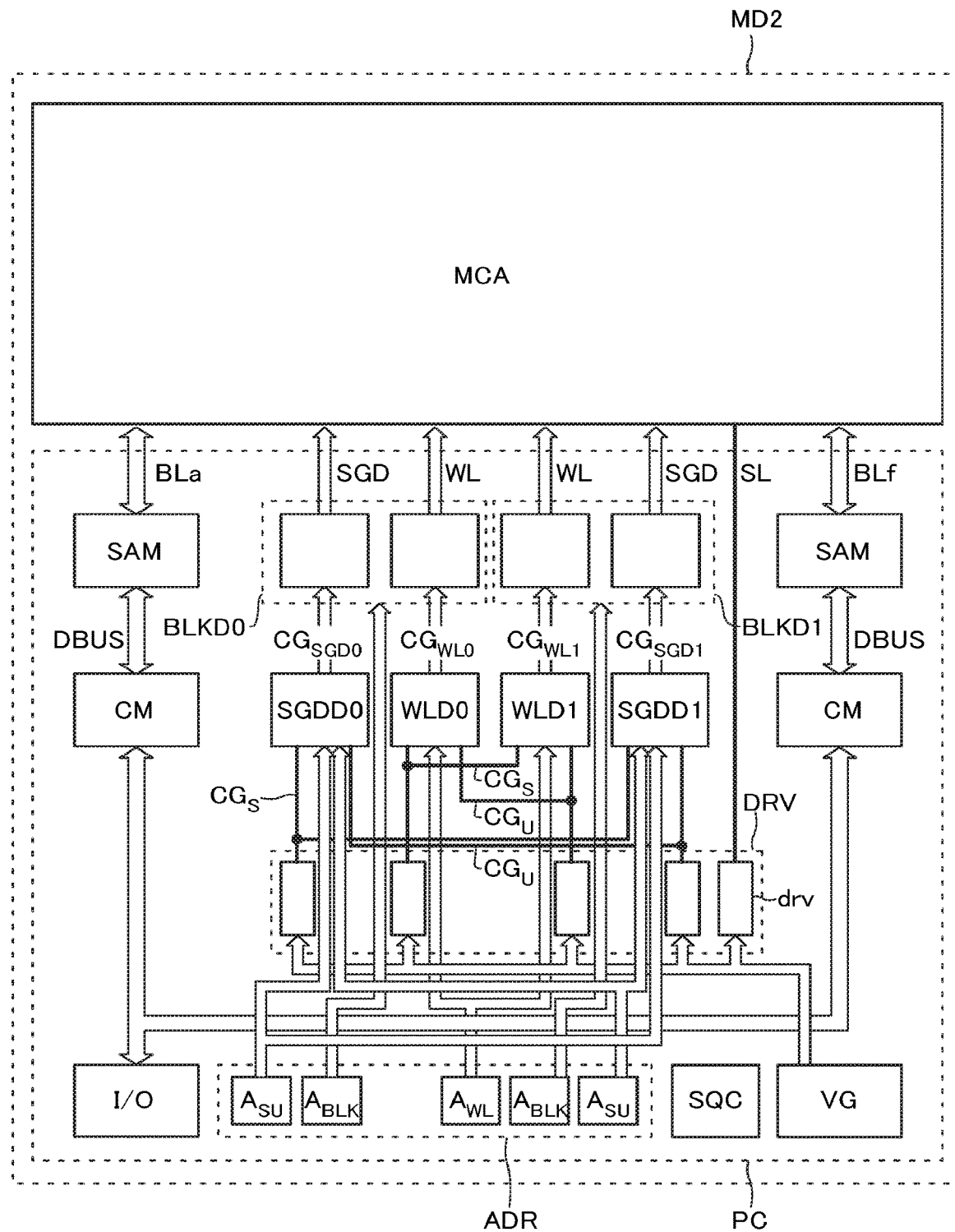
FIG. 25 is a schematic block diagram illustrating a configuration of a memory die MD2 according to a second embodiment.
Figure 26:
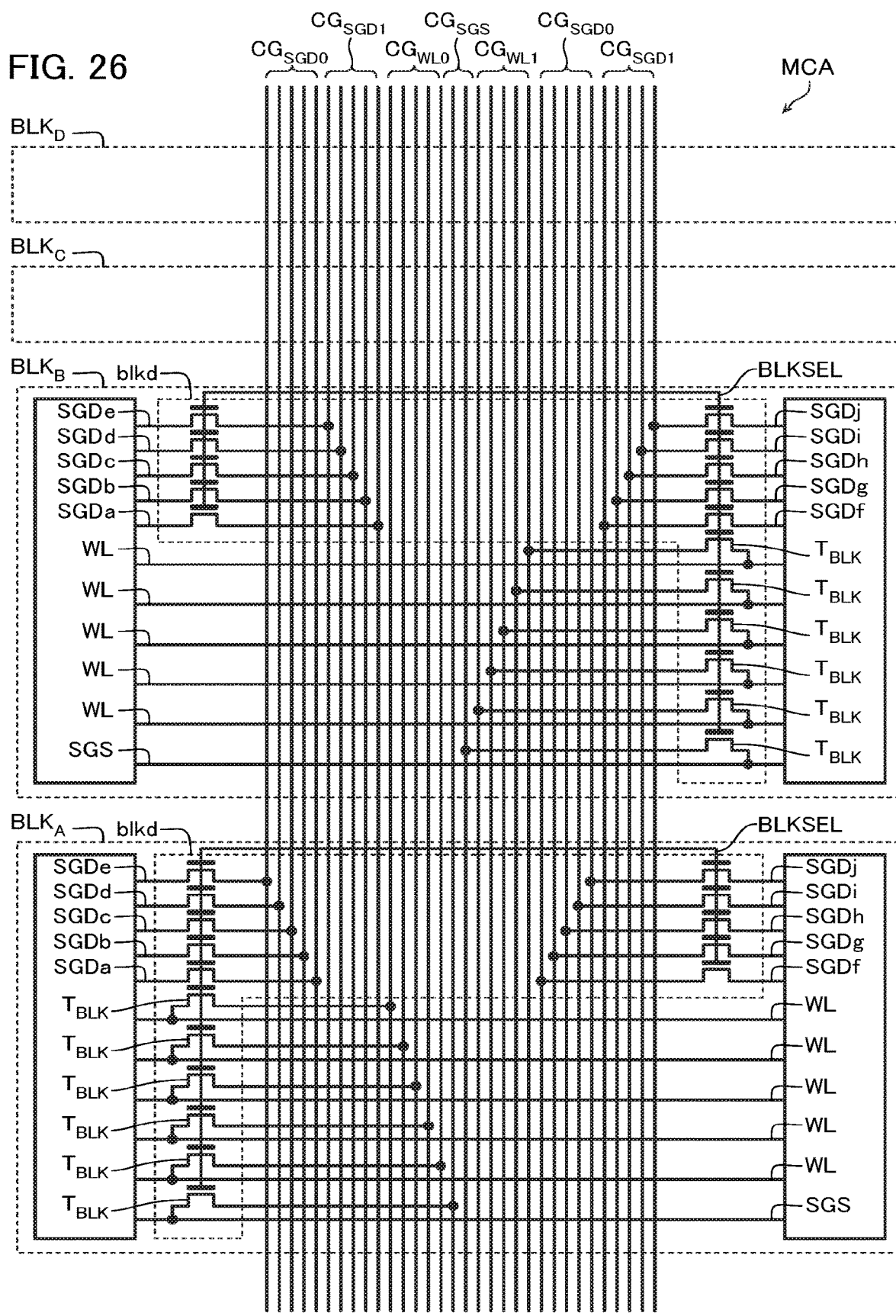
FIG. 26 is a schematic circuit diagram illustrating a part of the configuration of the memory die MD2.

Next, with reference to FIG. 25 and FIG. 26, a memory die MD2 according to the second embodiment will be described. FIG. 25 is a schematic block diagram illustrating a configuration of the memory die MD2 according to the second embodiment. FIG. 26 is a schematic circuit diagram illustrating a part of the configuration of the memory die MD2.

As illustrated in FIG. 25 and FIG. 26, the memory die MD2 according to the second embodiment is configured basically similarly to the memory die MD according to the first embodiment.

However, as described with reference to FIG. 2 and the like, the memory die MD according to the first embodiment includes the wirings $CG_{WL}$ and the wirings $CG_{SGD}$. The respective wirings $CG_{WL}$ and wirings $CG_{SGD}$ are connected to all of the block decode units blkd, and electrically connected to the word lines WL or the drain-side select gate lines SGD included in all of the memory blocks BLK.

Meanwhile, as illustrated in FIG. 26, the memory die MD2 according to the second embodiment includes wirings $CG_{WL0}$, $CG_{WL1}$ and wirings $CG_{SGD0}$, $CG_{SGD1}$ instead of the wirings $CG_{WL}$ and the wirings $CG_{SGD}$. For example, as illustrated in FIG. 15, the memory die MD2 according to the second embodiment also includes the transistors $T_{BLK}$ corresponding to the memory block BLKa in the region at one side in the X-direction (for example, the X-direction negative side in FIG. 15) in the second hook-up region $R_{HU2}$ in the transistor layer $L_{TR}$. The transistors $T_{BLK}$ corresponding to the memory block BLKf are disposed in the region at the other side in the X-direction (for example, the X-direction positive side in FIG. 15) in the second hook-up region $R_{HU2}$. The wirings $CG_{WL0}$, $CG_{SGD0}$ according to this embodiment are connected to the plurality of transistors $T_{BLK}$ disposed in a region at one side in the X-direction (for example, the X-direction negative side in FIG. 15), and are electrically connected to the word lines WL or the drain-side select gate lines SGD included in the memory block BLKa. The wirings $CG_{WL1}$, $CG_{SGD1}$ according to this embodiment are connected to the plurality of transistors $T_{BLK}$ disposed in a region at the other side in the X-direction (for example, the X-direction positive side in FIG. 15) and electrically connected to the word lines WL or the drain-side select gate lines SGD included in the memory block BLKf.

As illustrated in FIG. 25, the memory die MD2 according to the second embodiment does not include the block decoder BLKD, the word line decoder WLD, or the drain-side select gate line decoders SGDD according to the first embodiment. Instead of them, the memory die MD2 according to the second embodiment includes block decoders BLKD0, BLKD1, word line decoders WLD0, WLD1, and drain-side select gate line decoders SGDD0, SGDD1.

The block decoders BLKD0, BLKD1 are configured basically similarly to the block decoder BLKD according to the first embodiment. However, the configuration in the block decoder BLKD0 is connected to not the word lines WL or the drain-side select gate lines SGD corresponding to all of the memory blocks BLK but the word lines WL and the drain-side select gate lines SGD corresponding to the memory blocks BLKa. Instead of the wiring $CG_{WL}$ and the wiring $CG_{SGD}$, the configuration in the block decoder BLKD0 is connected to the wiring $CG_{WL0}$ and the wiring $CG_{SGD0}$. Additionally, the configuration in the block decoder BLKD1 is connected to, not the word lines WL or the drain-side select gate lines SGD corresponding to all of the memory blocks BLK, but the word lines WL and the drain-side select gate lines SGD corresponding to the memory blocks BLKf. Instead of the wiring $CG_{WL}$ and the wiring $CG_{SGD}$, the configuration in the block decoder BLKD1 is connected to the wiring $CG_{WL1}$ and the wiring $CG_{SGD1}$.

The address register ADR according to this embodiment is configured to simultaneously latch at least the two block addresses $A_{BLK}$. One block address $A_{BLK}$ corresponds to one of the memory blocks BLKa. The block decoder BLKD0 is configured to select one of the memory blocks BLKa according to this block address $A_{BLK}$. The other block address $A_{BLK}$ corresponds to one of the memory blocks BLKf. The block decoder BLKD1 is configured to select one of the memory blocks BLKf according to this block address $A_{BLK}$.

The word line decoders WLD0, WLD1 are configured basically similarly to the word line decoder WLD according to the first embodiment. However, the respective configurations in the word line decoder WLD0 are connected to the wiring $CG_{WL0}$, instead of the wiring $CG_{WL}$. Additionally, the respective configurations in the word line decoder WLD1 are connected to the wiring $CG_{WL1}$, instead of the wiring $CG_{WL}$.

In the example of FIG. 25, the address register ADR is configured to latch at least one word line address $A_{WL}$. The word line decoders WLD0, WLD1 are configured to select one of the plurality of word lines WL corresponding to the respective memory blocks BLK according to this word line address $A_{WL}$. Therefore, the word lines WL disposed at the same height position are selected in the memory block BLK corresponding to the word line decoder WLD0 and the memory block BLK corresponding to the word line decoder WLD1.

In the example of FIG. 25, the wiring $CG_S$ corresponding to the word line decoder WLD0 and the wiring $CG_S$ corresponding to the word line decoder WLD1 are connected to the common driver unit drv (see FIG. 4). In the example of FIG. 25, the wiring $CG_U$ corresponding to the word line decoder WLD0 and the wiring $CG_U$ corresponding to the word line decoder WLD1 are connected to the common driver unit drv (see FIG. 4). Therefore, the same voltage is supplied to the selected word line WL selected by the block decoder BLKD0 and the word line decoder WLD0 and the selected word line WL selected by the block decoder BLKD1 and the word line decoder WLD1. Similarly, the same voltage is supplied to the unselected word lines WL corresponding to them.

The drain-side select gate line decoders SGDD0, SGDD1 each include a configuration of selecting one of the drain-side select gate line SGDa to the drain-side select gate line SGDe and a configuration of selecting one of the drain-side select gate line SGDf to the drain-side select gate line SGDj. These configurations are each configured similarly to the drain-side select gate line decoder SGDD according to the first embodiment. The respective configurations in the drain-side select gate line decoder SGDD0 are connected to the wiring $CG_{SGD0}$, instead of the wiring $CG_{SGD}$. The respective configurations in the drain-side select gate line decoder SGDD1 are connected to the wiring $CG_{SGD1}$, instead of the wiring $CG_{SGD}$.

The address register ADR according to this embodiment is configured to simultaneously latch at least two string addresses $A_{SU}$. One string address $A_{SU}$ corresponds to one of the string unit SUa to the string unit SUe. The drain-side select gate line decoders SGDD0, SGDD1 are configured to select one of the plurality of drain-side select gate line SGDa to drain-side select gate line SGDe according to this string address $A_{SU}$. The other string address $A_{SU}$ corresponds to one of the string unit SUf to the string unit SUj. The drain-side select gate line decoders SGDD0, SGDD1 are configured to select one of the plurality of drain-side select gate line SGDf to drain-side select gate line SGDj according to this string address $A_{SU}$.

In the example of FIG. 25, the wiring $CG_S$ corresponding to the drain-side select gate line decoder SGDD0 and the wiring $CG_S$ corresponding to the drain-side select gate line decoder SGDD1 are connected to the common driver unit drv (see FIG. 4). In the example of FIG. 25, the wiring $CG_U$ corresponding to the drain-side select gate line decoder SGDD0 and the wiring $CG_U$ corresponding to the drain-side select gate line decoder SGDD1 are connected to the common driver unit drv (see FIG. 4). Therefore, the same voltage is supplied to the selected drain-side select gate line SGD selected by the drain-side select gate line decoder SGDD0 and the selected drain-side select gate line SGD selected by the drain-side select gate line decoder SGDD1. Similarly, the same voltage is supplied to the unselected drain-side select gate lines SGD corresponding to them.

[Read Operation]

Next, the read operation of the semiconductor memory device according to this embodiment will be described.

The semiconductor memory device according to the second embodiment can perform the read operations performable in the semiconductor memory device according to the first embodiment.

The semiconductor memory device according to the second embodiment can simultaneously perform the read operation on one selected page PG included in one of the memory blocks BLKa and one selected page PG included in one of the memory blocks BLKf. In this case, the selected page PG included in one of the string unit SUa to the string unit SUe and the string unit SUf to the string unit SUj in the memory block BLKa is selected. In the memory block BLKf, the selected page PG included in the other of the string unit SUa to string unit SUe and string unit SUf to string unit SUj is selected.

Figure 27:
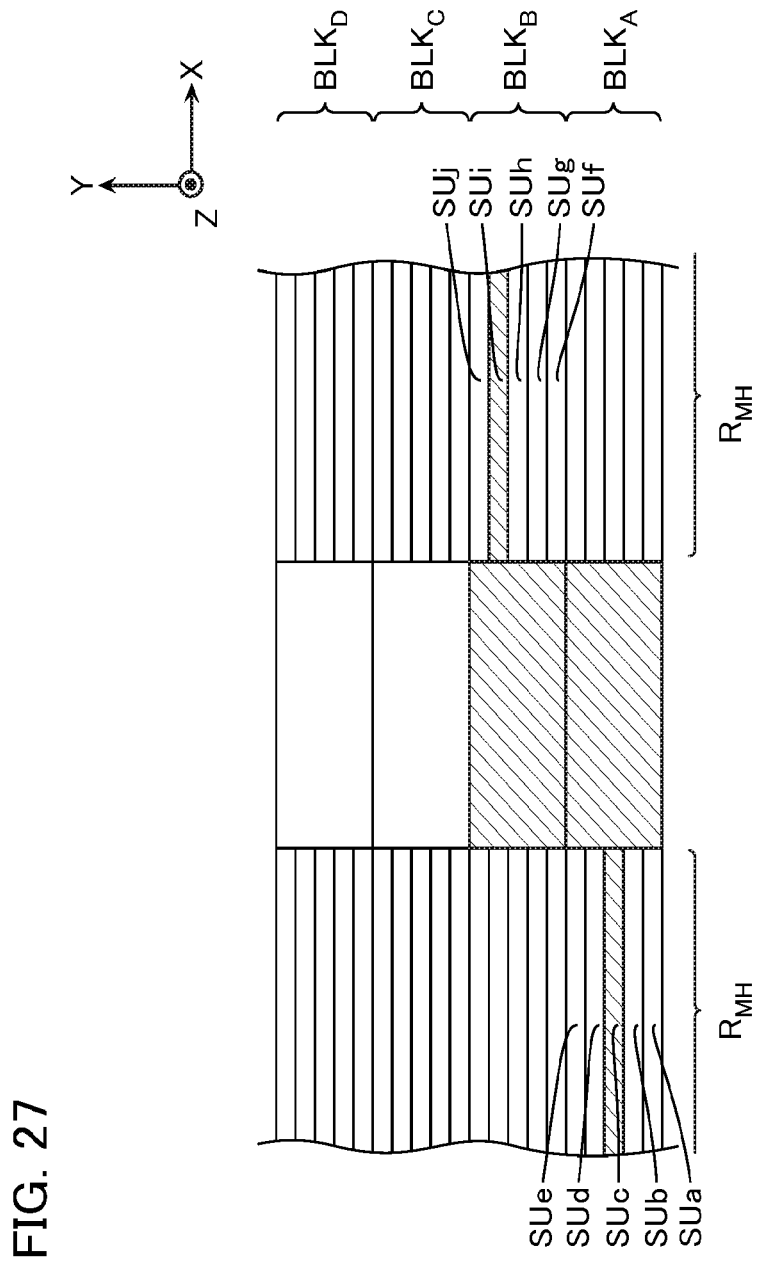
FIG. 27 is a schematic plan view for describing a read operation performable in the memory die MD2.
Figure 28:
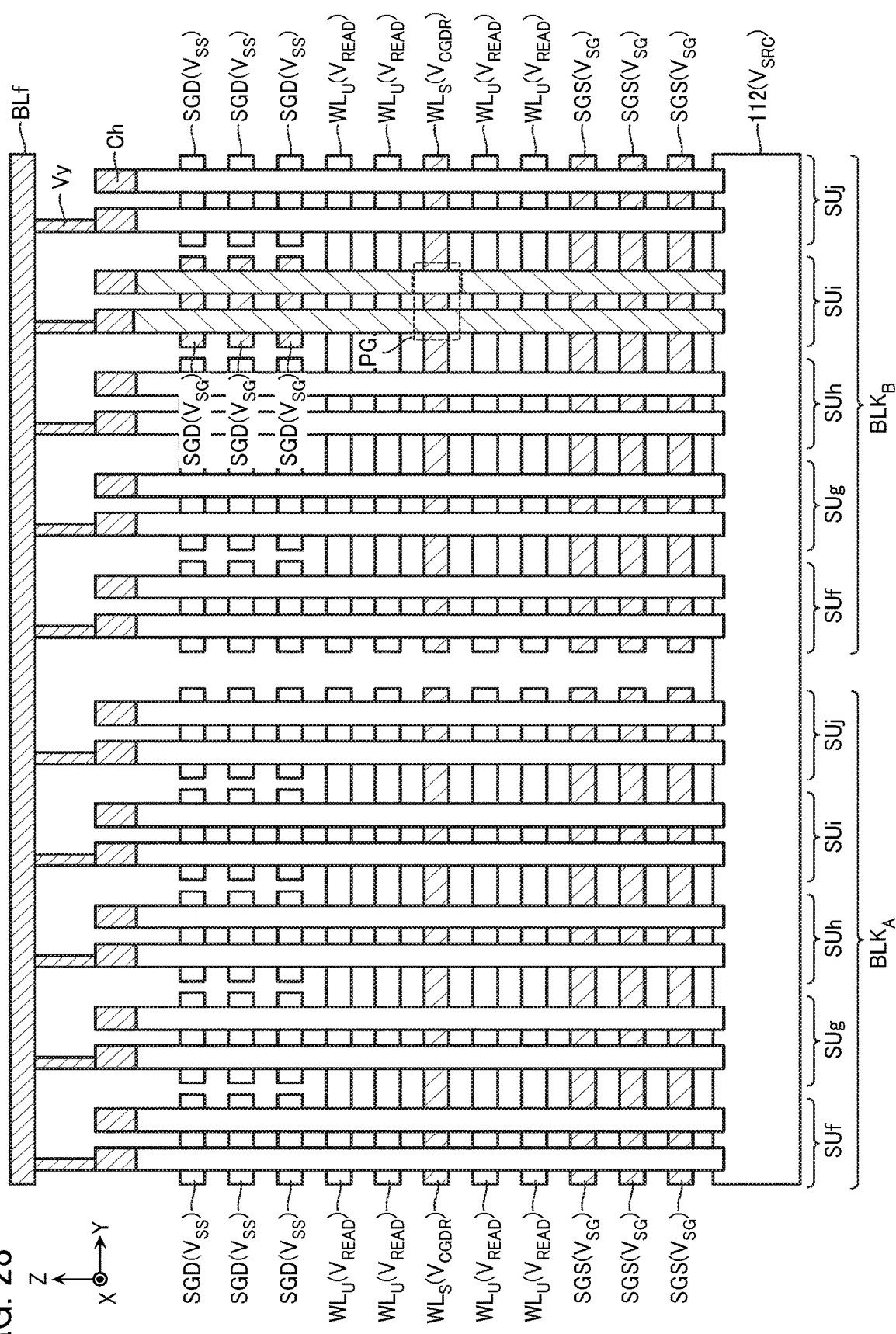
FIG. 28 is a schematic cross-sectional view for describing the read operation.

For example, in the example of FIG. 27 and FIG. 28, the memory block $BLK_A$ is selected as one of the memory blocks BLKa and the memory block $BLK_B$ is selected as one of the memory blocks BLKf. The selected page PG in the string unit SUc in the memory block $BLK_A$ is selected, and the selected page PG in the string unit SUi in the memory block $BLK_B$ is selected.

In performing the read operation, the command set is input from the controller die (not illustrated) to the memory die MD2.

In performing the read operation, for example, one command set and another command set may be input to the memory die MD2. In this case, one command set may include one string address $A_{SU}$ (FIG. 25) and one block address $A_{BLK}$ (FIG. 25). Another command set may include another string address $A_{SU}$ (FIG. 25) and another block address $A_{BLK}$ (FIG. 25). In this case, another command set may include data other than the string address $A_{SU}$ or the block address $A_{BLK}$ or need not include the data. Another command set may include data that designates the memory cell array region $R_{MCA}$ (FIG. 8), the word line address $A_{WL}$ (FIG. 25), data that designates the low-order bit, the middle-order bit, or the high-order bit, and the like. In this case, the data may match the data included in the one command set.

In performing the read operation, for example, one command set may be input to the memory die MD2. This command set may include, for example, one string address $A_{SU}$ (FIG. 25) and one block address $A_{BLK}$ (FIG. 25). This command set, for example, may include another string address $A_{SU}$ (FIG. 25) and another block address $A_{BLK}$ (FIG. 25).

[Effects of Second Embodiment]

The semiconductor memory device according to the second embodiment can read the data in the two selected pages PG corresponding to the two memory blocks BLK by one-time read operation. Therefore, when a plurality of pieces of data are sequentially read, the number of combinations of the two selected pages PG that can be simultaneously read becomes larger than that of the first embodiment. Accordingly, when a plurality of pieces of data are sequentially read, the semiconductor memory device according to the second embodiment operates at a speed further higher than that of the semiconductor memory device according to the first embodiment in some cases.

Third Embodiment

Figure 29:
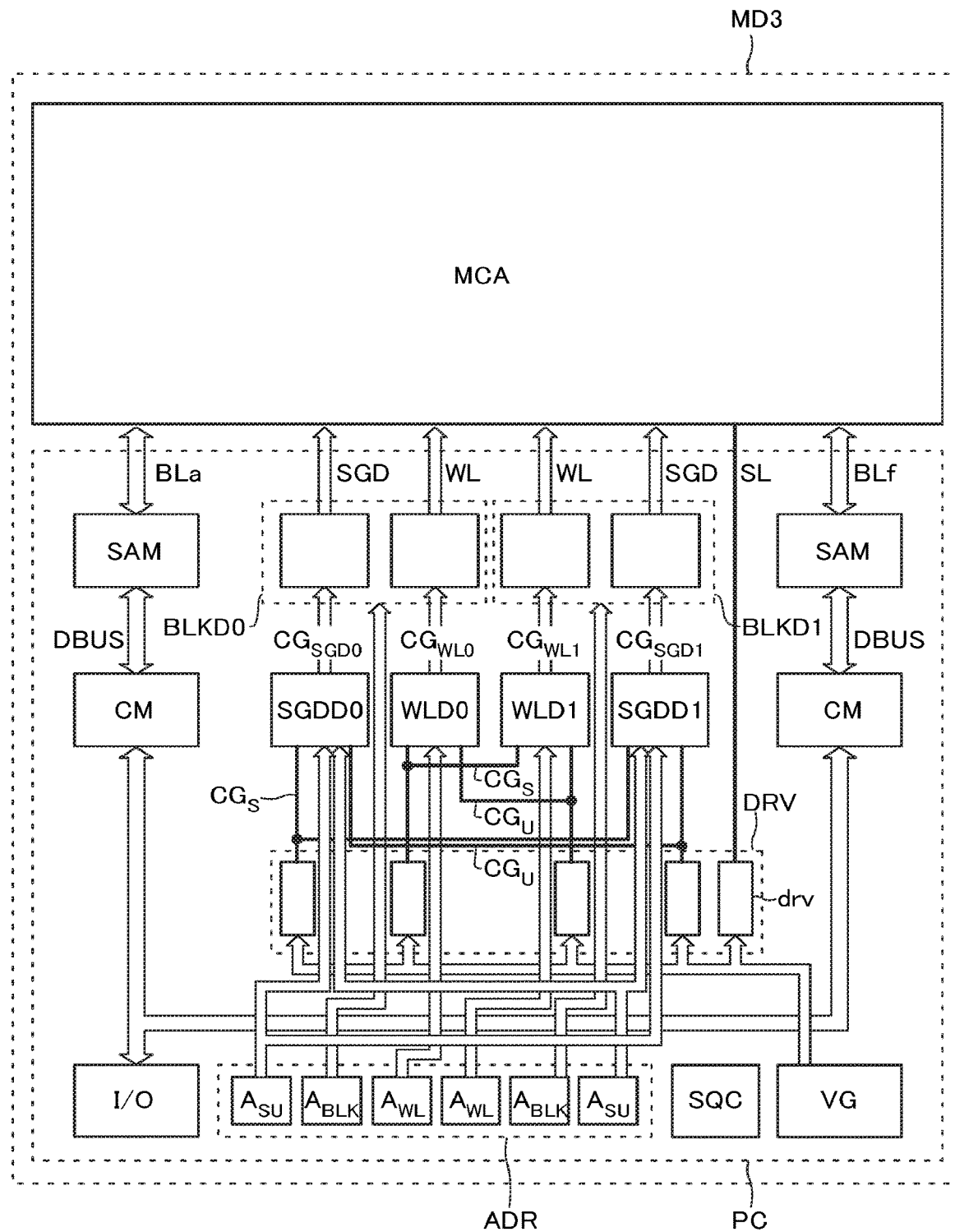
FIG. 29 is a schematic block diagram illustrating a configuration of a memory die MD3 according to a third embodiment.

Next, with reference to FIG. 29, a memory die MD3 according to the third embodiment will be described. FIG. 29 is a schematic block diagram illustrating a configuration of the memory die MD3 according to the third embodiment.

As illustrated in FIG. 29, the memory die MD3 according to the third embodiment is configured basically similarly to the memory die MD2 according to the second embodiment.

However, as described with reference to FIG. 25 and the like, in the memory die MD2 according to the second embodiment, the address register ADR is configured to latch at least one word line address $A_{WL}$. The word line decoders WLD0, WLD1 are configured to select one of the plurality of word lines WL corresponding to the respective memory blocks BLK according to this word line address $A_{WL}$.

On the other hand, the address register ADR according to this embodiment is configured to simultaneously latch at least the two word line addresses $A_{WL}$. One word line address $A_{WL}$ corresponds to the memory block BLKa. The word line decoder WLD0 is configured to select one of the plurality of word lines WL corresponding to any of the memory blocks BLKa according to this word line address $A_{WL}$. The other word line address $A_{WL}$ corresponds to the memory block BLKf. The word line decoder WLD1 is configured to select one of the plurality of word lines WL corresponding to any of the memory blocks BLKf according to this word line address $A_{WL}$.

[Read Operation]

Next, the read operation of the semiconductor memory device according to this embodiment will be described.

The semiconductor memory device according to the third embodiment can perform the read operations performable in the semiconductor memory devices according to the first embodiment and the second embodiment.

Figure 30:
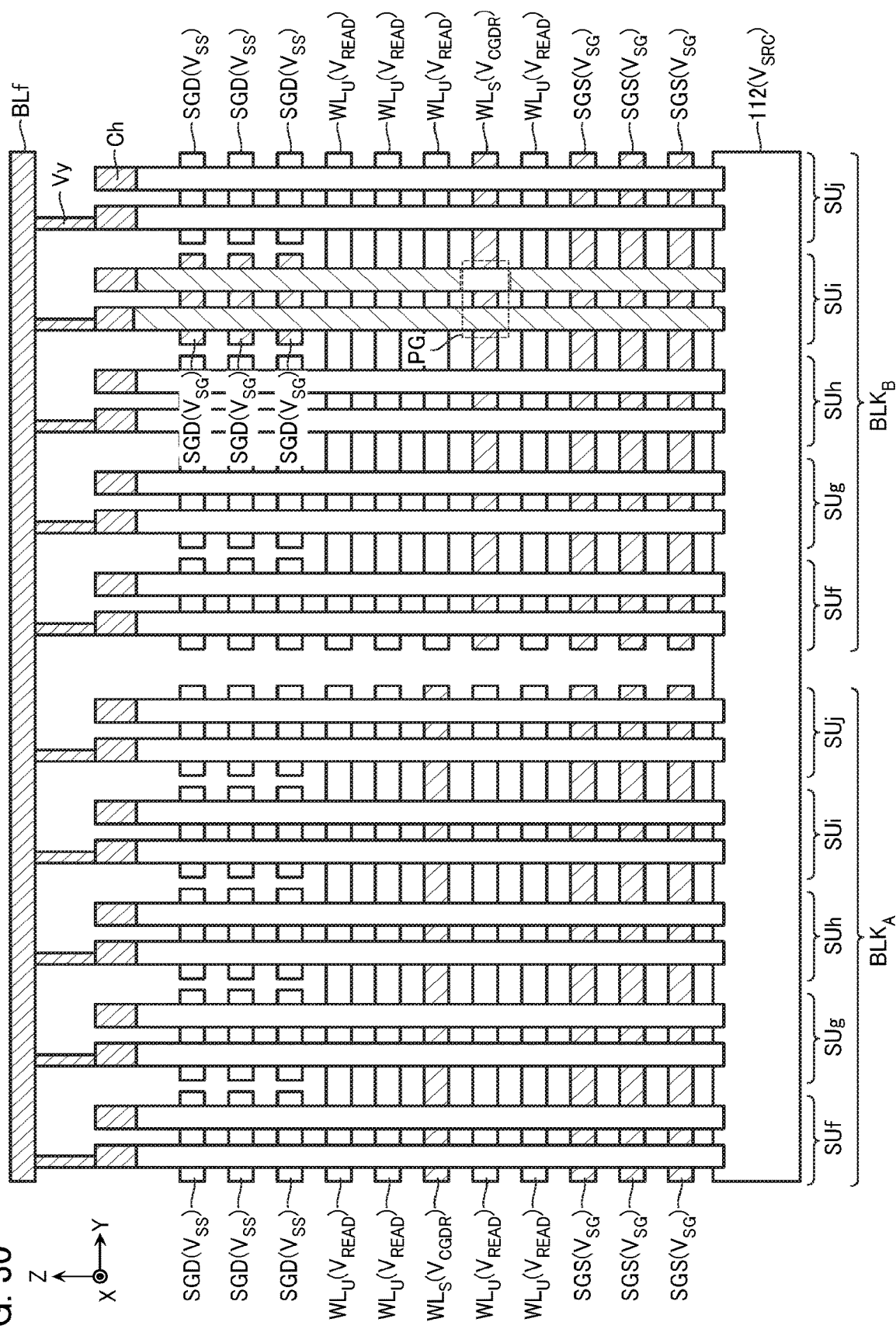
FIG. 30 is a schematic cross-sectional view for describing a read operation performable in the memory die MD3.

In the semiconductor memory device according to the third embodiment, the word lines WL disposed at different height positions in the memory block BLKa and the memory block BLKf can be selected. For example, as illustrated in FIG. 27 as an example, assume a case where the read operation is simultaneously performed on the two memory blocks $BLK_A$, $BLK_B$. In this case, as illustrated in FIG. 30, the word line WL corresponding to the third conductive layer 110 counted from the lower side can be selected in one memory block $BLK_A$ and the word line WL corresponding to the second conductive layer 110 counted from the lower side can be selected in the other memory block $BLK_B$.

In performing the read operation, the command set is input from the controller die (not illustrated) to the memory die MD3.

In performing the read operation, for example, one command set and another command set may be input to the memory die MD3. In this case, one command set may include one string address $A_{SU}$ (FIG. 29), one block address $A_{BLK}$ (FIG. 29), and one word line address $A_{WL}$ (FIG. 29). Another command set may include another string address $A_{SU}$ (FIG. 29), another block address $A_{BLK}$ (FIG. 29), and another word line address $A_{WL}$ (FIG. 29). In this case, another command set may include data other than the string address $A_{SU}$, the block address $A_{BLK}$, or the word line address $A_{WL}$ or need not include the data. Another command set may include data that designates the memory cell array region $R_{MCA}$ (FIG. 8), data that designates the low-order bit, the middle-order bit, or the high-order bit, and the like. In this case, the data may match the data included in the one command set.

In performing the read operation, for example, one command set may be input to the memory die MD3. This command set may include, for example, one string address $A_{SU}$ (FIG. 29), one block address $A_{BLK}$ (FIG. 29), and one word line address $A_{WL}$ (FIG. 29). This command set, for example, may include another string address $A_{SU}$ (FIG. 29), another block address $A_{BLK}$ (FIG. 29), and another word line address $A_{WL}$ (FIG. 29).

[Effects of Third Embodiment]

The semiconductor memory device according to the third embodiment can read the data in the two selected pages PG corresponding to the two word lines WL at the different height positions by the one-time read operation. Therefore, when a plurality of pieces of data are sequentially read, a combination of the two selected pages PG that can be simultaneously read becomes larger than that of the second embodiment. Accordingly, when a plurality of pieces of data are sequentially read, the semiconductor memory device according to the third embodiment operates at a speed further higher than that of the semiconductor memory device according to the second embodiment in some cases.

Fourth Embodiment

Figure 31:
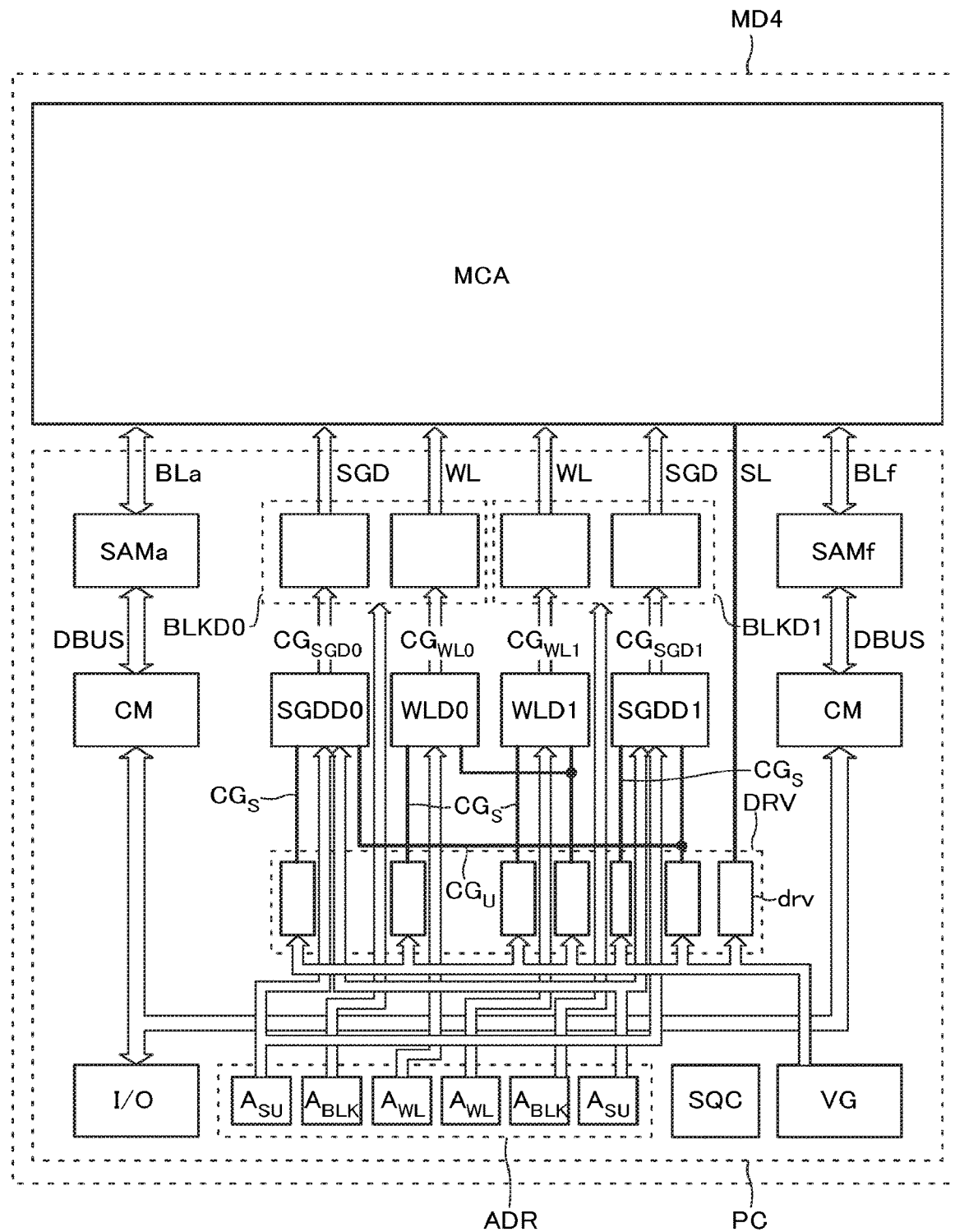
FIG. 31 is a schematic block diagram illustrating a configuration of a memory die MD4 according to a fourth embodiment.

Next, with reference to FIG. 31 and FIG. 32, a memory die MD4 according to the fourth embodiment will be described. FIG. 31 is a schematic block diagram illustrating a configuration of the memory die MD4 according to the fourth embodiment. FIG. 32 is a schematic circuit diagram illustrating a part of the configuration of the memory die MD4.

As illustrated in FIG. 31 and FIG. 32, the memory die MD4 according to the fourth embodiment is configured basically similarly to the memory die MD3 according to the third embodiment.

However, as described with reference to FIG. 29 and the like, in the memory die MD3 according to the third embodiment, the wiring $CG_S$ corresponding to the word line decoder WLD0 and the wiring $CG_S$ corresponding to the word line decoder WLD1 are connected to the common driver unit drv (see FIG. 4). Meanwhile, as illustrated in FIG. 31, in the memory die MD4 according to the fourth embodiment, the wiring $CG_S$ corresponding to the word line decoder WLD0 and the wiring $CG_S$ corresponding to the word line decoder WLD1 are connected to the different driver units drv (see FIG. 4). Accordingly, in this embodiment, different voltages can be supplied to the selected word line WL selected by the block decoder BLKD0 and the word line decoder WLD0 and the selected word line WL selected by the block decoder BLKD1 and the word line decoder WLD1.

As described with reference to FIG. 29 and the like, in the memory die MD3 according to the third embodiment, the two wirings $CG_S$ corresponding to the drain-side select gate line decoders SGDD0, SGDD1 are connected to the common driver unit drv (see FIG. 4). Meanwhile, as illustrated in FIG. 31, in the memory die MD4 according to the fourth embodiment, the two wirings $CG_S$ corresponding to the drain-side select gate line decoders SGDD0, SGDD1 are connected to the different driver units drv (see FIG. 4). Therefore, in this embodiment, different voltages can be supplied to the selected drain-side select gate line SGD selected by the drain-side select gate line decoder SGDD0 and the selected drain-side select gate line SGD selected by the drain-side select gate line decoder SGDD1.

As illustrated in FIG. 31, the memory die MD4 according to the fourth embodiment includes sense amplifier modules SAMa, SAMf, instead of the sense amplifier modules SAM according to the first embodiment. The sense amplifier module SAMa is connected to the plurality of bit lines BLa. The sense amplifier module SAMf is connected to the plurality of bit lines BLf.

The sense amplifier modules SAMa, SAMf are configured basically similarly to the sense amplifier modules SAM according to the first embodiment.

However, as described with reference to FIG. 6, in the first embodiment, the respective signal lines STB, HLL, XXL, BLX, BLC, BLS are connected in common among all of the sense amplifier units SAU included in the sense amplifier module SAM. Additionally, the respective signal line STI and the signal line STL in the latch circuit SDL and signal lines TI0 to TIn$_L$ and TL0 to TLn$_L$ in the latch circuits DL0 to DLn$_L$ are connected in common among all of the sense amplifier units SAU included in the sense amplifier module SAM.

Meanwhile, as illustrated in FIG. 32, in the fourth embodiment, the signal lines STB, HLL, XXL, BLX, BLC, BLS are electrically independent between the sense amplifier modules SAMa, SAMf. Additionally, the signal line STI and the signal line STL in the latch circuit SDL and the signal lines TI0 to TIn$_L$ and TL0 to TLn$_L$ in the latch circuits DL0 to DLn$_L$ are electrically independent between the sense amplifier modules SAMa, SAMf.

[Read Operation]

Next, the read operation of the semiconductor memory device according to this embodiment will be described.

The semiconductor memory device according to the fourth embodiment can perform the read operations performable in the semiconductor memory devices according to the first embodiment to the third embodiment.

In the semiconductor memory device according to the fourth embodiment, different voltages can be supplied to the word line WL included in the memory block BLKa and the word line WL included in the memory block BLKf. Therefore, for example, as illustrated in FIG. 27, FIG. 28, or FIG. 30 as an example, when the two selected pages PG target for read operation belong to the different memory blocks BLK, read operations of the data corresponding to the different voltages are simultaneously performable. For example, the data of low-order bit (see FIG. 16B) can be read in one selected page PG and the data of middle-order bit (see FIG. 16B) can be read in the other selected page PG.

Figure 33:
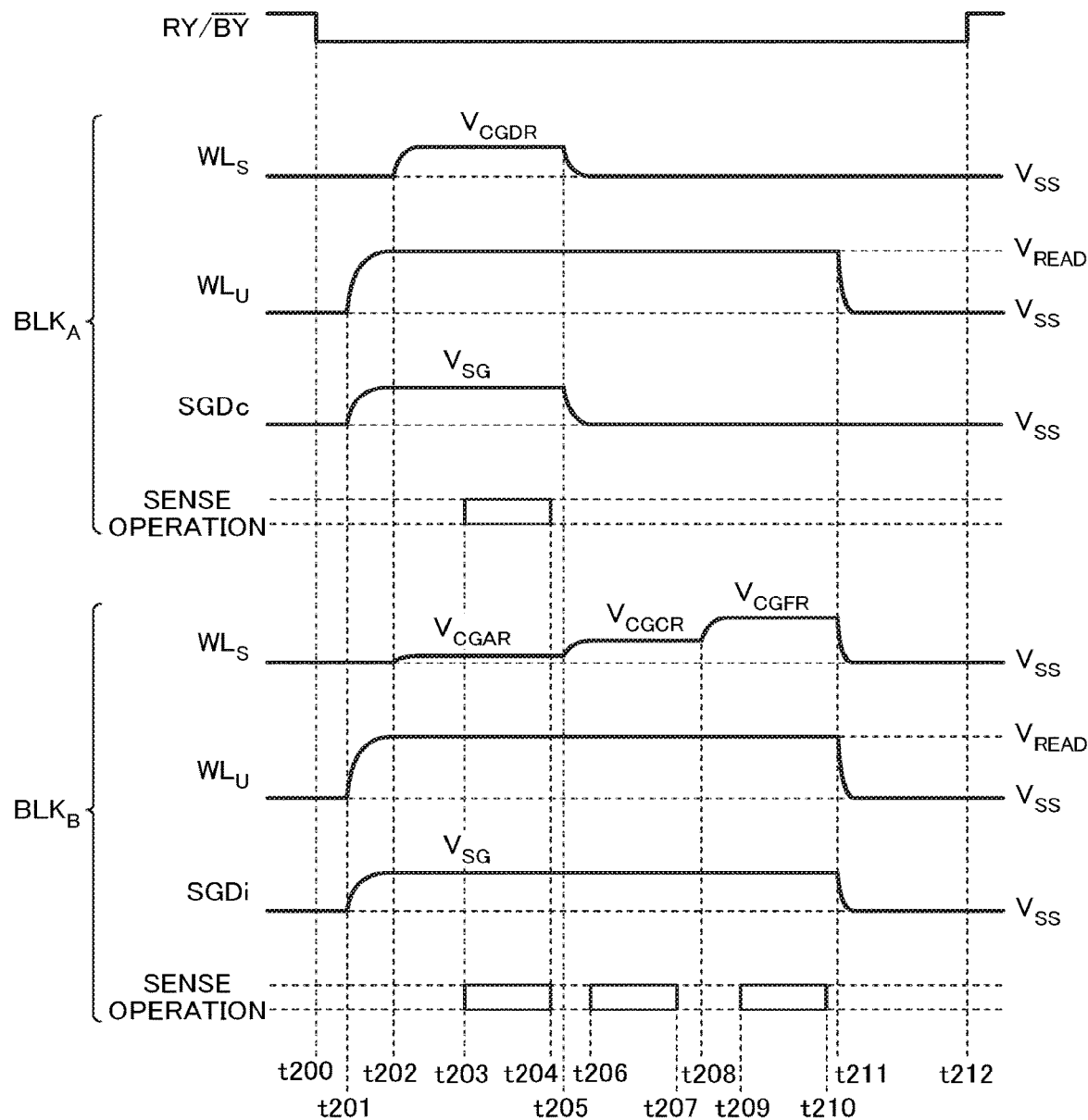
FIG. 33 is a schematic waveform diagram for describing a read operation performable in the memory die MD4.

For example, in the example of FIG. 33, the data of low-order bit in the selected page PG in the string unit SUc in the memory block BLK$_A$ and the data of middle-order bit in the selected page PG in the string unit SUi in the memory block BLK$_B$ are simultaneously read.

In the example of FIG. 33, operations at timing t200 to timing t205 of the configuration corresponding to the memory block BLK$_A$ are performed similarly to the operations at the timing t100 to the timing t105 described with reference to FIG. 17. In the example of FIG. 33, operations at the timing t200 to timing t212 of the configuration corresponding to the memory block BLK$_B$ are performed similarly to the operations at the timing t120 to the timing t132 described with reference to FIG. 21.

Similarly to the first embodiment, in the read operation of the low-order bit, data read between the timing t203 to the timing t204 is the data stored in the selected memory cell MC. In the read operation of the middle-order bit or the high-order bit, an arithmetic operation, such as exclusive OR, is performed on three pieces of data read by three-time sense operation, and thus, the data stored in the selected memory cell MC is calculated. Therefore, for example, in the read operation in FIG. 33, the arithmetic operation by the sense amplifier module SAMa (FIG. 32) is not performed but the arithmetic operation, such as exclusive OR, by the sense amplifier module SAMf (FIG. 32) is performed. In this respect, different signals are supplied to the respective signal lines corresponding to the sense amplifier module SAMa (FIG. 32) and the respective signal lines corresponding to the sense amplifier module SAMf (FIG. 32).

In the example of FIG. 33, a voltage of the unselected word line WL$_U$ corresponding to the read operation of the low-order bit and a voltage of the unselected word line WL$_U$ corresponding to the read operation of the middle-order bit or the high-order bit rise at the same timing t201 and falls at the same timing t210. However, the operation method is only an example, and the specific operation method is appropriately adjustable. For example, the voltage of the unselected word line WL$_U$ corresponding to the read operation of the low-order bit may be fallen at the timing t205 and the voltage of the unselected word line WL$_U$ corresponding to the read operation of the middle-order bit or the high-order bit may be fallen at the timing t210. In this case, for example, the wiring CG$_U$ corresponding to the word line decoder WLD0 and the wiring CG$_U$ corresponding to the word line decoder WLD1 may be connected to the different driver units drv (see FIG. 4).

In the example of FIG. 31, the memory die MD4 includes the sense amplifier modules SAMa, SAMf, instead of the sense amplifier module SAM. However, in the example of FIG. 31, not the sense amplifier modules SAMa, SAMf, but the sense amplifier module SAM similarly to the first embodiment to the third embodiment can be disposed. In the case of using the configuration as well, the read operation of the low-order bit and the read operation of the middle-order bit or the high-order bit can be simultaneously performed. For example, the sense operation may be performed three times also in the memory block BLK where the read operation of the low-order bit is performed, similarly to the memory block BLK where the read operation of the middle-order bit or the high-order bit is performed. To employ the configuration and the operation, all of the data of low-order bit, middle-order bit, and high-order bit are preferably calculated by performing the same arithmetic operation on the three pieces of data acquired by the three-time sense operation. To do so, for example, the data corresponding to the Er state to the G state are preferably assigned (see FIG. 16B) so as to meet the condition.

In performing the read operation, the command set is input from the controller die (not illustrated) to the memory die MD4.

In performing the read operation, for example, one command set and another command set may be input to the memory die MD4. In this case, one command set may include one string address A$_{SU}$ (FIG. 31), one block address A$_{BLK}$ (FIG. 31), one word line address A$_{WL}$ (FIG. 31), and one piece of data that designates the low-order bit, the middle-order bit, or the high-order bit. Another command set may include another string address A$_{SU}$ (FIG. 31), another block address A$_{BLK}$ (FIG. 31), another word line address A$_{WL}$ (FIG. 31), and another piece of data that designates the low-order bit, the middle-order bit, or the high-order bit. In this case, another command set may include data other than the string address A$_{SU}$, the block address A$_{BLK}$, the word line address A$_{WL}$, or the data that designates the low-order bit, the middle-order bit, or the high-order bit or need not include the data. Another command set may include the data that designates the memory cell array region $R_{MCA}$ (FIG. 8). In this case, this data may match the data included in the one command set.

In performing the read operation, for example, one command set may be input to the memory die MD4. This command set, for example, may include one string address $A_{SU}$ (FIG. 31), one block address $A_{BLK}$ (FIG. 31), one word line address $A_{WL}$ (FIG. 31), and one piece of data that designates the low-order bit, the middle-order bit, or the high-order bit. Additionally, this command set may include, for example, another string address $A_{SU}$ (FIG. 31), another block address $A_{BLK}$ (FIG. 31), another word line address $A_{WL}$, and another piece of data that designates the low-order bit, the middle-order bit, or the high-order bit.

[Effects of Fourth Embodiment]

The semiconductor memory device according to the fourth embodiment can read two pieces of data corresponding to the different read voltages by one-time read operation. Therefore, when a plurality of pieces of data are sequentially read, a combination of the two selected pages PG that can be simultaneously read becomes larger than that of the third embodiment. Accordingly, when a plurality of pieces of data are sequentially read, the semiconductor memory device according to the fourth embodiment operates at a speed further higher than that of the semiconductor memory device according to the third embodiment in some cases.

Fifth Embodiment

Figure 34:
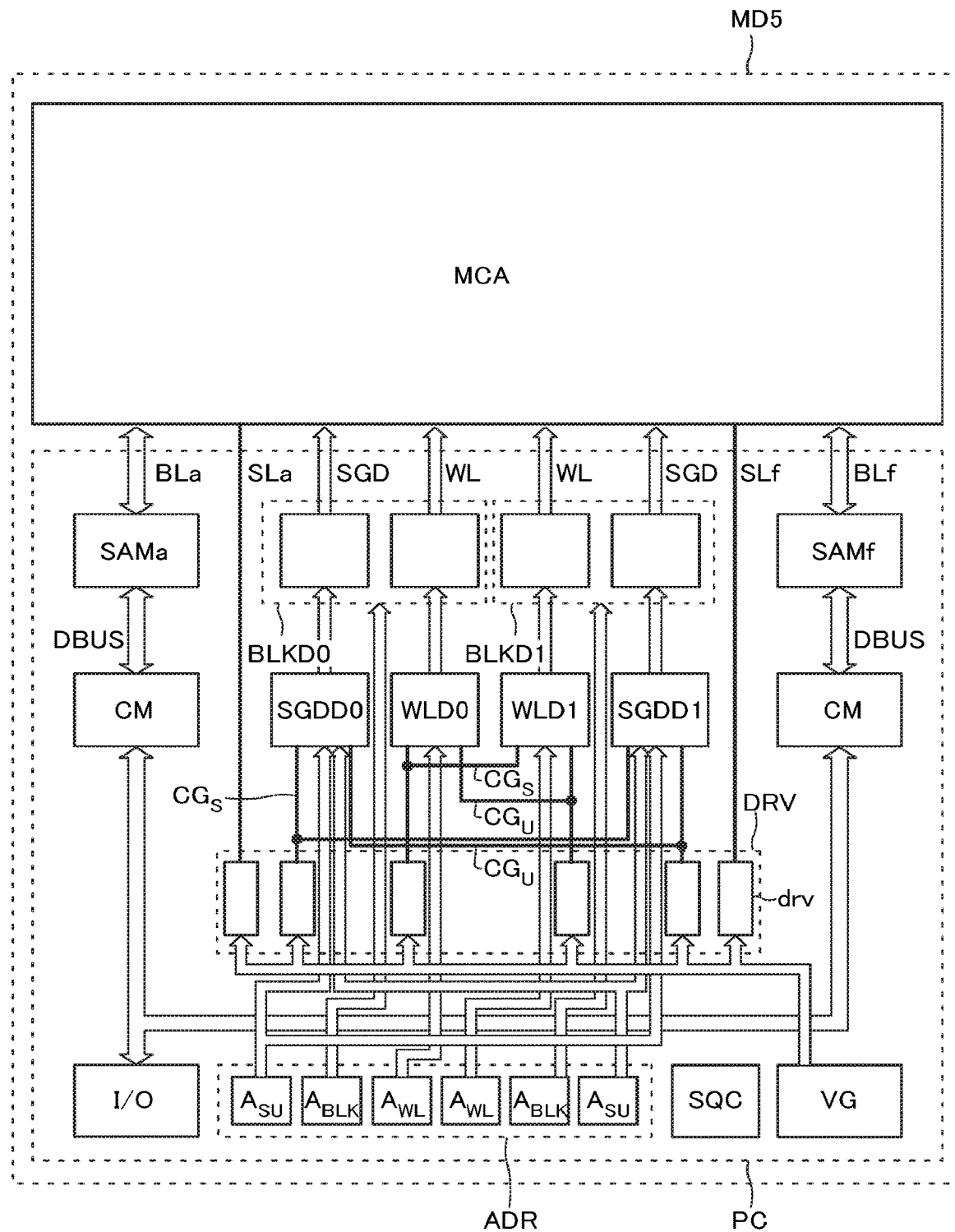
FIG. 34 is a schematic block diagram illustrating a configuration of a memory die MD5 according to a fifth embodiment.
Figure 35:
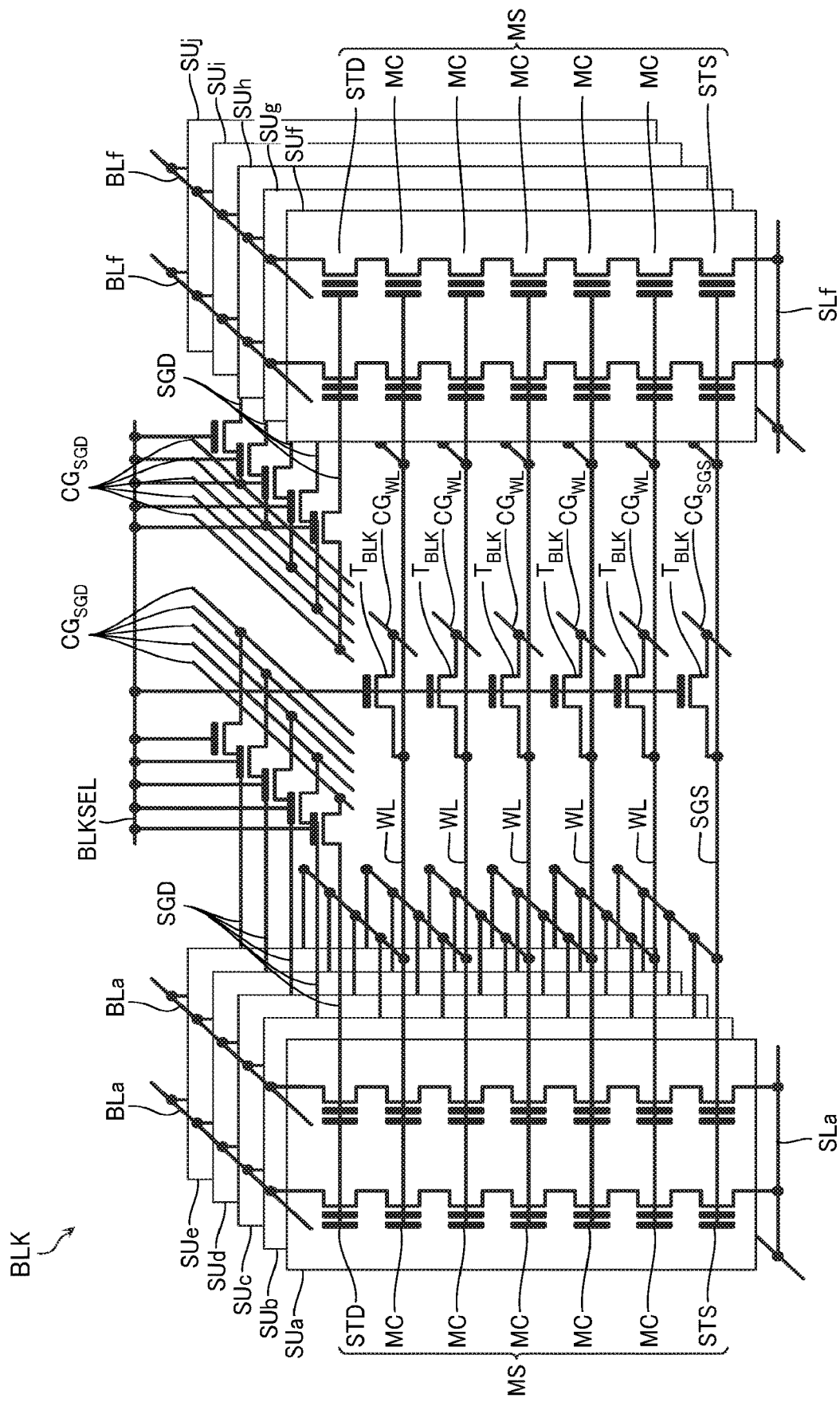
FIG. 35 is a schematic circuit diagram illustrating a part of the configuration of the memory die MD5.
Figure 36:
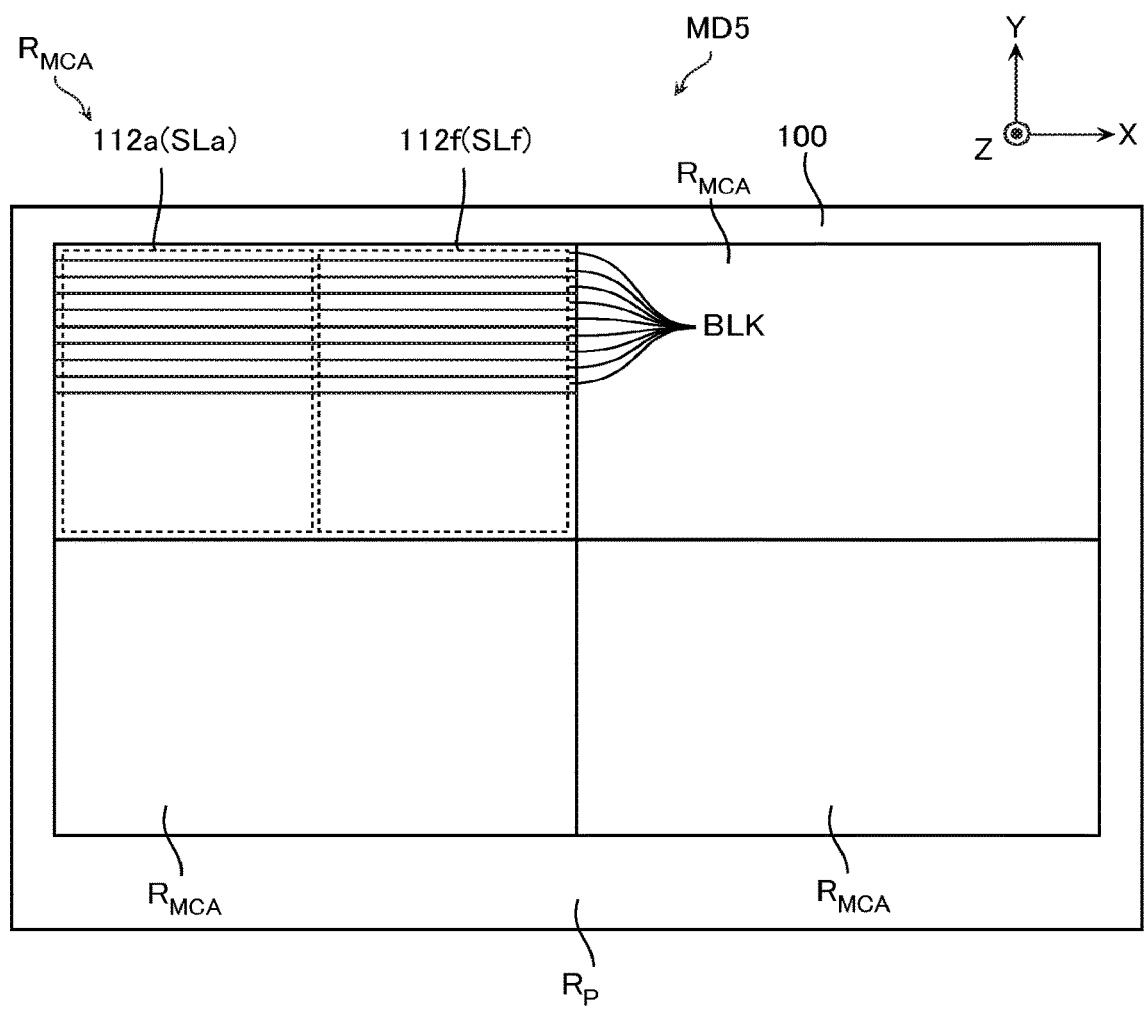
FIG. 36 is a schematic plan view illustrating a part of the configuration of the memory die MD5.

Next, with reference to FIG. 34 to FIG. 36, a memory die MD5 according to the fifth embodiment will be described. FIG. 34 is a schematic block diagram illustrating a configuration of the memory die MD5 according to the fifth embodiment. FIG. 35 is a schematic circuit diagram illustrating a part of a configuration of the memory die MD5. FIG. 36 is a schematic plan view illustrating a part of the configuration of the memory die MD5.

As illustrated in FIG. 34 to FIG. 36, the memory die MD5 according to the fifth embodiment is configured basically similarly to the memory die MD3 according to the third embodiment.

However, as illustrated in FIG. 34, the memory die MD5 according to the fifth embodiment includes the sense amplifier modules SAMa, SAMf according to the fourth embodiment, instead of the sense amplifier modules SAM according to the first embodiment.

Additionally, the memory die MD5 according to the fifth embodiment includes two conductive layers 112a, 112f (FIG. 36), instead of the conductive layer 112 described with reference to FIG. 9 and the like. The conductive layers 112a, 112f are configured basically similarly to the conductive layer 112. However, the conductive layer 112 is formed across the entire region of the memory cell array region $R_{MCA}$. On the other hand, the conductive layer 112a is formed in a region at one side in the X-direction (for example, the X-direction negative side in FIG. 36), and the conductive layer 112f is formed in a region at the other side in the X-direction (for example, the X-direction positive side in FIG. 36). Additionally, these two conductive layers 112a, 112f function as two source lines SLa, SLf electrically independent from one another.

As illustrated in FIG. 35, in this embodiment, respective one ends of the plurality of memory strings MS in the string unit SUa to the string unit SUe are connected to the peripheral circuit PC via the source lines SLa, instead of the source lines SL. Additionally, respective one ends of the plurality of memory strings MS in the string unit SUf to the string unit SUj are connected to the peripheral circuit PC via the source lines SLf, instead of the source lines SL.

As illustrated in FIG. 34, in this embodiment, the source line SLa and the source line SLf are connected to the different driver units drv (see FIG. 4). Therefore, in this embodiment, different voltages can be supplied to the source line SLa and the source line SLf.

[Read Operation]

Next, the read operation of the semiconductor memory device according to this embodiment will be described.

The semiconductor memory device according to the fifth embodiment can perform the read operations performable in the semiconductor memory devices according to the first embodiment to the third embodiment.

In the semiconductor memory device according to the fifth embodiment, different voltages can be supplied to the source line SLa and the source line SLf. Here, for example, in the read operation, the read voltage $V_{CGBR}$ is supplied to the selected word line $WL_S$, the voltage $V_{SRC}$ is supplied to the source line SLa, and a voltage having a magnitude around a difference between the read voltage $V_{CGBR}$ and the read voltage $V_{CGAR}$ is supplied to the source line SLf. In this case, a source-gate voltage of the selected memory cell MC included in any of the string unit SUa to the string unit SUe becomes around the read voltage $V_{CGBR}$. Moreover, a source-gate voltage of the selected memory cell MC included in any of the string unit SUf to the string unit SUj becomes around the read voltage $V_{CGAR}$. In this state, in the selected page PG included in any of the string unit SUa to the string unit SUe, the memory cells MC in the Er state and the A state enter the ON state and the remaining selected memory cells MC enter the OFF state. In the selected page PG included in any of the string unit SUf to the string unit SUj, the memory cells MC in the Er state enter the ON state and the remaining selected memory cells MC enter the OFF state. This method allows simultaneously performing the read operation of the data corresponding to the different voltages. Additionally, this read operation can be performed in a case where the two selected pages PG belong to the same memory block BLK and in a case where the two selected pages PG belong to the different memory blocks BLK.

Figure 37:
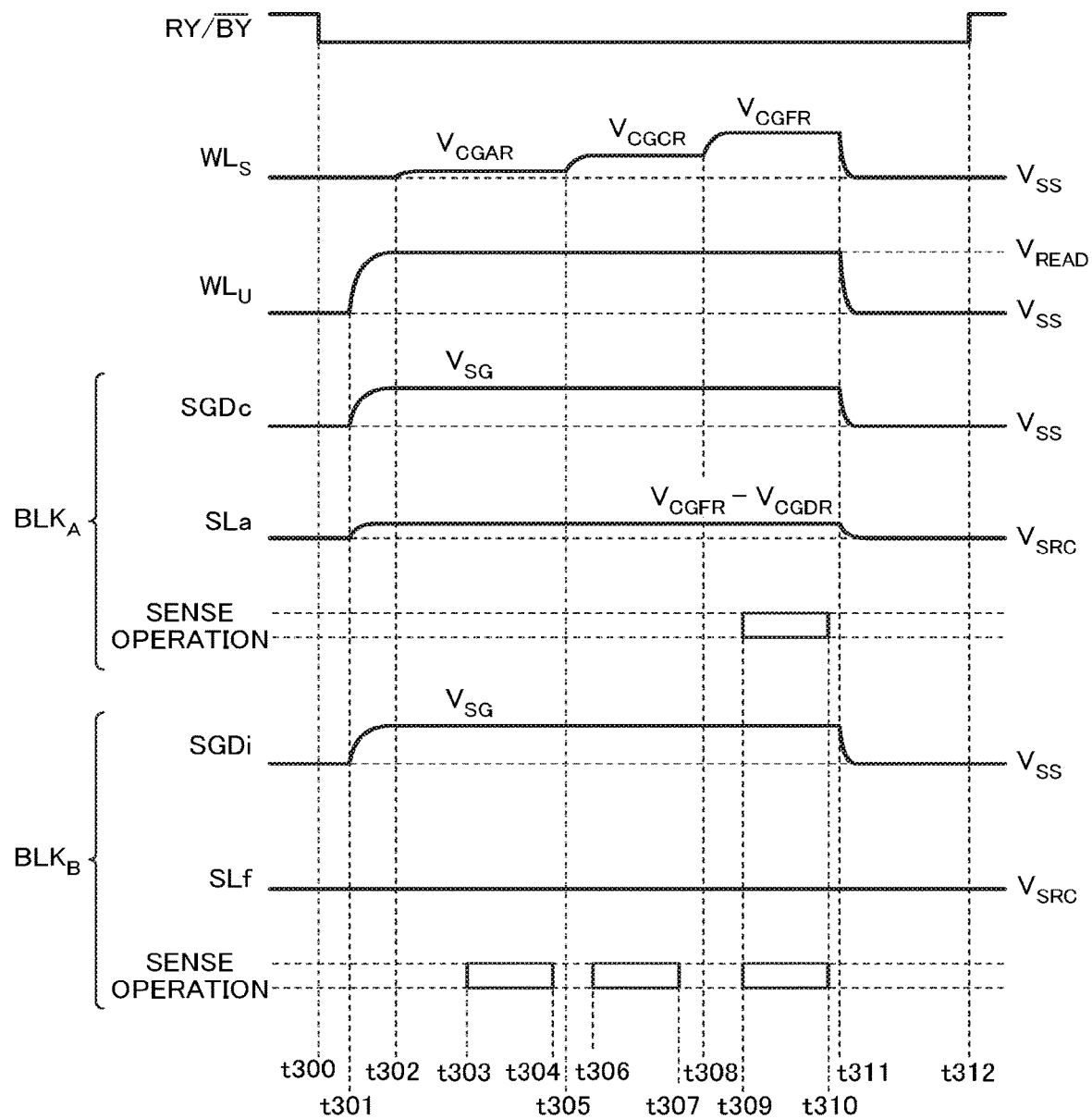
FIG. 37 is a schematic waveform diagram for describing a read operation performable in the memory die MD5.

For example, in the example of FIG. 37, the data of low-order bit in the selected page PG in the string unit SUc in the memory block $BLK_A$ and the data of middle-order bit in the selected page PG in the string unit SUi in the memory block $BLK_B$ are simultaneously read.

Operations at timing t300 to timing t304 in the read operation of FIG. 37 are performed similarly to the operations at the timing t100 to the timing t104 in the read operation of FIG. 17. However, at the timing t301, a voltage $V_{CGFR}$-$V_{CGDR}$, which is equivalent to a difference between the read voltage $V_{CGFR}$ and the read voltage $V_{CGDR}$, is supplied to the source line SLa. At the timing t301, the voltage $V_{SRC}$ is supplied to the source line SLf. At the timing t302, the read voltage $V_{CGAR}$ is supplied to the selected word line $WL_S$. Thus, in the string unit SUi, the selected memory cells MC in the Er state enter the ON state and the remaining selected memory cells MC enter the OFF state. At the timing t303 to the timing t304, the sense operation is performed only in the sense amplifier module SAMf, and the sense operation is not performed in the sense amplifier module SAMa.

Operations at timing t305 to timing t307 in the read operation of FIG. 37 are performed similarly to the operations at the timing t102 to the timing t104 in the read operation of FIG. 17. However, at the timing t305, the read voltage $V_{CGCR}$ is supplied to the selected word line $WL_S$. Thus, in the string unit SUi, the selected memory cells MC in the Er state to the B state enter the ON state, and the remaining selected memory cells MC enter the OFF state. At timing t306 to timing t307, the sense operation is performed only by the sense amplifier module SAMf and the sense operation is not performed by the sense amplifier module SAMa.

Operations at timing t308 to timing t310 in the read operation of FIG. 37 are performed similarly to the operations at the timing t102 to the timing t104 in the read operation of FIG. 17. However, at the timing t308, the read voltage $V_{CGFR}$ is supplied to the selected word line $WL_S$. Thus, in the string unit SUc, the selected memory cells MC in the Er state to the C state enter the ON state, and the remaining selected memory cells MC enter the OFF state. In the string unit SUi, the selected memory cells MC in the Er state to the E state enter the ON state, and the remaining selected memory cells MC enter the OFF state. Further, at the timing t303 to the timing t304, the sense operation is performed by both of the sense amplifier modules SAMa, SAMf.

Operations at the timing t311 to the timing t312 in the read operation of FIG. 37 are performed similarly to the operations at the timing t105 to the timing t106 in the read operation of FIG. 17.

In the read operation according to the fifth embodiment as well, similarly to the read operation according to the fourth embodiment, the arithmetic operation of data is performed as necessary, and thus the data stored in the memory cell MC is calculated.

Figure 38:
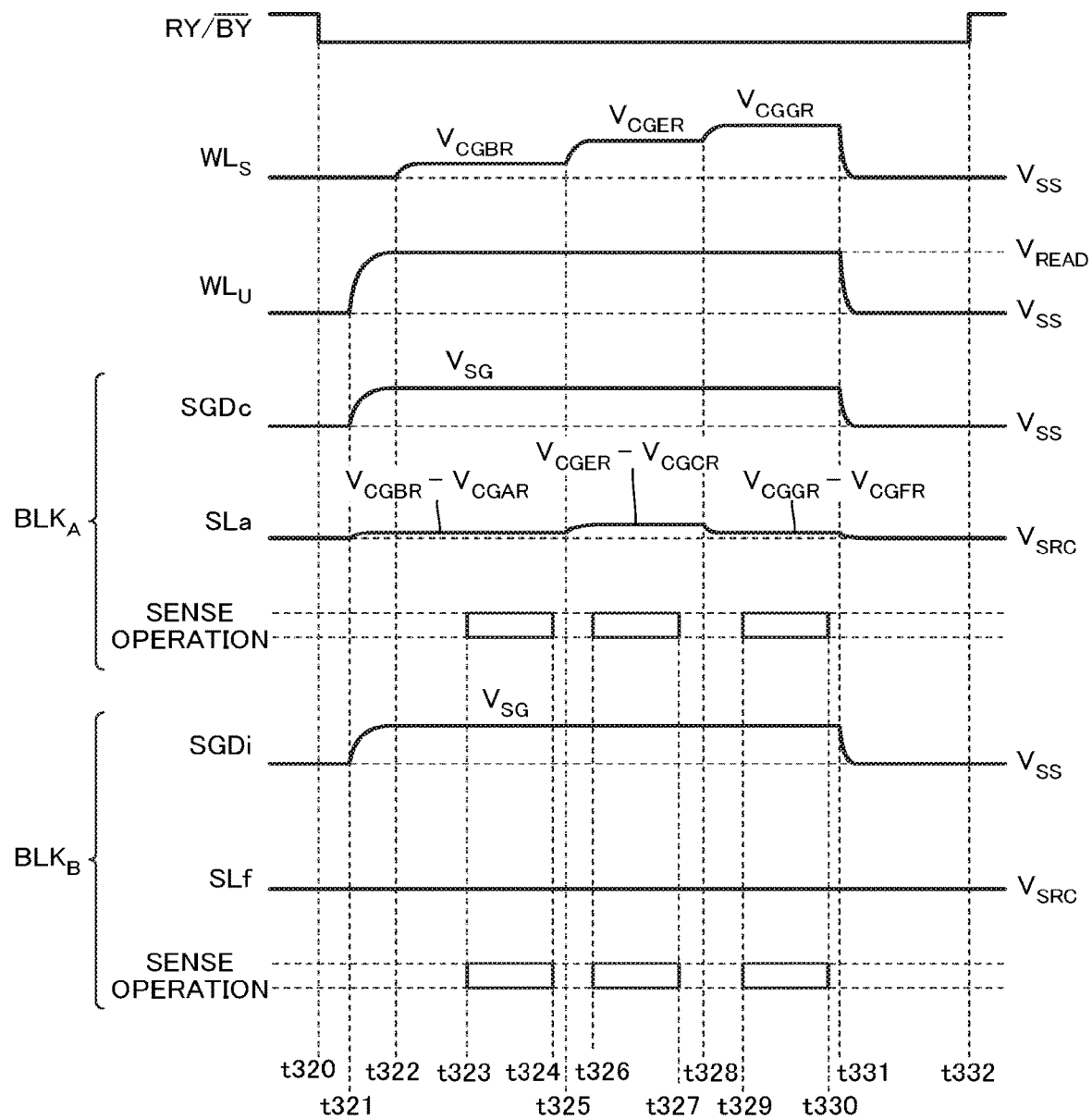
FIG. 38 is a schematic waveform diagram for describing the read operation performable in the memory die MD5.

For example, in an example of FIG. 38, the data of middle-order bit in the selected page PG in the string unit SUc in the memory block $BLK_A$ and the data of high-order bit in the selected page PG in the string unit SUi in the memory block $BLK_B$ are simultaneously read.

Operations at timing t320 to timing t332 in the read operation of FIG. 38 are performed similarly to the operations at the timing t300 to the timing t312 in the read operation of FIG. 37. However, at the timings t322, t325, t329, the voltage of the selected word line $WL_S$ is controlled to, not the read voltage $V_{CGAR}$, $V_{CGCR}$, $V_{CGFR}$, but the read voltages $V_{CGBR}$, $V_{CGER}$, $V_{CGGR}$. At the timings t321, t325, and t328, the voltage of the source line SLa is controlled to the voltages $V_{CGBR}$-$V_{CGAR}$, $V_{CGER}$-$V_{CGCR}$, $V_{CGGR}$-$V_{CGFR}$. At the timings t323 to t324, t326 to t327, and t329 to t330, the sense operation is performed by both of the sense amplifier modules SAMa, SAMf.

Figure 39:
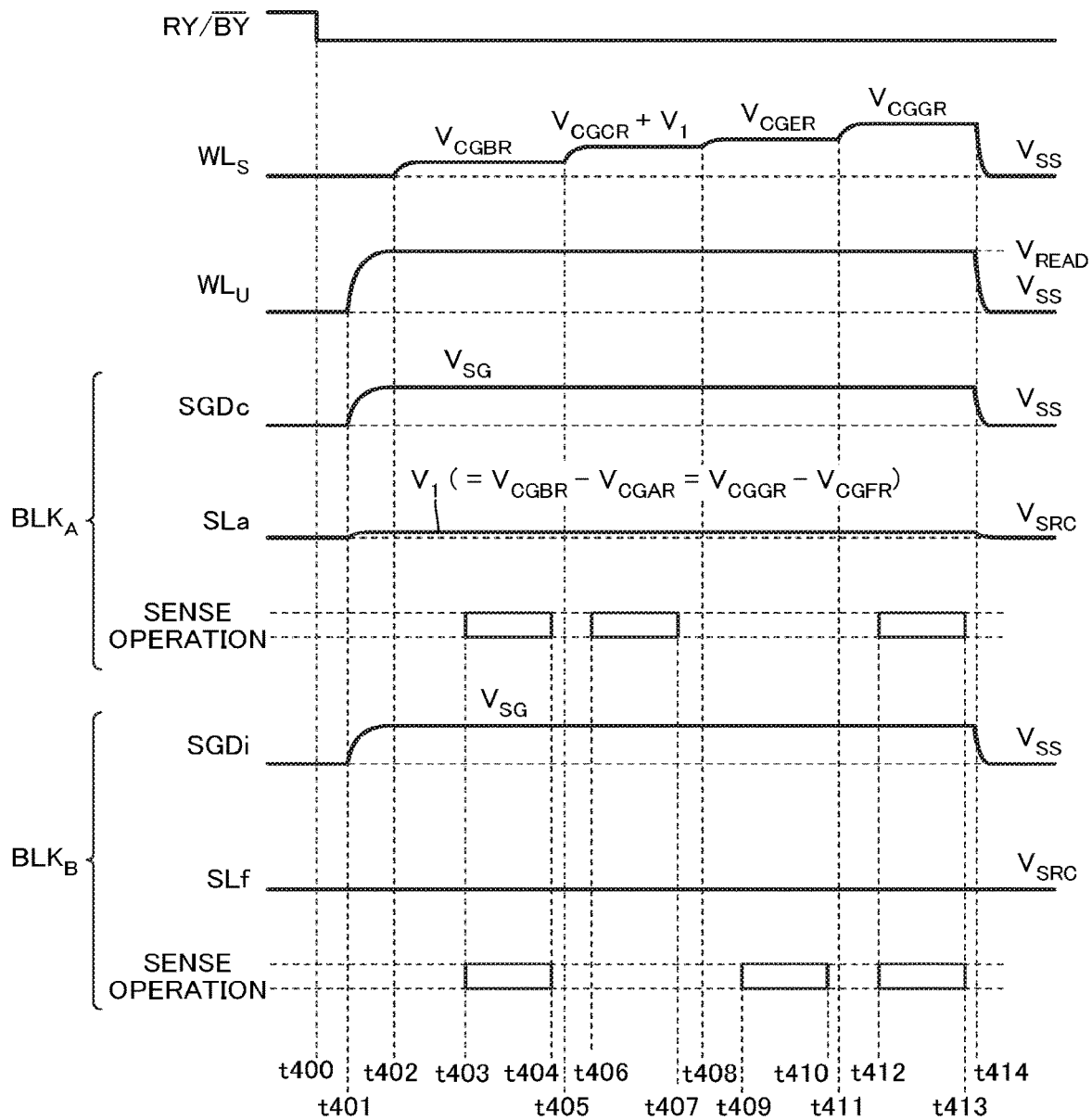
FIG. 39 is a schematic waveform diagram for describing the read operation performable in the memory die MD5.

For example, in the example of FIG. 39, the data of middle-order bit in the selected page PG in the string unit SUc in the memory block $BLK_A$ and the data of high-order bit in the selected page PG in the string unit SUi in the memory block $BLK_B$ are concurrently read.

Operations at timing t400 to timing t404 in the read operation of FIG. 39 are performed similarly to the operations at the timing t100 to the timing t104 in the read operation of FIG. 17. However, at the timing t401, a voltage $V_1$ is supplied to the source line SLa. The voltage $V_1$ is, for example, equal to the voltage $V_{CGBR}$-$V_{CGAR}$. Alternatively, the voltage $V_1$ is, for example, equal to the voltage $V_{CGGR}$-$V_{CGFR}$. At the timing t401, the voltage $V_{SRC}$ is supplied to the source line SLf. At the timing t402, the read voltage $V_{CGBR}$ is supplied to the selected word line $WL_S$. Thus, in the string unit SUc, the selected memory cells MC in the Er state enter the ON state, and the remaining selected memory cells MC enter the OFF state. In the string unit SUi, the selected memory cells MC in the Er state and the A state enter the ON state, and the remaining selected memory cells MC enter the OFF state. At the timing t403 to the timing t404, the sense operation is performed by both of the sense amplifier modules SAMa, SAMf.

Operations at timing t405 to timing t407 in the read operation of FIG. 39 are performed similarly to the operations at the timing t102 to the timing t104 in the read operation of FIG. 17. However, at the timing t405, a read voltage $V_{CGCR}$+$V_1$ is supplied to the selected word line $WL_S$. Thus, in the string unit SUc, the selected memory cells MC in the Er state to the B state enter the ON state, and the remaining selected memory cells MC enter the OFF state. At the timing t406 to the timing t407, the sense operation is performed only by the sense amplifier module SAMa and the sense operation is not performed by the sense amplifier module SAMf.

Operations at timing t408 to timing t410 in the read operation of FIG. 39 are performed similarly to the operations at the timing t102 to the timing t104 in the read operation of FIG. 17. However, at the timing t408, the read voltage $V_{CGER}$ is supplied to the selected word line $WL_S$. Thus, in the string unit SUi, the selected memory cells MC in the Er state to the D state enter the ON state, and the remaining selected memory cells MC enter the OFF state. At the timing t409 to the timing t410, the sense operation is performed only by the sense amplifier module SAMf and the sense operation is not performed by the sense amplifier module SAMa.

Operations at timing t411 to timing t413 in the read operation of FIG. 39 are performed similarly to the operations at the timing t102 to the timing t104 in the read operation of FIG. 17. However, at the timing t411, the read voltage $V_{CGGR}$ is supplied to the selected word line $WL_S$. Thus, in the string unit SUc, the selected memory cells MC in the Er state to the E state enter the ON state, and the remaining selected memory cells MC enter the OFF state. In the string unit SUi, the selected memory cells MC in the Er state to the F state enter the ON state, and the remaining selected memory cells MC enter the OFF state. At the timing t412 to the timing t413, the sense operation is performed by both of the sense amplifier modules SAMa, SAMf.

In performing the read operation, the command set is input from the controller die (not illustrated) to the memory die MD5. This command set may be the command set similar to the command set that can be input to the memory die MD4 according to the fourth embodiment.

[Effects of Fifth Embodiment]

The semiconductor memory device according to the fifth embodiment can read two pieces of data corresponding to the different read voltages by one-time read operation. Therefore, when a plurality of pieces of data are sequentially read, a combination of the two selected pages PG that can be simultaneously read becomes larger than that of the third embodiment. Further, in a case where the two selected pages PG to be simultaneously read belong to the same memory block BLK, the read method according to the fourth embodiment cannot read the two pieces of data corresponding to different read voltages by one-time read operation. On the other hand, in such a case, the semiconductor memory device according to the fifth embodiment can read the two pieces of data corresponding to the different read voltages. Accordingly, when a plurality of pieces of data are sequentially read, the semiconductor memory device according to the fifth embodiment operates at a speed further higher than that of the semiconductor memory device according to the fourth embodiment in some cases.

Sixth Embodiment

Figure 40:
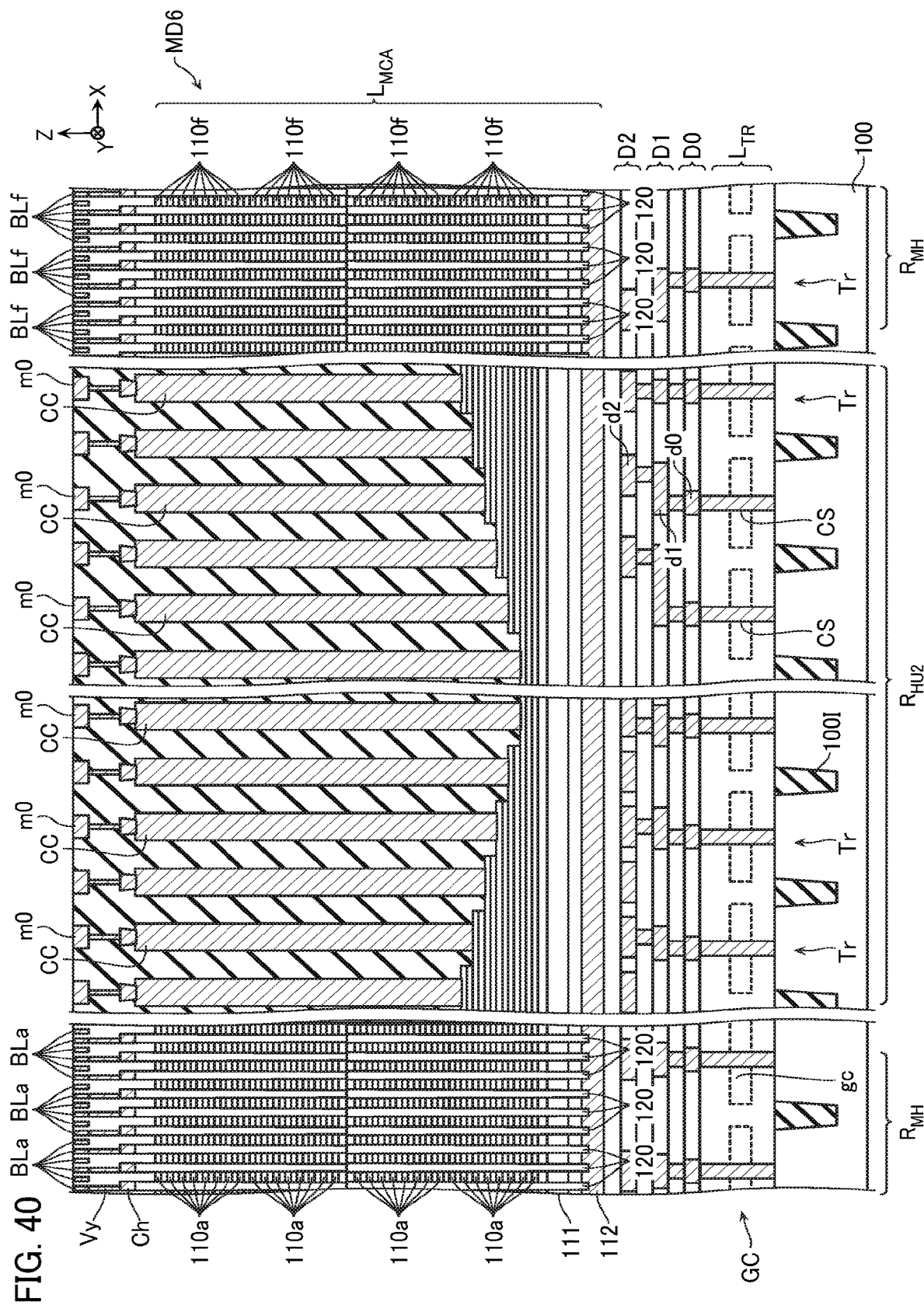
FIG. 40 is a schematic cross-sectional view illustrating a part of a configuration of a memory die MD6 according to a sixth embodiment.
Figure 41:
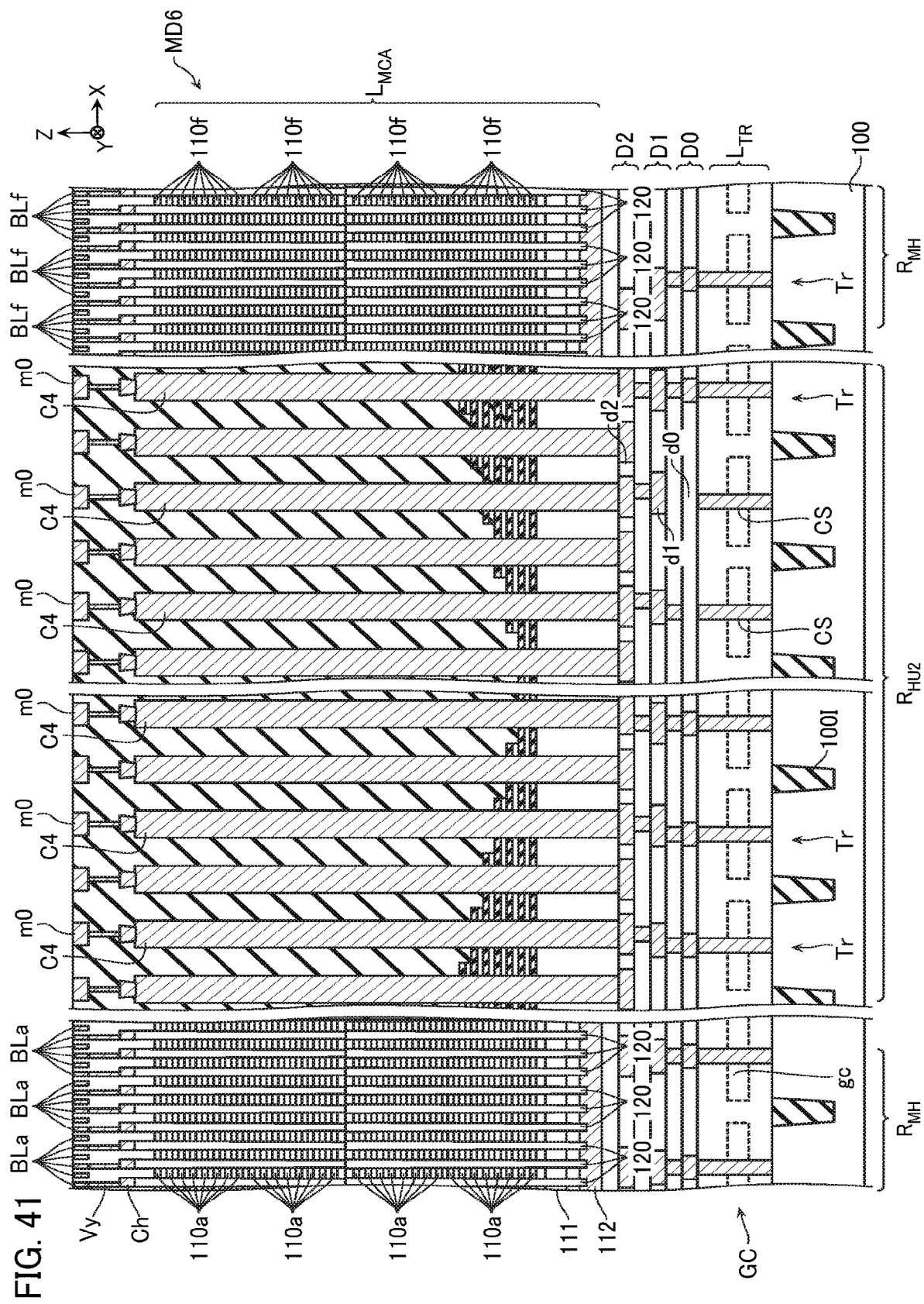
FIG. 41 is a schematic cross-sectional view illustrating a part of the configuration of the memory die MD6.
Figure 42:
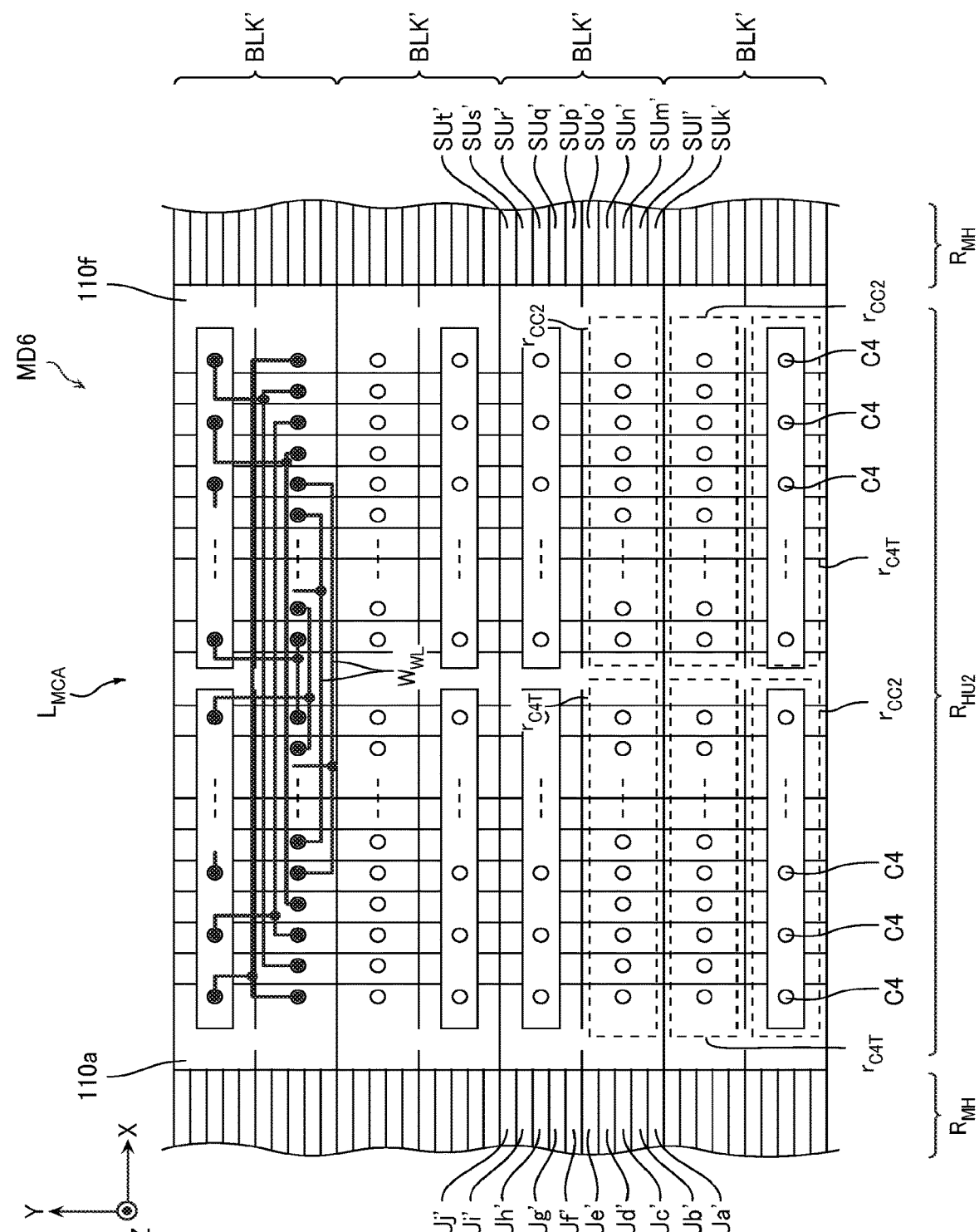
FIG. 42 is a schematic plan view illustrating a part of the configuration of the memory die MD6.

Next, with reference to FIG. 40 to FIG. 42, a memory die MD6 according to the sixth embodiment will be described. FIG. 40 is a schematic cross-sectional view illustrating a part of a configuration of the memory die MD6 according to the sixth embodiment. FIG. 41 is a schematic cross-sectional view illustrating a part of the configuration of the memory die MD6. FIG. 42 is a schematic plan view illustrating a part of the configuration of the memory die MD6.

The memory die MD6 according to the sixth embodiment is configured basically similarly to any of the memory die MD according to the first embodiment to the memory die MD5 according to the fifth embodiment.

However, as described with reference to FIG. 3 and the like, the memory blocks BLK according to the first embodiment to the fifth embodiment include the 10 string units SU (the string unit SUa to the string unit SUj). Meanwhile, as illustrated in FIG. 42, a memory block BLK' according to the sixth embodiment includes the 20 string units SU (a string unit SUa' to a string unit SUt'). The string unit SUa' to the string unit SUj' are configured similarly to the string unit SUa to the string unit SUe. The string unit SUk' to the string unit SUt' are configured similarly to the string unit SUf to the string unit SUj.

The memory die MD6 according to the sixth embodiment includes conductive layers 110a, 110f, instead of the conductive layers 110 described with reference to FIG. 10 and the like. The conductive layers 110a, 110f are configured basically similarly to the conductive layers 110. However, the conductive layers 110, which function as the word lines WL, are formed across the entire region of the memory cell array region $R_{MCA}$. On the other hand, the conductive layers 110a functioning as the word lines WL are formed in a region at one side in the X-direction (for example, the X-direction negative side in FIG. 42), and the conductive layers 110f functioning as the word lines WL are formed in a region at the other side in the X-direction (for example, the X-direction positive side in FIG. 42). These two conductive layers 110a, 110f are connected to one another via the contacts CC and wirings $W_{WL}$. For example, the wirings $W_{WL}$ are achieved by the wirings m0 (FIG. 40, FIG. 41), and the like.

The semiconductor memory device according to the sixth embodiment can perform at least one of the read operations performable in the semiconductor memory devices according to the first embodiment to the fifth embodiment.

Other Embodiments

The configurations of the semiconductor memory devices according to the first embodiment to the sixth embodiment and the read operations performable in the respective configurations have been described above. However, the above-described configurations and methods of read operation are only examples and the specific configuration and the method of read operation are appropriately adjustable. Hereinafter, this point will be described with examples.

[Circuit Configuration]

The circuit configurations and the like of the semiconductor memory devices according to the first embodiment to the sixth embodiment are appropriately adjustable. For example, the memory die MD4 according to the fourth embodiment (FIG. 31) and the memory die MD6 according to the sixth embodiment may include the source lines SLa, SLf similarly to the memory die MD5 (FIG. 34) according to the fifth embodiment, instead of the source lines SL. Similarly to the memory die MD5 (FIG. 34) according to the fifth embodiment, the configuration in which different voltages can be supplied may be provided to the source line SLa and the source line SLf.

The configurations of the respective circuits included in the semiconductor memory devices according to the first embodiment to the sixth embodiment are appropriately adjustable. For example, in the example of FIG. 32, the signal lines STB, HLL, XXL, BLX, BLC, BLS are electrically independent between the sense amplifier modules SAMa, SAMf. However, this configuration is only an example, and the specific configuration is adjustable as necessary. For example, the signal line STB may be configured to be electrically independent between the sense amplifier modules SAMa, SAMf. The signal lines HLL, XXL, BLX, BLC, BLS may be configured to be electrically common among the sense amplifier modules SAMa, SAMf.

[Structure of Memory Die]

The structures of the memory dies MD to MD6 according to the first embodiment to the sixth embodiment are appropriately adjustable.

For example, in the above-described embodiments, as described with reference to FIG. 8 and the like, the two memory hole regions $R_{MH}$ arranged in the X-direction are disposed in the memory cell array region $R_{MCA}$. As described with reference to FIG. 1 and the like, the address register ADR is configured to so as to ensure latching at least the two string addresses $A_{SU}$. The peripheral circuit PC is configured to select one of the plurality of string unit SUa to string unit SUe in one memory hole region $R_{MH}$ according to one string address $A_{SU}$. Additionally, the peripheral circuit PC is configured to select one of the plurality of string unit SUf to string unit SUj in the other memory hole region $R_{MH}$ according to the other string address $A_{SU}$.

However, the configuration is only an example, and a specific configuration is appropriately adjustable. For example, the $n_m$ ($n_m$ is a positive integer of 3 or more) memory hole regions $R_{MH}$ arranged in the X-direction may be disposed in the memory cell array region $R_{MCA}$. The address register ADR may be configured to latch at least the $n_m$ string addresses $A_{SU}$. The peripheral circuit PC may be configured to select one of the plurality of string units SU in the $k_m$-th ($k_m$ is a positive integer of 1 or more and $n_m$ or less) memory hole region $R_{MH}$ according to the $k_m$-th string address $A_{SU}$.

Figure 43:
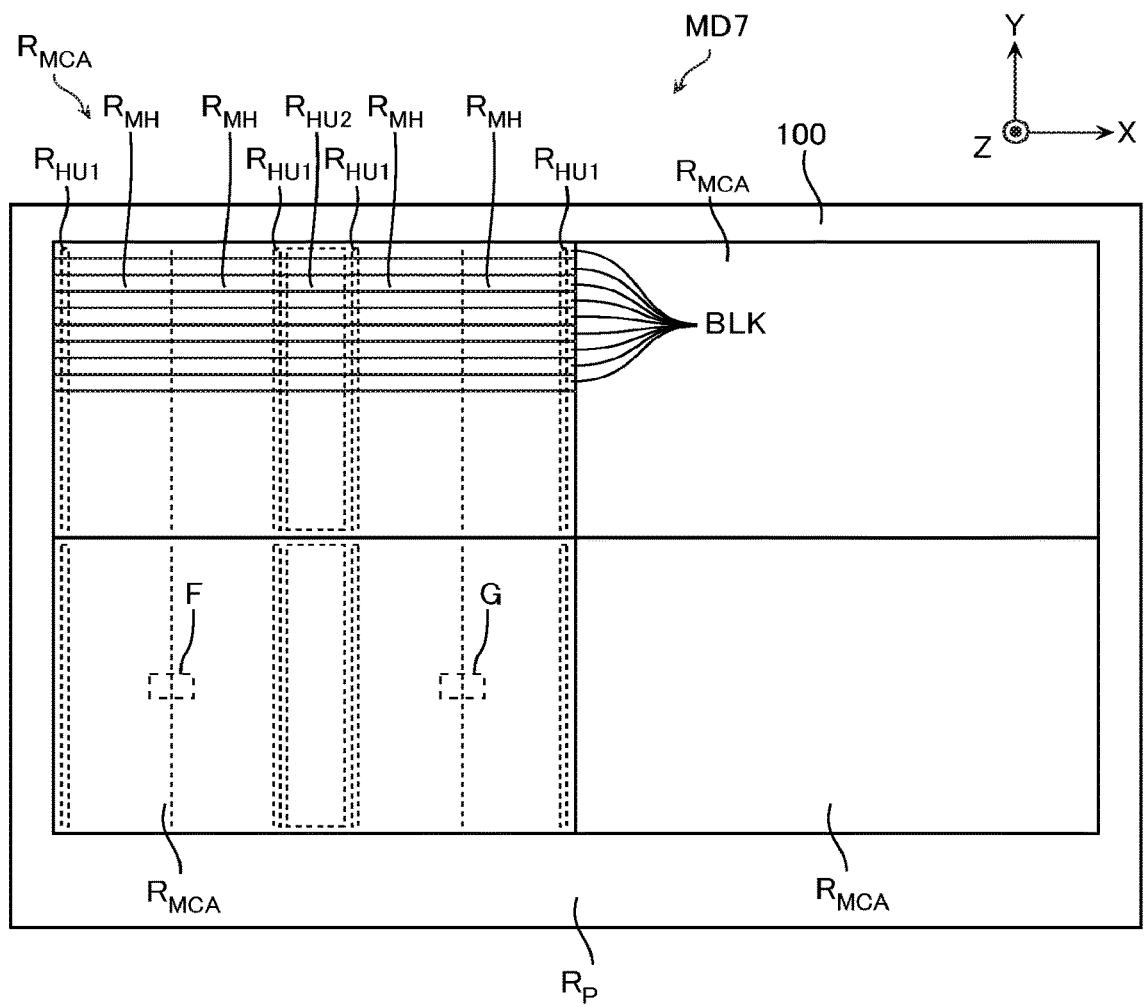
FIG. 43 is a schematic plan view illustrating a configuration of a memory die MD7 according to another embodiment.

For example, FIG. 43 illustrates an example of $n_m$ being 4. That is, in the example of FIG. 43, the four memory hole regions $R_{MH}$ arranged in the X-direction are disposed in the memory cell array region $R_{MCA}$. Additionally, one first hook-up region $R_{HU1}$ is disposed at one side in the X-direction (for example, the X-direction negative side in FIG. 43) and at the other side (for example, the X-direction positive side in FIG. 43) for each of these two memory hole regions $R_{MH}$. That is, in the example of FIG. 43, the memory cell array region $R_{MCA}$ includes the four first hook-up regions $R_{HU1}$ arranged in the X-direction.

Figure 44:
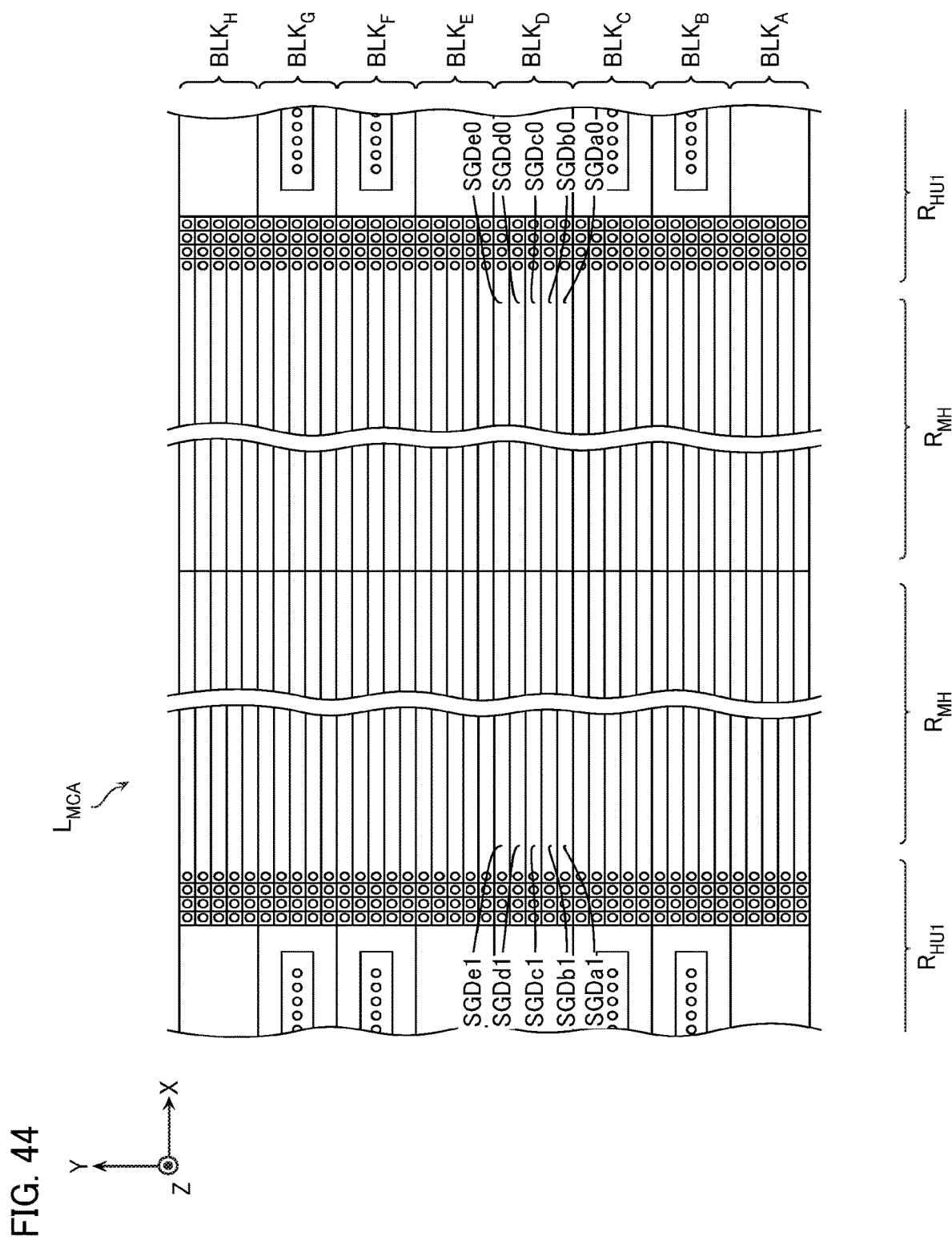
FIG. 44 is a schematic enlarged view of a part indicated by F in FIG. 43.

FIG. 44 is a schematic enlarged view of a part indicated by F in FIG. 43. In the example of FIG. 44, the conductive layers 110 functioning as the drain-side select gate lines SGD are separated into two parts in the X-direction. A part disposed at one side in the X-direction (for example, the X-direction negative side in FIG. 44) and a part disposed at the other side in the X-direction (for example, the X-direction positive side in FIG. 44) function as the two drain-side select gate lines SGD electrically independent from one another. FIG. 44 illustrates the plurality of drain-side select gate lines SGD disposed at one side in the X-direction as a drain-side select gate line SGDa1 to a drain-side select gate line SGDe1 as an example. The plurality of drain-side select gate lines SGD disposed at the other side in the X-direction are illustrated as a drain-side select gate line SGDa0 to a drain-side select gate line SGDe0 as an example.

Figure 45:
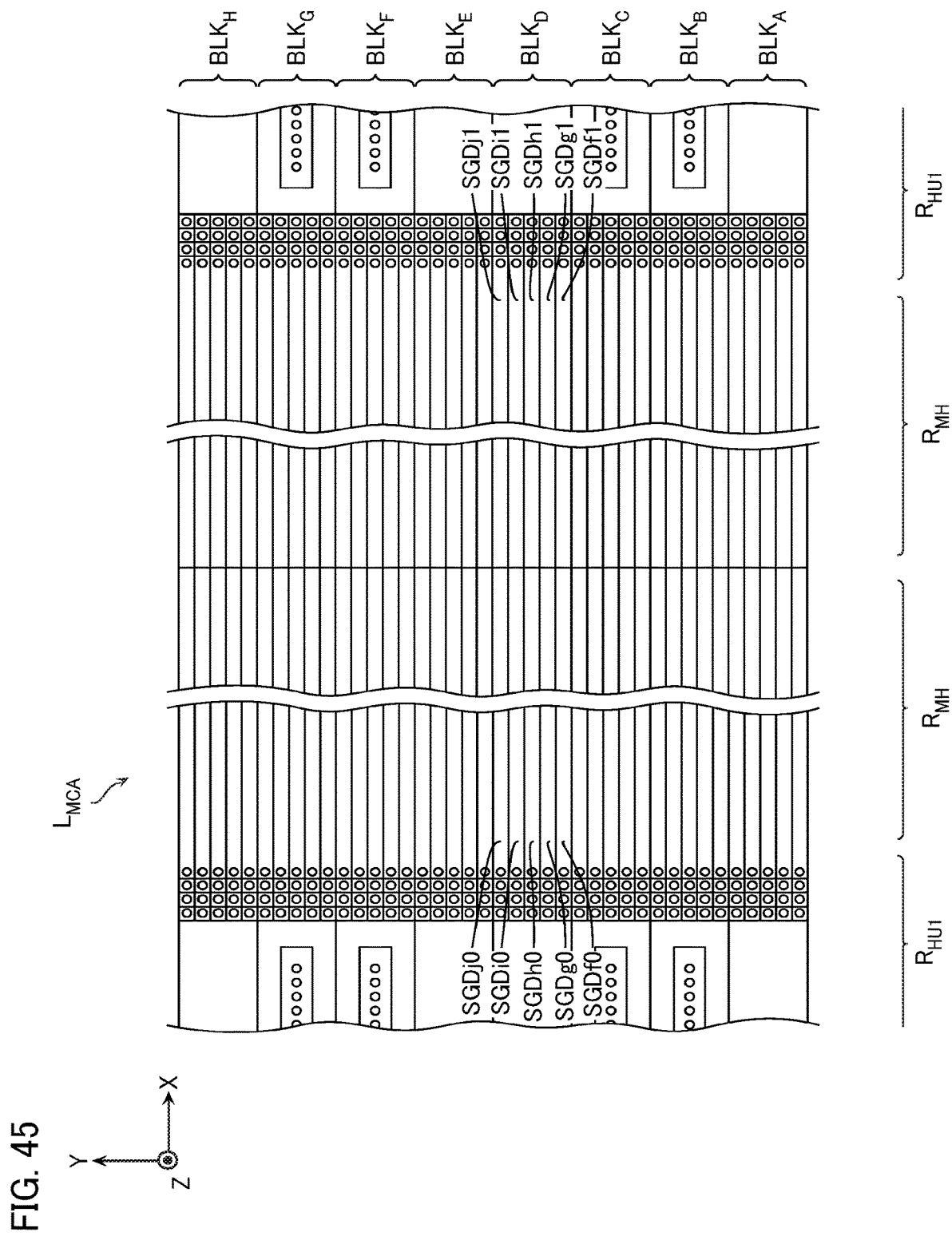
FIG. 45 is a schematic enlarged view of a part indicated by G in FIG. 43.

FIG. 45 is a schematic enlarged view of a part indicated by G in FIG. 43. In the example of FIG. 45, the conductive layers 110 functioning as the drain-side select gate lines SGD are separated into two parts in the X-direction. A part disposed at one side in the X-direction (for example, the X-direction negative side in FIG. 45) and a part disposed at the other side in the X-direction (for example, the X-direction positive side in FIG. 45) function as the two drain-side select gate lines SGD electrically independent from one another. FIG. 45 illustrates the plurality of drain-side select gate lines SGD disposed at one side in the X-direction as a drain-side select gate line SGDf0 to a drain-side select gate line SGDj0 as an example. The plurality of drain-side select gate lines SGD disposed at the other side in the X-direction are illustrated as a drain-side select gate line SGDf1 to a drain-side select gate line SGDj1 as an example.

In the example of FIG. 43 to FIG. 45, the conductive layers 110 functioning as the word lines WL extend in the X-direction across the four memory hole regions $R_{MH}$ arranged in the X-direction.

To employ the configuration as illustrated in FIG. 43 to FIG. 45 as an example, the address register ADR may be configured to latch at least the four string addresses $A_{SU}$. The peripheral circuit PC may be configured to select any of the drain-side select gate line SGDa0 to the drain-side select gate line SGDe0 according to the first string address $A_{SU}$. The peripheral circuit PC may be configured to select any of the drain-side select gate line SGDa1 to the drain-side select gate line SGDe1 according to the second string address $A_{SU}$. Further, the peripheral circuit PC may be configured to select any of the drain-side select gate line SGDf0 to the drain-side select gate line SGDj0 according to the third string address $A_{SU}$. The peripheral circuit PC may be configured to select any of the drain-side select gate line SGDf1 to the drain-side select gate line SGDj1 according to the fourth string address $A_{SU}$.

For example, the semiconductor memory devices according to the first embodiment to the fifth embodiment include the conductive layers 110, and the semiconductor memory device according to the sixth embodiment includes the conductive layers 110a and the conductive layers 110f. However, this configuration is only an example, and the specific configuration is adjustable as necessary. For example, in the semiconductor memory devices according to the first embodiment to the fifth embodiment, a part of the conductive layers 110 may be exchanged for the set of the conductive layers 110a and the conductive layers 110f. For example, among the plurality of conductive layers 110 functioning as the word lines WL, the plurality of respective conductive layers 110 positioned on the uppermost side may be exchanged for the set of the conductive layers 110a and the conductive layers 110f.

For example, in the above-described description, as described with reference to FIG. 8, FIG. 9, and the like, the memory cell array layer $L_{MCA}$ is disposed separated from the semiconductor substrate 100, and the transistor layer $L_{TR}$ is disposed between the memory cell array layer $L_{MCA}$ and the semiconductor substrate 100. Moreover, the configuration in the memory cell array MCA is disposed in the memory cell array layer $L_{MCA}$, and the configuration in the peripheral circuit PC is disposed in the transistor layer $L_{TR}$. However, this configuration is only an example, and the specific configuration is adjustable as necessary.

Figure 46:
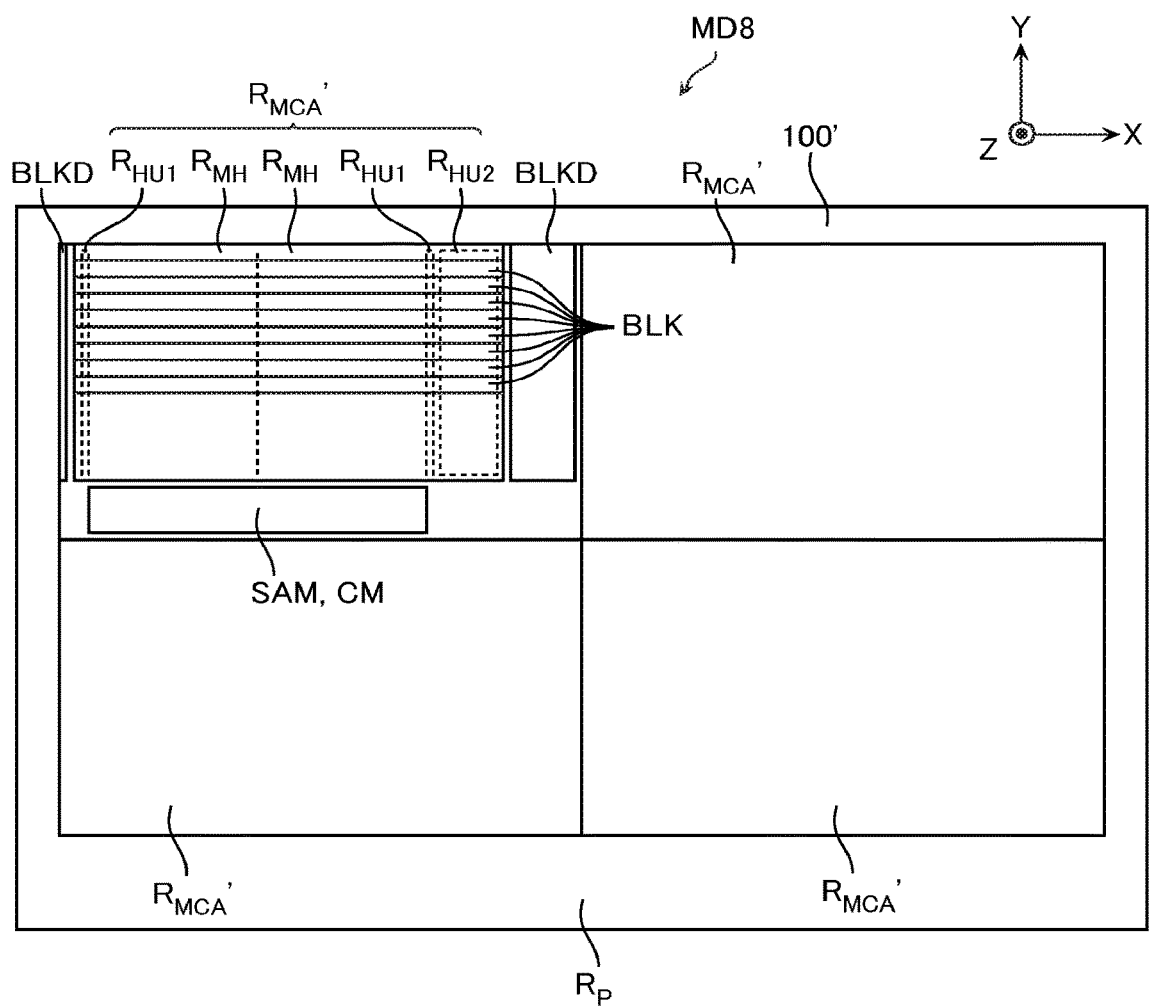
FIG. 46 is a schematic plan view illustrating a configuration of a memory die MD8 according to another embodiment.
Figure 47:
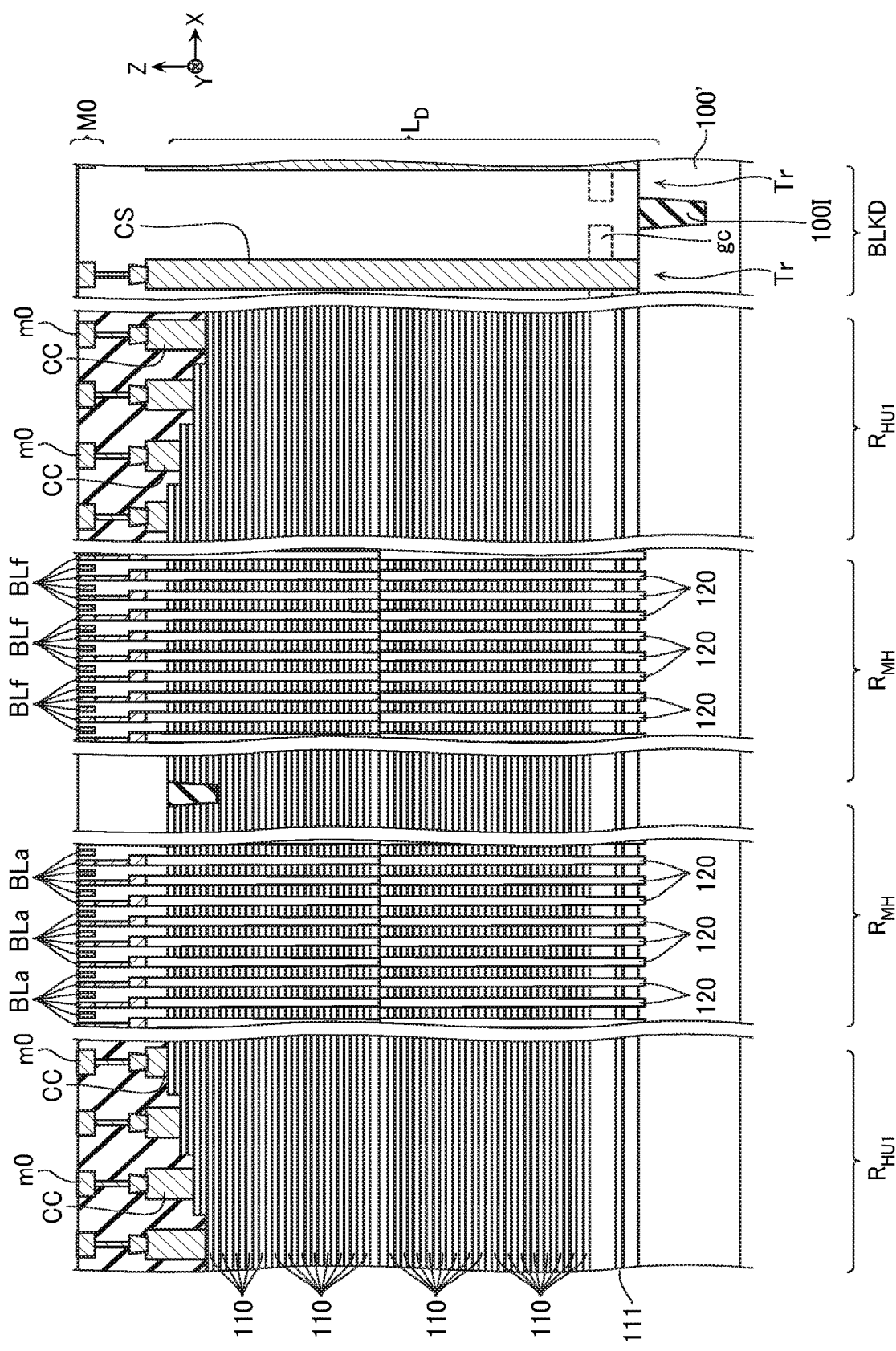
FIG. 47 is a schematic cross-sectional view of the memory die MD8.

For example, in an example of FIG. 46 and FIG. 47, both of the configuration in the memory cell array MCA and the configuration in the peripheral circuit PC are disposed on an upper surface of a semiconductor substrate 100'.

That is, a memory die MD8 illustrated in FIG. 46 as an example includes the semiconductor substrate 100'. In the illustrated example, the semiconductor substrate 100' includes four memory cell array regions $R_{MCA}'$ arranged in the X-direction and the Y-direction. Additionally, the memory cell array region $R_{MCA}'$ includes a part of the configurations of the block decoders BLKD (see FIG. 4 and FIG. 5) in regions at one side and the other side in the X-direction. The memory cell array region $R_{MCA}'$ includes the two memory hole regions $R_{MH}$ arranged in the X-direction. In each of regions between the memory hole regions $R_{MH}$ and the block decoders BLKD, the first hook-up region $R_{HU1}$ is disposed. In each of regions between one or both of the first hook-up regions $R_{HU1}$ and the block decoders BLKD, the second hook-up region $R_{HU2}$ is disposed. In a region at one side in the Y-direction of the memory cell array region $R_{MCA}'$, the configurations in the sense amplifier module SAM and the cache memory CM are disposed. On an end portion in the Y-direction of the semiconductor substrate 100', the peripheral region $R_P$ is disposed. The peripheral region $R_P$ extends in the X-direction along the end portion in the Y-direction of the semiconductor substrate 100'.

For example, as illustrated in FIG. 47, the memory die MD8 includes a device layer $L_D$ disposed on the semiconductor substrate 100' and the wiring layer M0 disposed above the device layer $L_D$. Although the illustration is omitted in FIG. 47, a plurality of wiring layers are further disposed above the wiring layer M0.

The semiconductor substrate 100' is configured basically similarly to the semiconductor substrate 100 (FIG. 9) according to the first embodiment. However, the semiconductor substrate 100' is connected to the lower ends of the semiconductor columns 120.

The configuration of the device layer $L_D$ in the memory hole region $R_{MH}$, the first hook-up region $R_{HU1}$, and the second hook-up region $R_{HU2}$ is basically similar to the configuration of the memory cell array layer $L_{MCA}$ (FIG. 9) in the memory hole region $R_{MH}$, the first hook-up region $R_{HU1}$, and the second hook-up region $R_{HU2}$. However, the device layer $L_D$ does not include the conductive layer 112 (FIG. 9). The lower ends of the configurations, such as the semiconductor columns 120, connected to the conductive layer 112 in the first embodiment are connected to the upper surface of the semiconductor substrate 100'. Further, the device layer $L_D$ does not include the contact connection sub-regions $r_{C4T}$ (FIG. 10).

Configurations corresponding to the block decoder BLKD, the sense amplifier modules SAM, and the cache memory CM in the device layer $L_D$ are basically similar to the configurations in the transistor layer $L_{TR}$ (FIG. 9). However, specific configurations, such as the location of the transistors Tr, are appropriately adjustable.

Figure 48:
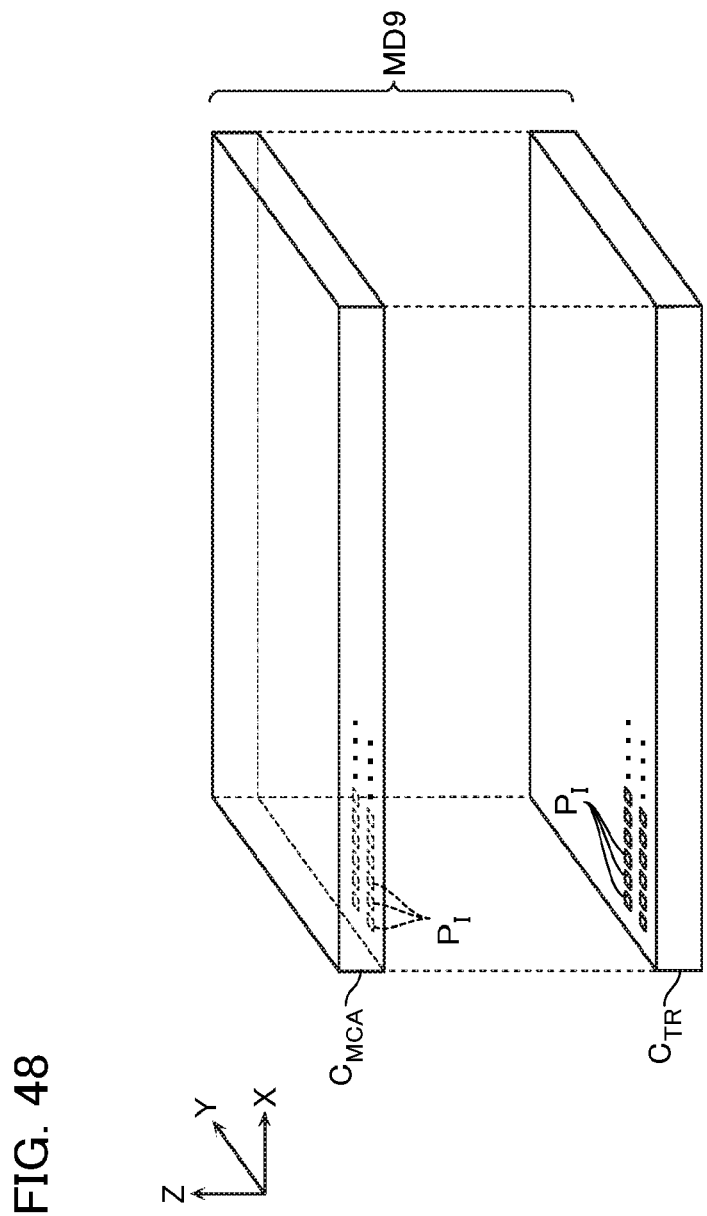
FIG. 48 is a schematic perspective view illustrating a configuration of a memory die MD9 according to another embodiment.

In the above description, the example in which the configurations in the memory cell array MCA and the configurations in the peripheral circuit PC are both formed on the same semiconductor substrates 100, 100' has been described. However, this configuration is only an example, and the specific configuration is adjustable as necessary. For example, a memory die MD9 illustrated in FIG. 48 as an example includes a chip $C_{MCA}$ and a chip $C_{TR}$. The chip $C_{MCA}$ includes one semiconductor substrate (not illustrated) and the configurations in the memory cell array MCA. Note that the chip $C_{MCA}$ may include a part of the configuration in the peripheral circuit PC. The chip $C_{TR}$ includes another semiconductor substrate (not illustrated) and all of or a part of the configuration in the peripheral circuit PC. The chips $C_{MCA}$, $C_{TR}$ each include a plurality of bonding electrodes $P_I$ containing copper (Cu). The respective configurations in the chips $C_{MCA}$, $C_{TR}$ are electrically connected via the bonding electrodes $P_I$. For example, the word line WL and the select transistor (STD, STS) in the chip $C_{MCA}$ may be connected to the block decoder BLKD (FIG. 4, FIG. 5) via the bonding electrodes $P_I$.

[Read Operation]

In the above description, when the plurality of patterns of read voltages are supplied to the selected word line $WL_S$ in the read operation, the read voltages are supplied in the ascending order. However, this operation is only an example, and the specific aspect is appropriately adjustable. For example, when the plurality of patterns of read voltages are supplied to the selected word line $WL_S$ in the read operation, the read voltage may be supplied in the descending order.

For example, in the read operation, at a timing when the read pass voltage $V_{READ}$ is supplied to the unselected word lines $WL_U$, the read pass voltage $V_{READ}$ may be supplied to the selected word line $WL_S$. For example, after the supply of the read voltage to the selected word line $WL_S$ is terminated, the read pass voltage $V_{READ}$ may be supplied to the selected word line $WL_S$.

For example, as described with reference to FIG. 31, in the memory die MD4 according to the fourth embodiment, the two wirings $CG_S$ corresponding to the word line decoders WLD0, WLD1 are connected to the different driver units drv (see FIG. 4). For example, as described with reference to FIG. 34, in the memory die MD5 according to the fifth embodiment, the source line SLa and the source line SLf are connected to the different driver units drv (see FIG. 4). Additionally, in the fourth embodiment and the fifth embodiment, by these configurations, the operation that simultaneously or concurrently performs the read operation of data corresponding to the different voltages on the two selected pages PG is achieved. However, this method is only an example, and the specific method is appropriately adjustable.

For example, in the semiconductor memory device according to any of the first embodiment to the third embodiment, instead of the sense amplifier modules SAM, the sense amplifier modules SAMa, SAMf may be disposed. In the read operation, a plurality of read voltages corresponding to two of the low-order bit, the middle-order bit, and the high-order bit may be sequentially supplied to the selected word line $WL_S$. At a timing when the corresponding to read voltage is supplied, the sense operation may be performed by the corresponding sense amplifier modules SAMa, SAMf.

Figure 49:
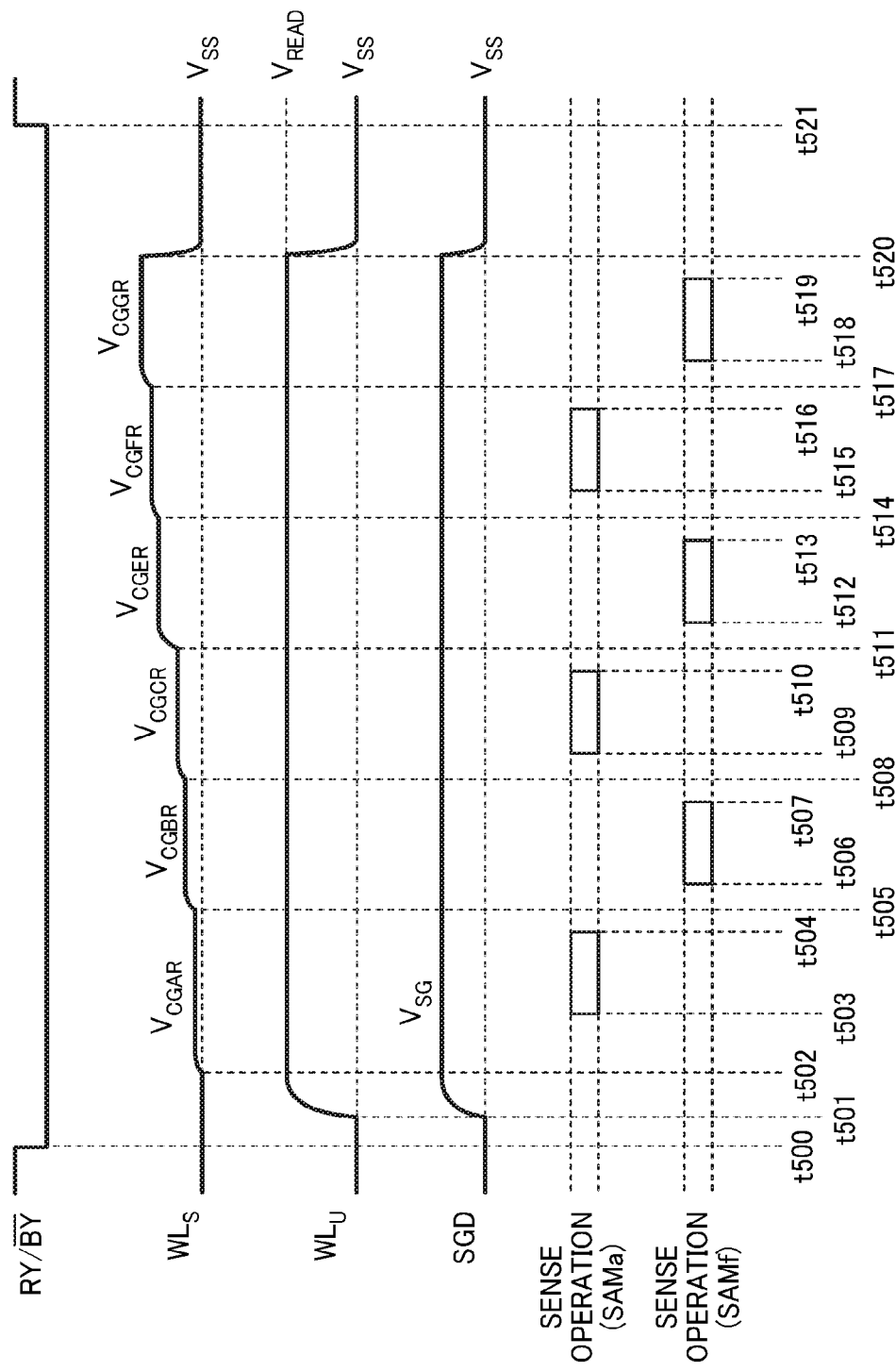
FIG. 49 is a schematic waveform diagram for describing a read operation according to another embodiment.

For example, FIG. 49 illustrates an example in which the sense amplifier module SAMa reads the data of middle-order bit and the sense amplifier module SAMf reads the data of high-order bit.

In the example of FIG. 49, at timings t502, t508, t514, the read voltages $V_{CGAR}$, $V_{CGCR}$, $V_{CGFR}$ corresponding to the middle-order bit are supplied to the selected word line $WL_S$. Additionally, at subsequent timings t503 to t504, t509 to t510, and t515 to t516, only the sense operation by the sense amplifier module SAMa is performed, and the sense operation by the sense amplifier module SAMf is not performed.

Additionally, in the example of FIG. 49, at timings t505, t511, and t517, the read voltages $V_{CGBR}$, $V_{CGER}$, $V_{CGGR}$ corresponding to the high-order bit are supplied to the selected word line $WL_S$. At the subsequent timings t506 to t507, t512 to t513, and t518 to t519, only the sense operation by the sense amplifier module SAMf is performed, and the sense operation by the sense amplifier module SAMa is not performed.

This read operation can be performed in both cases where the selected page PG corresponding to any of the string unit SUa to the string unit SUe and the selected page PG corresponding to any of the string unit SUf to the string unit SUj belong to the same memory block BLK and belong to the different memory blocks BLK.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a plurality of first word lines that are arranged in a first direction intersecting with a surface of the substrate;
   a first select gate line that extends in a second direction intersecting with the first direction, the first select gate line being disposed at a position overlapping with the plurality of first word lines viewed from the first direction;
   a second select gate line that extends in the second direction, the second select gate line being disposed at a position overlapping with the plurality of first word lines viewed from the first direction, the second select gate line being arranged with the first select gate line in the second direction;
   a first semiconductor column that extends in the first direction, the first semiconductor column being opposed to the plurality of first word lines and the first select gate line;
   a second semiconductor column that extends in the first direction, the second semiconductor column being opposed to the plurality of first word lines and the second select gate line;
   a first bit line that extends in a third direction intersecting with the first direction and the second direction, the first bit line being disposed at a position overlapping with the first semiconductor column viewed from the first direction;
   a second bit line that extends in the third direction, the second bit line being disposed at a position overlapping with the second semiconductor column viewed from the first direction;
   a first transistor electrically connected to the first select gate line; and
   a second transistor electrically connected to the second select gate line.

2. The semiconductor memory device according to claim 1, further comprising:

a first voltage output circuit electrically connected to the first select gate line; and a second voltage output circuit electrically connected to the second select gate line, wherein the first transistor is disposed on a current path between the first voltage output circuit and the first select gate line, and the first transistor is not disposed on a current path between the second voltage output circuit and the second select gate line, and the second transistor is disposed on the current path between the second voltage output circuit and the second select gate line, and the second transistor is not disposed on the current path between the first voltage output circuit and the first select gate line.

3. The semiconductor memory device according to claim 1, wherein the semiconductor memory device is configured to simultaneously supply different voltages to the first select gate line and the second select gate line.

4. The semiconductor memory device according to claim 1, wherein at a first timing in a first read operation:
a first voltage is supplied to the first select gate line; and
the first voltage is supplied to the second select gate line;

at a second timing in a second read operation:
the first voltage is supplied to the first select gate line; and
a second voltage smaller than the first voltage is supplied to the second select gate line.

5. The semiconductor memory device according to claim 4, further comprising:

a third select gate line that extends in the second direction, the third select gate line being disposed at a position overlapping with the plurality of first word lines viewed from the first direction, the third select gate line being arranged with the first select gate line in the third direction;

a fourth select gate line that extends in the second direction, the fourth select gate line being disposed at a position overlapping with the plurality of first word lines viewed from the first direction, the fourth select gate line being arranged with the third select gate line in the second direction, the fourth select gate line being arranged with the second select gate line in the third direction;

a third semiconductor column that extends in the first direction, the third semiconductor column being opposed to the plurality of first word lines and the third select gate line;

a fourth semiconductor column that extends in the first direction, the fourth semiconductor column being opposed to the plurality of first word lines and the fourth select gate line;

a third transistor electrically connected to the third select gate line; and a fourth transistor electrically connected to the fourth select gate line, wherein the semiconductor memory device is configured to simultaneously supply different voltages to the first select gate line and the second select gate line and different voltages to the third select gate line and the fourth select gate line.

6. The semiconductor memory device according to claim 5, wherein at the first timing in the first read operation:

the second voltage is supplied to the third select gate line; and
the second voltage is supplied to the fourth select gate line, and at the second timing in the second read operation:
the second voltage is supplied to the third select gate line; and
the first voltage is supplied to the fourth select gate line.

7. The semiconductor memory device according to claim 4, further comprising:

a plurality of second word lines arranged in the first direction, the plurality of second word lines being arranged with the plurality of first word lines in the third direction, the plurality of second word lines being disposed at positions overlapping with the first bit line and the second bit line viewed from the first direction;

a fifth select gate line that extends in the second direction, the fifth select gate line being disposed at a position overlapping with the plurality of second word lines viewed from the first direction;

a sixth select gate line that extends in the second direction, the sixth select gate line being disposed at a position overlapping with the plurality of second word lines viewed from the first direction, the sixth select gate line being arranged with the fifth select gate line in the second direction;

a fifth semiconductor column that extends in the first direction, the fifth semiconductor column being opposed to the plurality of second word lines and the fifth select gate line; and a sixth semiconductor column that extends in the first direction, the sixth semiconductor column being opposed to the plurality of second word lines and the sixth select gate line, wherein the semiconductor memory device is configured to simultaneously supply different voltages to the first select gate line and the second select gate line and different voltages to the fifth select gate line and the sixth select gate line.

8. The semiconductor memory device according to claim 7, wherein at the first timing in the first read operation:
the second voltage is supplied to the fifth select gate line; and
the second voltage is supplied to the sixth select gate line, and at a third timing in a third read operation:
the first voltage is supplied to the first select gate line;
the second voltage is supplied to the second select gate line;
the second voltage is supplied to the fifth select gate line; and
the first voltage is supplied to the sixth select gate line.

9. The semiconductor memory device according to claim 8, wherein one of the plurality of first word lines is a third word line;
another one of the plurality of first word lines different from the third word line is a fourth word line;
one of the plurality of second word lines is a fifth word line; and
another one of the plurality of second word lines different from the fifth word line is a sixth word line, at the first timing in the first read operation:
a third voltage is supplied to the third word line; and
a fourth voltage larger than the third voltage is supplied to the fourth word line, at the third timing in the third read operation:

the third voltage is supplied to the third word line;
the fourth voltage is supplied to the fourth word line;
a fifth voltage smaller than the fourth voltage is supplied to the fifth word line; and
the fourth voltage is supplied to the sixth word line.

10. The semiconductor memory device according to claim 9, wherein
the third word line is an n-th (n is a positive integer of 1 or more) conductive layer counted from one side in the first direction among the plurality of first word lines, and
the fifth word line is the n-th conductive layer counted from the one side in the first direction among the plurality of second word lines.

11. The semiconductor memory device according to claim 9, wherein
the third word line is an n-th (n is a positive integer of 1 or more) conductive layer counted from one side in the first direction among the plurality of first word lines,
the fifth word line is an m-th (m is a positive integer of 1 or more) conductive layer counted from the one side in the first direction among the plurality of second word lines, and
the n differs from the m.

12. The semiconductor memory device according to claim 9, wherein
the fifth voltage is equal to the third voltage.

13. The semiconductor memory device according to claim 9, wherein
the fifth voltage differs from the third voltage.

14. The semiconductor memory device according to claim 1, wherein
at least a part of the plurality of first word lines each include a first conductive layer that extends in the second direction, and
the first conductive layer is opposed to the first semiconductor column and the second semiconductor column.

15. The semiconductor memory device according to claim 1, wherein
at least a part of the plurality of first word lines each include:
a second conductive layer that extends in the second direction, the second conductive layer being opposed to the first semiconductor column; and
a third conductive layer that extends in the second direction, the third conductive layer being opposed to the second semiconductor column, wherein
the semiconductor memory device includes a connection wiring that electrically conducts the second conductive layer and the third conductive layer.

16. The semiconductor memory device according to claim 1, further comprising:
a third select gate line that extends in the second direction, the third select gate line being disposed at a position overlapping with the plurality of first word lines viewed from the first direction, the third select gate line being arranged with the first select gate line in the third direction;
a fourth select gate line that extends in the second direction, the fourth select gate line being disposed at a position overlapping with the plurality of first word lines viewed from the first direction, the fourth select gate line being arranged with the third select gate line in the second direction, the fourth select gate line being arranged with the second select gate line in the third direction;
a third semiconductor column that extends in the first direction, the third semiconductor column being opposed to the plurality of first word lines and the third select gate line;
a fourth semiconductor column that extends in the first direction, the fourth semiconductor column being opposed to the plurality of first word lines and the fourth select gate line;
a third transistor electrically connected to the third select gate line; and
a fourth transistor electrically connected to the fourth select gate line, wherein
the semiconductor memory device is configured to simultaneously supply different voltages to the first select gate line and the second select gate line and different voltages to the third select gate line and the fourth select gate line.

17. The semiconductor memory device according to claim 1, further comprising:
a plurality of second word lines arranged in the first direction, the plurality of second word lines being arranged with the plurality of first word lines in the third direction, the plurality of second word lines being disposed at positions overlapping with the first bit line and the second bit line viewed from the first direction;
a fifth select gate line that extends in the second direction, the fifth select gate line being disposed at a position overlapping with the plurality of second word lines viewed from the first direction;
a sixth select gate line that extends in the second direction, the sixth select gate line being disposed at a position overlapping with the plurality of second word lines viewed from the first direction, the sixth select gate line being arranged with the fifth select gate line in the second direction;
a fifth semiconductor column that extends in the first direction, the fifth semiconductor column being opposed to the plurality of second word lines and the fifth select gate line; and
a sixth semiconductor column that extends in the first direction, the sixth semiconductor column being opposed to the plurality of second word lines and the sixth select gate line, wherein
the semiconductor memory device is configured to simultaneously supply different voltages to the first select gate line and the second select gate line and different voltages to the fifth select gate line and the sixth select gate line.

* * * * *